United States Patent
Hurwitz et al.

(10) Patent No.: US 12,535,512 B2
(45) Date of Patent: Jan. 27, 2026

(54) ROGOWSKI COIL—IN-BAND EQUALISER

(71) Applicant: Analog Devices International Unlimited Company, Limerick (IE)

(72) Inventors: Jonathan Ephraim David Hurwitz, Edinburgh (GB); Michael W. O'Brien, Munster (IE)

(73) Assignee: Analog Devices International Unlimited Company, Limerick (IE)

( * ) Notice: Subject to any disclaimer, the term of this patent is extended or adjusted under 35 U.S.C. 154(b) by 148 days.

(21) Appl. No.: 18/684,578

(22) PCT Filed: Sep. 5, 2022

(86) PCT No.: PCT/EP2022/074660
§ 371 (c)(1),
(2) Date: Feb. 16, 2024

(87) PCT Pub. No.: WO2023/031472
PCT Pub. Date: Mar. 9, 2023

(65) Prior Publication Data
US 2024/0385227 A1    Nov. 21, 2024

Related U.S. Application Data

(63) Continuation of application No. 17/467,043, filed on Sep. 3, 2021, now Pat. No. 11,841,386, which is a
(Continued)

(51) Int. Cl.
*G01R 19/25* (2006.01)
*G01R 15/18* (2006.01)
(Continued)

(52) U.S. Cl.
CPC ....... *G01R 19/2506* (2013.01); *G01R 15/181* (2013.01); *H03B 5/24* (2013.01); *H03H 7/06* (2013.01)

(58) Field of Classification Search
None
See application file for complete search history.

(56) References Cited

U.S. PATENT DOCUMENTS

| | | | |
|---|---|---|---|
| 5,534,820 A | 7/1996 | Tupper et al. | |
| 6,094,044 A | 7/2000 | Kustera et al. | |
| (Continued) | | | |

FOREIGN PATENT DOCUMENTS

| | | | |
|---|---|---|---|
| EP | 2868285 A1 | 5/2015 | |
| JP | H08262070 | 10/1996 | |
| (Continued) | | | |

OTHER PUBLICATIONS

"Japanese Application Serial No. 2024-514043, Notification of Reasons for Refusal mailed Mar. 11, 2025", w/ English Translation, 7 pgs.
(Continued)

*Primary Examiner* — Steven L Yeninas
(74) *Attorney, Agent, or Firm* — Schwegman Lundberg & Woessner, P.A.

(57) ABSTRACT

Various current measurement systems and methods of signal processing are disclosed. In one example, there is a current measurement system that includes a filter with a corner frequency within the operating frequency range of the current measurement system. This provides a system with good SNR, whilst also preventing or reducing the likelihood of output saturation during large di/dt spikes. The system further includes an equaliser arranged to compensate for the phase and/or magnitude response of the filter within the operating frequency range.

20 Claims, 38 Drawing Sheets

Related U.S. Application Data continuation-in-part of application No. 16/007,551, filed on Jun. 13, 2018, now Pat. No. 11,125,784.

(51) Int. Cl.
*H03B 5/24* (2006.01)
*H03H 7/06* (2006.01)

(56) References Cited

U.S. PATENT DOCUMENTS

| | | |
|---|---|---|
| RE36,987 E | 12/2000 | Tupper et al. |
| 6,366,076 B1 | 4/2002 | Karrer et al. |
| 7,024,172 B1 | 4/2006 | Murphy et al. |
| 8,810,263 B1 | 8/2014 | Wilson et al. |
| 9,787,320 B1 | 10/2017 | Onishi |
| 11,125,784 B2 | 9/2021 | Hurwitz |
| 11,841,386 B2 | 12/2023 | Hurwitz |
| 2003/0090356 A1 | 5/2003 | Saito et al. |
| 2004/0162691 A1 | 8/2004 | Pupalaikis et al. |
| 2006/0232264 A1 | 10/2006 | Jurisch |
| 2010/0131219 A1 | 5/2010 | Kenly et al. |
| 2011/0260711 A1 | 10/2011 | Badegruber et al. |
| 2011/0307208 A1 | 12/2011 | Graf et al. |
| 2012/0286769 A1 | 11/2012 | Torti |
| 2012/0293166 A1 | 11/2012 | Lee et al. |
| 2014/0171935 A1 | 6/2014 | Digmann et al. |
| 2014/0320112 A1 | 10/2014 | Nodera et al. |
| 2016/0291060 A1 | 10/2016 | Wood et al. |
| 2017/0168094 A1 | 6/2017 | Chikamatsu |
| 2017/0219632 A1 | 8/2017 | Teppan et al. |
| 2018/0252748 A1 | 9/2018 | Wood et al. |
| 2019/0257864 A1 | 8/2019 | Mcphalen |
| 2019/0383859 A1 | 12/2019 | Hurwitz |
| 2022/0021366 A1 | 1/2022 | Hurwitz |

FOREIGN PATENT DOCUMENTS

| | | |
|---|---|---|
| JP | H0984173 | 3/1997 |
| JP | H11500280 | 1/1999 |
| JP | 2001312289 | 11/2001 |
| JP | 2003130894 | 5/2003 |
| JP | 2005135561 | 5/2005 |
| JP | 2012217859 | 11/2012 |
| WO | WO-2013038176 A2 | 3/2013 |
| WO | WO-2020104794 A1 | 5/2020 |

OTHER PUBLICATIONS

"Japanese Application Serial No. 2024-514043, Final Notification of Reasons for Rejection mailed Jun. 24, 2025", w/ English machine translation, 5 pgs.

"U.S. Appl. No. 16/007,551, Final Office Action mailed Jan. 11, 2021", 13 pgs.

"U.S. Appl. No. 16/007,551, Non Final Office Action mailed Jun. 9, 2020", 15 pgs.

"U.S. Appl. No. 16/007,551, Notice of Allowance mailed May 19, 2021", 9 pgs.

"U.S. Appl. No. 16/007,551, Response filed Apr. 9, 2021 to Final Office Action mailed Jan. 11, 2021", 13 pgs.

"U.S. Appl. No. 16/007,551, Response filed Oct. 9, 2020 to Non Final Office Action mailed Jun. 9, 2020", 10 pgs.

"U.S. Appl. No. 17/467,043, Non Final Office Action mailed Jan. 18, 2023", 12 pgs.

"U.S. Appl. No. 17/467,043, Notice of Allowance mailed Aug. 3, 2023", 9 pgs.

"U.S. Appl. No. 17/467,043, Response filed May 16, 2023 to Non Final Office Action mailed Jan. 18, 2023", 9 pgs.

"International Application Serial No. PCT/EP2022/074514, International Search Report mailed Dec. 6, 2022", 4 pgs.

"International Application Serial No. PCT/EP2022/074514, Written Opinion mailed Dec. 6, 2022", 7 pgs.

"International Application Serial No. PCT/EP2022/074660, International Search Report mailed Feb. 28, 2023", 6 pgs.

"International Application Serial No. PCT/EP2022/074660, Written Opinion mailed Feb. 28, 2023", 5 pgs.

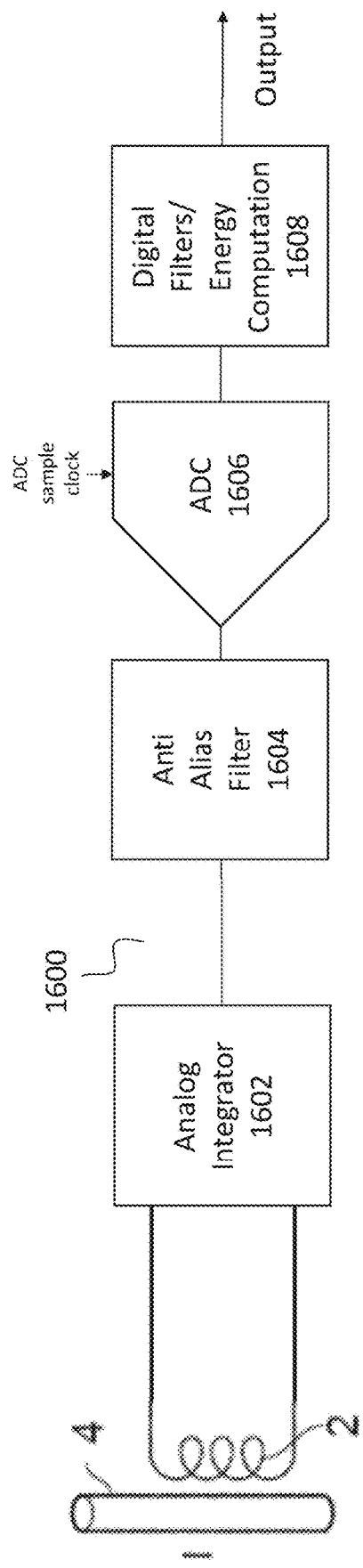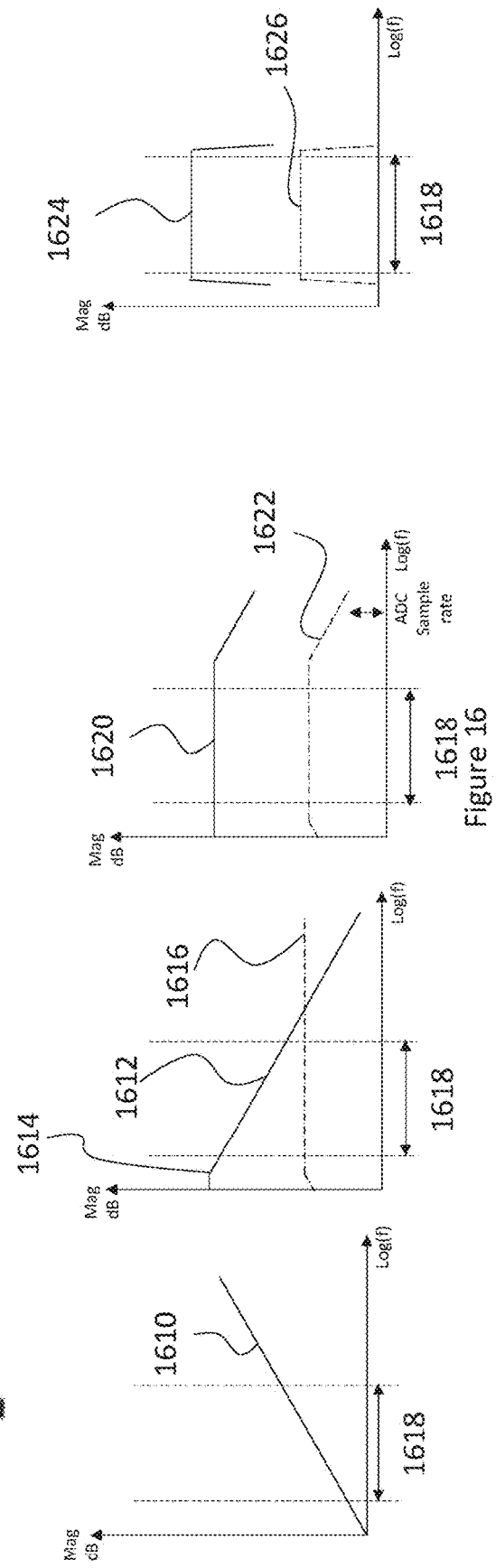
Figure 16

ROGOWSKI COIL—IN-BAND EQUALISER

CLAIM OF PRIORITY

This application is a U.S. National Stage of PCT Application Serial No. PCT/EP2022/074660, filed on Sep. 5, 2022, and published as WO 2023/031472 A3 on Mar. 9, 2023, which is a continuation of U.S. patent application Ser. No. 17/467,043, filed on Sep. 3, 2021, which is a Continuation-in-Part of 16/007,551, filed on Jun. 13, 2018, which are hereby incorporated by reference herein in their entirety.

FIELD

The present disclosure relates to a system for providing equalisation or compensation of the frequency response of a current sensor.

BACKGROUND

It is known that signals from current sensors may need to be low pass or high pass filtered in the analog domain in their signal processing path. Usually, the filter circuits are arranged such that the position of the breakpoint in the transfer function of the filter, i.e. the position of poles or zeros in the corresponding S-plane diagram, are well away from the measurement frequencies of interest. The measurement frequencies of interest may include the fundamental frequency of AC power such as 50 or 60 Hz and their respective 10s or 100s of harmonics, or may be around higher frequencies for applications such as current control in H-bridge and other switching applications. This ensures that process and temperature variations in relation to capacitive, resistive or inductive components within the filters do not substantially affect the response of the overall current measurement signal path, including the current sensor, filter and digitization for measured signals that are within the measurement frequencies of interest. It may also ensure that any phase shift introduced by the filter has a compensatable or near zero effect on current measurement within the operating frequency range of the current sensor.

In particular, sensors that are responsive to di/dt have signal response proportional to frequency, such as Rogowski coils, often use an analog filter as an analog integrator having a 3 dB point well below (often >10x lower than) the measurement frequency range of interest (also referred to as the 'band of interest'). In this case, the filter magnitude/gain response within the measurement frequency range of interest compensates for the sensor magnitude/gain response. Alternatively, a digital integration approach post digitization may be used to flatten the overall magnitude/gain response of the system in the measurement frequency range of interest.

The systems based on digital integration can have better SNR and drift as they do not rely on high value analog components that are needed to set the 3 dB point of the analog integrator at a low level (typically in the few Hz frequency range). Such large analog components are usually noisy or not very stable. However, digital integration systems have an additional issue which is that the digitization needs not to clip in the presence of fast di/dt signals, either from switching transients, EMC or just large out of band content.

An additional analog band limiting filter with a 3 dB point above the band of interest is often required to limit the impact of fast di/dt signals, which can otherwise create signals that will go outside the range of the digitization. This clipping, if it occurs, can cause significant errors in the resulting current measurement post digital integration as a result of a rectification effect that comes from an interaction of the clipping and the digital integrator. It is common to position the 3 dB point of the band limiting filter several times higher than the region of interest so that its gain and phase response do not impact the gain flatness and linear phase nature in the region of interest, but this may allow through large di/dt spikes which may saturate the output of the system or force higher dynamic range ADCs for digitization which will increase cost and power.

SUMMARY

This disclosure relates to a current measurement system having an analog filter in which the corner frequency of the analog filter is located within the operating frequency range, or frequency range of interest, of the system. The system includes a digital equalizer arranged to equalize the phase and/or gain response of the system within the operating frequency range, in order to render the overall gain of the system substantially constant across the frequency range of interest, and/or render the overall group delay of the system substantially constant across the frequency range of interest. By doing so, it is possible to position the corner frequency of the analog filter anywhere within the frequency range of interest, without suffering from the negative consequences that would usually be experiences, namely a changing amount of gain across the frequency range of interest and/or a changing amount of group delay across the frequency range of interest (which might reduce the accuracy of further determinations that might be made based on the measurement of current in combination with other measurements, such as measurements of voltage in order to determine energy/power consumption).

Positioning the corner frequency within the frequency range of interest may enable an improved balance between signal to noise ratio (SNR) and the avoidance of signal saturation caused by high frequency components within the measured signal (for example, fast di/dt content within the signal).

In a first aspect of the disclosure, there is provided a current measurement system for coupling to a di/dt current sensor, the current measurement system being configured to measure currents having a frequency within a predetermined frequency range, the current measurement system comprising: a signal processing path comprising: an analog filter for coupling to the di/dt current sensor (either directly coupled or indirectly coupled via one or more other circuits/units, such as an amplifier, anti-alias filter, etc) to filter a current measurement signal output from the di/dt current sensor, wherein a corner frequency of the filter is within the predetermined frequency range; an analog to digital converter, ADC, to receive a filtered current measurement signal (either directly from the output of the analog filter, or indirectly via one or more other circuits/units, such as an amplifier, anti-alias filter, etc) and output a digital measurement signal; and a digital equaliser coupled to the ADC (either directly coupled or indirectly coupled via one or more other circuits/units, such as a digital integrator, etc) and configured to output a compensated digital current measurement signal, wherein the equaliser is configured to use a characterisation of the filter to: compensate for changes in a group delay of the analog filter across the predetermined frequency range; and compensate for changes in a combined magnitude response of the di/dt current sensor and the analog filter across the predetermined frequency range.

The digital equaliser may be configured to compensate for changes in the group delay of the analog filter such that a combined phase-response of the signal processing path is substantially linear.

The digital equaliser may be configured to compensate for changes in the group delay of the analog filter such that a combined group delay of signal processing path is substantially constant.

The current measurement system may further comprise a characterisation circuit configured to characterise the frequency response of the analog filter and output the characterisation of the analog filter to the digital equaliser. Optionally, the characterisation circuit may be configured to periodically or intermittently update the characterisation of the frequency response of the analog filter. Alternatively, the characterisation of the analog filter frequency response may be a fixed characterisation that is determined during manufacture of at least part of the current measurement system.

The digital equaliser may comprise a digital filter, and the current measurement system may further comprise a filter coefficient look-up table for use in setting coefficients of the digital filter based on the characterisation of the frequency response of the analog filter, such that the filter compensates for changes in the group delay of the analog filter.

The equaliser may comprise one or more FIR filters.

The equaliser may comprise: a first filter (for example a first FIR filter) configured to receive the digital measurement signal and output a first filter output; a second filter (for example a second FIR filter), configured to receive the digital measurement signal and output a second filter output; and an interpolator, wherein the interpolator is configured to receive the first filter output and the second filter output and interpolate the first and second filter outputs.

The interpolator may output a combined signal including a fraction of the first filter output and the second filter output.

The predetermined frequency range may encompass a range between a fundamental frequency of the measured current signal and a maximum harmonic of interest of the measured current signal. In one example, the predetermined frequency range may be a frequency range between 10 Hz to 20 KHz.

The equaliser may comprise a phase equaliser and a magnitude equaliser, wherein the phase equaliser is configured to compensate for changes in the group delay of the analog filter across the predetermined frequency range; and the magnitude equaliser is configured to compensate for changes in the combined magnitude response of the di/dt current sensor and analog filter.

The di/dt current sensor may comprise a Rogowski coil. In one particular example, the di/dt current sensor may be a PCB based di/dt current sensor.

The current measurement system may further comprise a di/dt current sensor having an output coupled to the input of the analog filter.

The analog filter may be a dedicated filter circuit/unit, or may alternatively be implanted as part of a multi-function circuit/unit, for example it may be implemented in an active circuit that has gain, such that the circuit provides both gain and filter functionality.

In a second aspect of the disclosure, there is provided a power calculation system comprising: the current measurement system of the first aspect; a voltage measurement path configured to measure a voltage and output a measured voltage signal; a compensation system, the compensation system configured to compensate at least one of the measured voltage signal and the compensated current measurement signal such that both the measured voltage signal and the compensated current measurement signal have substantially the same group delay; and a power calculation processor, wherein the power calculation processor is configured to receive the compensated current measurement signal and measured voltage signal and perform a power calculation.

In a third aspect of the disclosure, there is provided a multi-phase current measurement system comprising: a first current measurement system according to any of claims 1 to 15, configured to measure a first current having a first phase, and output a first measured current signal; a second current measurement system according to any of claims 1 to 15, configured to measure a second current having a second phase, and output a second measured current signal; and a compensation system configured to compensate at least one of the first measured current measurement and the second measured current signal such that the first measured current signal and the second measured current signal have substantially the same group delay.

In a fourth aspect of the disclosure, there is provided a method for providing measurement of currents within a predetermined frequency range, the method comprising: filtering, using an analog filter with a corner frequency within the predetermined frequency range, a current measurement signal output by a di/dt current sensor to generate a filtered current measurement signal; converting, using an analog to digital converter, the filtered current measurement signal to a digital measurement signal; and equalising, using a digital equaliser, the digital measurement signal using a characterisation of the analog filter, wherein equalising the digital measurement signal comprises: compensating for changes in a group delay of the analog filter across the pre-determined frequency range; and compensating for changes in a combined magnitude response of the di/dt current sensor and the analog filter across the predetermined frequency range.

Compensating for changes in a group delay of the analog filter may comprise the digital equaliser having a phase response that results in a combined phase response of the signal processing path being substantially linear.

The method may further comprise: characterising the frequency response of the analog filter; and outputting the characterisation of the analog filter to the equaliser.

In a fifth aspect of the disclosure, there is provided a system for coupling to a current sensor, the system configured to measure a current within a frequency range of interest, the system comprising: an analog filter for coupling to the current sensor (either directly coupled or indirectly coupled), the analog filter having at least part of its transition band of frequencies within the frequency range of interest, and being configured to receive an output of the current sensor and generate a filtered analog signal; and a digital phase equaliser configured to receive a digitised version of the filtered analog signal and output a compensated digital signal, the digital phase equaliser being configured to: have a phase response that compensates for a non-linear phase response of the analog filter within the frequency range of interest such that a combined group delay of the analog filter and the digital phase equaliser includes less change within the predetermined frequency range compared with a group delay of the analog filter.

The digital phase equaliser may be configured to receive a characterisation of the analog filter, wherein the phase equaliser is configured to compensate for the non-linear phase response of the analog filter based on the characterisation.

The characterisation of the analog filter may comprise a characterisation of the phase response of the analog filter within the frequency range of interest.

The system may further comprise a characterisation circuit configured to determine the characterisation of the analog filter.

The characterisation circuit may comprise a replica circuit, the replica circuit being configured to provide substantially the same frequency response as the analog filter.

The system may further comprise a digital gain equaliser coupled to the digital phase equaliser (for example, upstream or downstream of the digital phase equaliser), the digital gain equaliser configured to compensate for changes in a combined gain response of the current sensor, the analog filter and the digital phase equaliser within the frequency range of interest.

In a sixth aspect of the present disclosure, there is provided a circuit for coupling to a current sensor, the circuit being configured to measure a current signal within a frequency range of interest, the circuit comprising: an analog filter circuit for coupling to the current sensor (either directly coupled or indirectly coupled), the analog filter circuit having at least part of its transition band of frequencies within the frequency range of interest, and being configured to receive a measurement signal of the current sensor (either directly from the current sensor, or via one or more coupling circuits/units, such as an amplifier or anti-alias filters) and filter the measurement signal to output a filtered signal; and a digital gain equaliser configured to receive a digital representation of the filtered analog signal coupled to the analog filter circuit, the digital gain equaliser being configured to apply a gain to the digital representation of the filtered signal to compensate for a combined gain response of the current sensor and the analog filter circuit within the frequency range of interest.

The circuit may further comprise: a characterisation circuit configured to determine a characterisation of the analog filter circuit; wherein the gain applied to the digital representation of the filtered signal by the digital gain equaliser is dependent on the characterisation of the analog filter circuit.

The circuit may further comprise a digital phase equaliser configured to apply a phase adjustment to the digital representation of the filtered signal so as to compensate for a change in group delay of the analog filter circuit within the frequency range of interest, wherein the applied phase adjustment varies in dependence on the frequency of the filtered signal by an amount that is informed by the characterisation.

BRIEF DESCRIPTION OF THE DRAWINGS

Example embodiments of the present disclosure will now be described, by way of non-limiting example only, with reference to the accompanying figures in which:

FIG. 16 shows an example current measurement system comprising an analog integrator and a number of magnitude responses of the current measurement system;

DESCRIPTION

The response of a di/dt current measuring circuit (such as one that includes a Rogowski coil or an air-corrected current transformer) is often proportional to frequency. To correct for this, and/or to prevent signal saturation for high di/dt current events, an analog low pass filter (such as an integrator or band limiting filter) may be used. The position of the corner frequency of the low-pass filter (also referred to as the breakpoint or cutoff frequency) may affect the frequency response of the system as a whole. It is therefore typically placed well outside of the operating frequency range of the current measurement system. Known current measurements systems may therefore be negatively impacted by poor SNR, in the case of the corner frequency being well below the frequency range of interest, or negatively impacted by the risk of signal saturation due to large di/dt current pulses.

In the present disclosure, FIGS. 23 to 35 disclosure systems and techniques developed by the inventors to enable the corner frequency of the analog filter to be positioned within the frequency range of interest, without causing undesirable frequency response and/or group delay characteristics for the system as a whole. This means that a better balance between SNR and avoidance of signal saturation may be achieved, whilst still maintaining measurement accuracy across the frequency range of interest.

Figure 1:
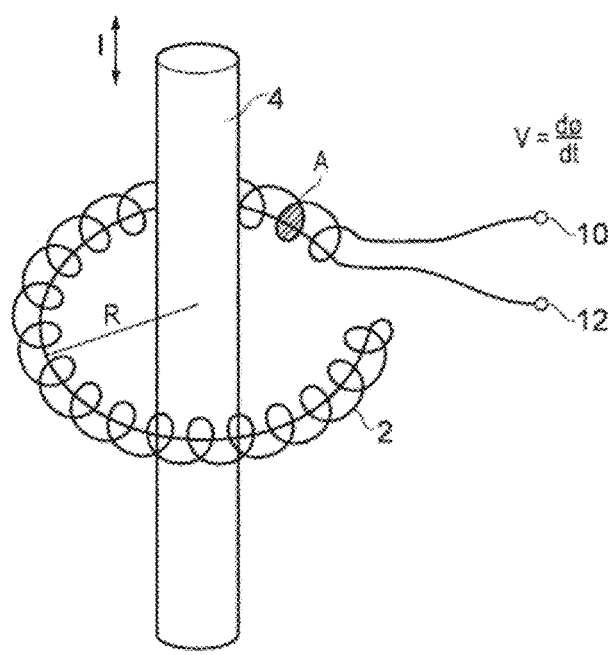
FIG. 1 schematically illustrates a Rogowski coil encircling a current carrying conductor.

FIG. 1 is a schematic illustration of the current measuring circuit in the form of a Rogowski coil 2. Such a current sensor/transducer can be used to measure a wide range of alternating currents, such as current supplied to a domestic dwelling or the currents around a distribution grid from electricity generation stations to users. The Rogowski coil comprises a coil 2 of cross sectional area A which encircles a current carrying conductor 4 which, in use, carries an alternating current I. The alternating current I in the conductor 4 induces a voltage at the output of the Rogowski coil $$V(t) = \frac{AN}{2\pi R}\mu_o \cdot \frac{dI}{dt} \qquad \text{Equation 1}$$

where

A is the cross sectional area of the coil (see FIG. 1)
N is the number of turns of the coil
R is the radius of the coil around the conductor $$\mu_o = 4\pi \times 10^{-7} Hm^{-1}$$

I=current

Figure 2:
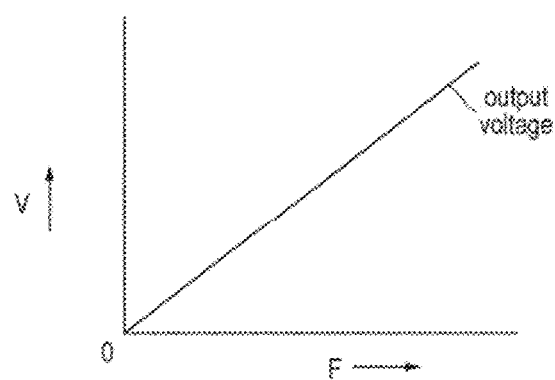
FIG. 2 is a plot of the voltage developed across a Rogowski coil as a function of frequency for a constant magnitude alternating current.

A consequence of this is that if the conductor 4 were to carry an alternating current of a constant peak-to-peak or RMS value but the frequency of that current was swept from low frequency to high frequency then the voltage V developed across the Rogowski coil would increase linearly with frequency, as schematically illustrated in FIG. 2.

This property of the Rogowski coil can be unhelpful since mains born load currents are generally quite low frequency, say 50 or 60 Hz whereas noise components can be at much higher frequencies, possibly running into the hundreds of kHz or above. It can therefore be seen that such a response gives a disproportionate amount of weight to a noise signal of low magnitude but high frequency compared to a response of the desired load current having a much higher magnitude but a much lower frequency.

Ideally the output voltage of the Rogowski coil 2 would depend only on the magnitude of the current I through the conductor 4 and not on the frequency of the current.

Figure 3:
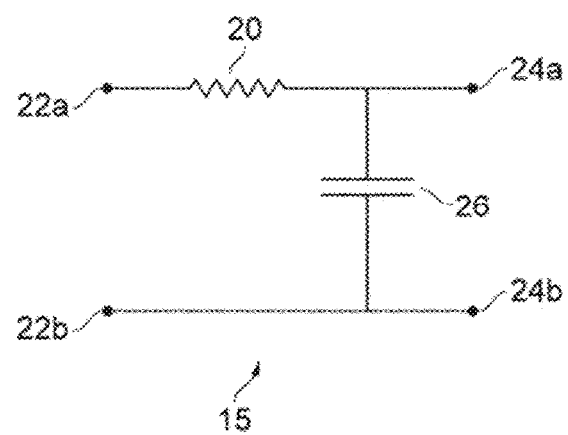
FIG. 3 is a circuit diagram of a single pole Butterworth RC filter.

The person skilled in the art is aware of low pass filters. FIG. 3 is a circuit diagram of a first order Butterworth low pass RC filter 15 comprising a resistor 20 and a capacitor 26. The filter comprises a pair of input nodes 22a and 22b and a pair of output nodes 24a and 24b. The resistor 20 extends between the input node 22a and the output node 24a. The capacitor 26 extends between the output node 24a and the conductor connecting nodes 22b and 24b.

Figure 4:
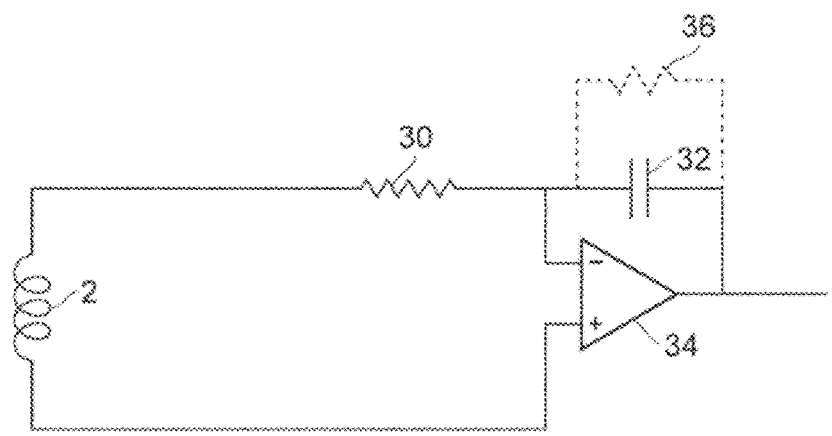
FIG. 4 is a circuit diagram of a Rogowski coil in association with and an analog integrator.

It is known that Butterworth filters can be provided in a number of "orders" and that text books show the magnitude function for an $N_{th}$ order Butterworth low pass filter as $$\frac{V_O}{V_I} = \frac{1}{\sqrt{1+\left(\frac{\omega}{\omega_c}\right)^{2n}}} \qquad \text{Equation 2}$$

where
$\omega$=angular frequency
$\omega_c$=cut off frequency $2\pi f_o$
$V_O$=output voltage
$V_I$=input voltage The first order Butterworth response is an integrator-like response which can be coupled to the output of a Rogowski coil to linearize the response of such a circuit as a function of frequency. The Butterworth filter 15 is often implemented as a "leaky" integrator as shown in FIG. 4. The integrator comprises an RC filter combination formed by resistor 30 and capacitor 32 around an operational amplifier 34. In order to stop the integrator integrating endlessly and thereby risking running into its supply rails a further resistor 36 (shown in dotted line) is provided in parallel with the capacitor 32 that causes it to leak some of its charge away.

A problem with the circuit is that the magnitude of the output signal depends critically on the value of the RC product of resistor 30 and the capacitor 32. In order to understand this, consider FIG. 5 which shows an idealized response from the Rogowski coil current transducer as represented by chain line 40 which increases as function of frequency. Suppose, for example that we team this response up with a first order Butterworth filter having a cut-off frequency which is nominally $F_0$. The frequency responses are routinely represented on a log-log plot where the skilled person knows that for a first order low pass filter the frequency response falls off at 20 dB per decade. In simplistic terms, the graph is constructed such that the frequency response of the filter stays flat with zero insertion loss until the break point, and then falls at 20 dB per decade of frequency increase. We will come back to this simplification later. However, it can be seen that if process or temperature variation causes the RC product to vary such that the cut off frequency moves from $F_0$ to $F_1$ then the attenuation introduced by a filter at a given frequency decreases. For example, if we wish to measure the amplitude of a frequency at frequency $F_m$, for example 50 Hz, then the cut of frequency of $F_0$, the gain (or really the attenuation) introduced by the filter can be represented by $G_0$ at $F_m$. However, if the filter cut off frequency increases to $F_1$, then the gain of the filter increases to $G_1$ at frequency $F_m$ (or more intuitively the attenuation inserted by the filter has reduced). Similarly, if the RC components vary such that the break point decreases in frequency from $F_0$ to $F_2$ then the filter response at frequency $F_m$ is represented by gain $G_2$.

It's worth considering the effect of these numbers in detail.

Current measuring circuits often specified to a certain degree of decision. For example, a circuit may be specified to measure to within 0.1% accuracy, i.e. 1 part in 1000.

Figure 5:
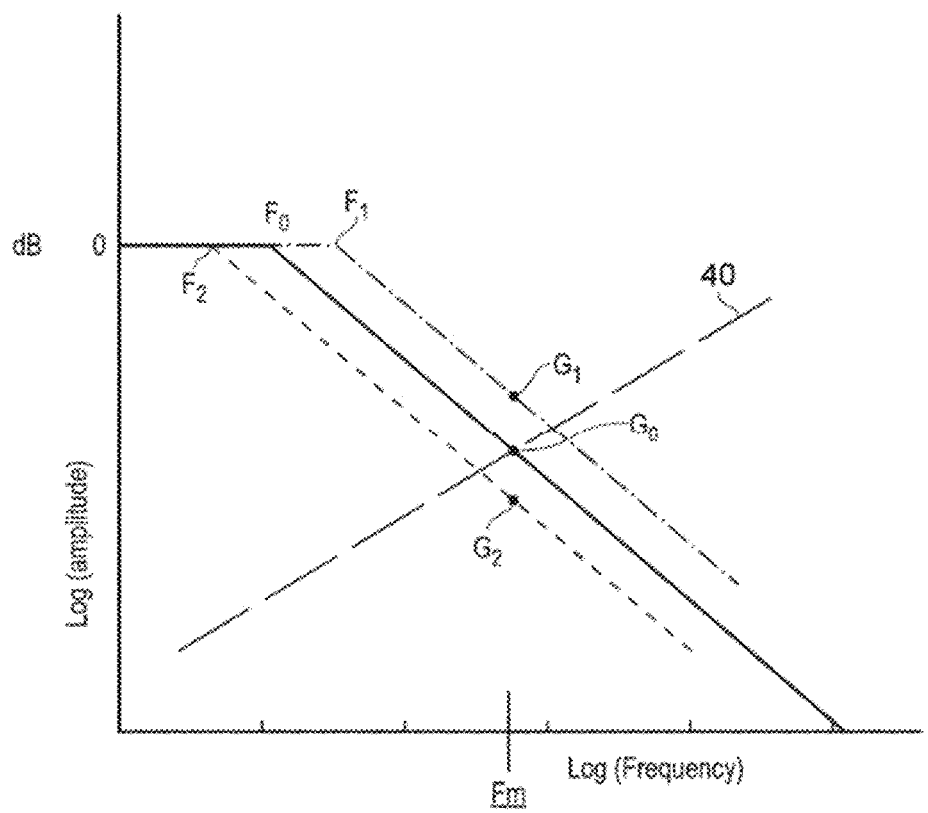
FIG. 5 is a graph illustrating how a change in the break-point (−3 dB frequency) of the filter can affect the measured amplitude of a current at a specific frequency.
Figure 6:
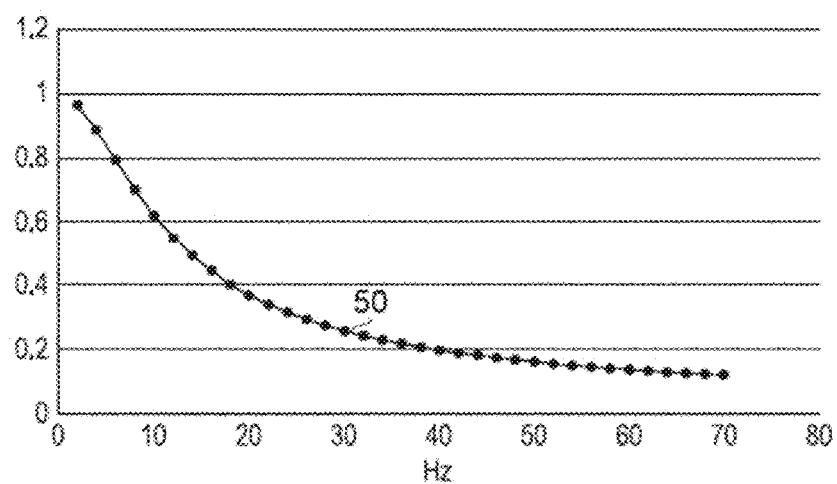
FIG. 6 is a plot of the magnitude of the filter as a function of frequency on a linear-linear scale for a filter having a cut-off frequency of 8 Hz.

If rather than using the graphical approach of the log-log plot of FIG. 5 we calculate the frequency response for a first order low pass filter and plot it on a linear-linear scale as shown in FIG. 6 by curve 50 it becomes apparent that the gradient of the filter changes more rapidly near the break-point and then changes less rapidly as the frequency moves further away from the break-point. FIG. 6 was plotted for a first order filter having a nominal break-point at 8 Hz. For such a filter the gain of the filter at 50 Hz can be calculated using Equation 2 and corresponds to 0.157991. However, if R or C were to vary such that the break point moved from 8 Hz to 9 Hz, then the gain at 50 Hz would be 0.177153. This corresponds to a change of 12% in the magnitude response of the filter at the measurement frequency. Where the resistor and capacitor components are fabricated using integrated circuit technologies, the components could be matched to great accuracy. However the absolute values of the resistor and capacitors can vary wildly from wafer to wafer, with changes of 20% or more having to be tolerated which gives rise to changes in the magnitude response of the filter much larger than the permissible measurement tolerance limit. It may be possible to calibrate at manufacture the response of the signal chain, either by trimming the components or calculating and storing a correction factor to be applied, but this may only be useful if the system remains stable forever. Furthermore, packaging stress and ambient temperature can also cause component values to change. Thus, whilst it may be possible to integrate all or part of an RC filter onto an integrated circuit it is exceptionally difficult to actually set it to a particular value without having to undertake expensive trimming. Even then, the circuit value in terms of the RC product is liable to drift with temperature. It should be noted that part of the filter may be implemented using off-chip (discrete) components.

Figure 7:
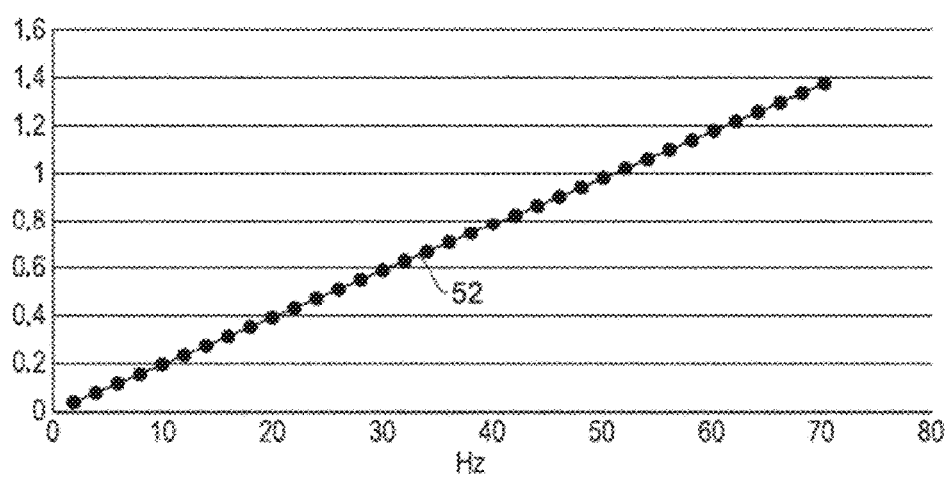
FIG. 7 is a plot of the output voltage of a Rogowski coil (in arbitrary units) on a linear-linear scale.
Figure 8:
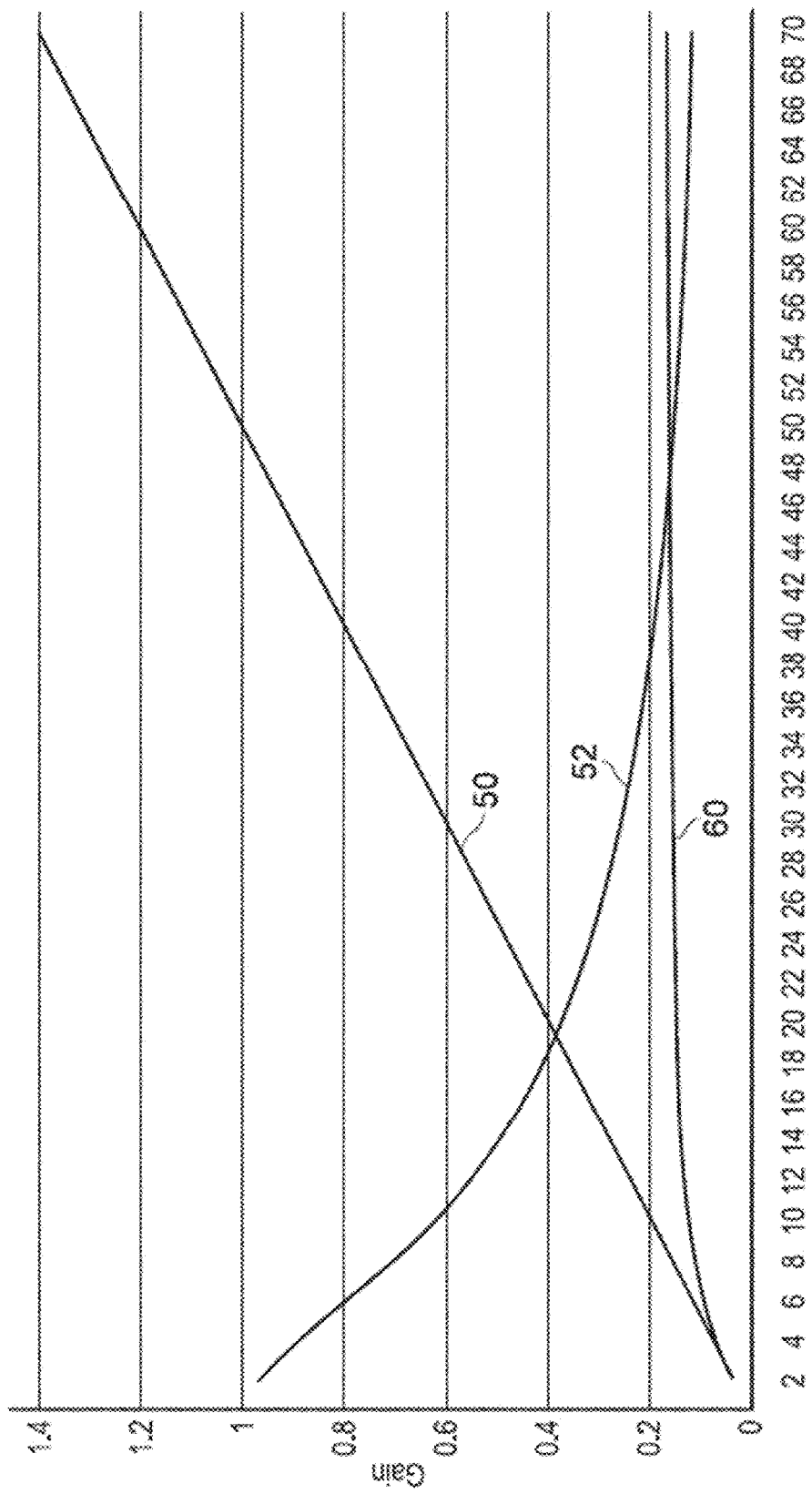
FIG. 8 is a plot combining the data shown in FIGS. 6 and 7, and showing the product thereof as a function of frequency.

FIG. 7 schematically illustrates a response of the Rogowski coil 2 as line 52 on a linear-linear scale and FIG. 8 reproduces the information of FIG. 6 and FIG. 7, and also plots their product, indicated by curve 60. It can be seen that the product 60 of the low pass filter response as represented by line 50 and the Rogowski coil response as line 52 becomes relatively constant with frequency, especially so once the frequency has moved a reasonable distance from the cut off frequency of the low pass filter.

Figure 9:
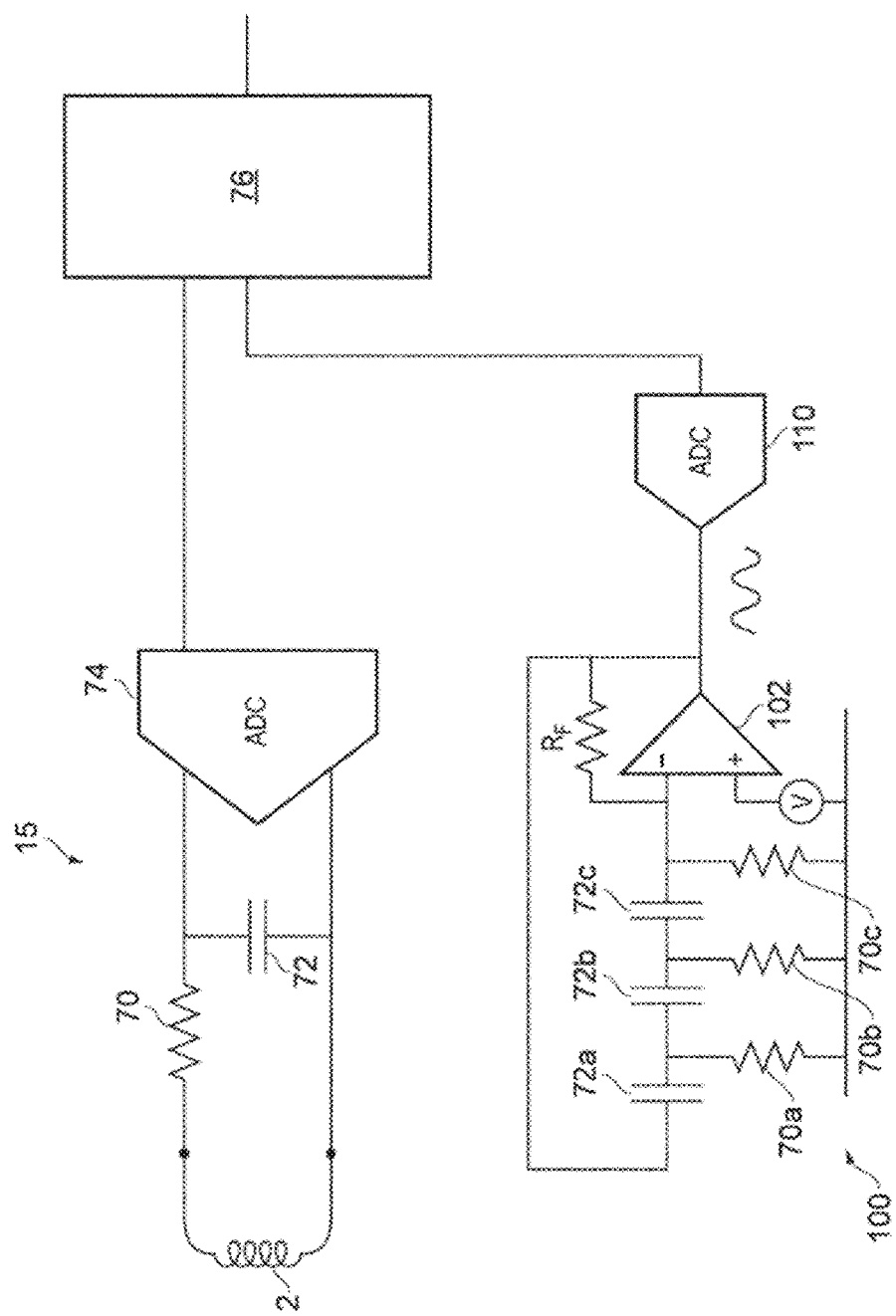
FIG. 9 shows an embodiment of an apparatus in accordance with the teachings of the present disclosure.

It can be seen that it would be desirable to be able to accurately characterize the RC product of the low pass filter. FIG. 9 schematically illustrates a circuit where RC component combination, this time represented by resistor 70 and capacitor 72 act as a low pass filter, and then the output of the filter is digitized by an analog to digital converter 74 before being passed to a processing block 76 in order to output an estimate of a measured current as detected by the Rogowski coil 2. As noted before, the problem exists that the estimate of current depends on the transfer function of the RC filter. It is therefore highly desirable to know the RC product of the resistor 70 and capacitor 72. The Rogowski coil may be replaced by an air-cored current transformer with a burden resistor.

As noted before, capacitors and resistors can be matched exceptionally well within an integrated circuit or reasonably well when collocated as discreet passive components from the same manufacturer outside the IC Therefore, one approach is to form replica copies of the capacitor 72 and the resistor 70 in a circuit which is intended to characterize the RC response. As such the circuit, here generally designated 100, can be regarded as a characterization circuit. In the embodiment shown in FIG. 9 the characterization circuit comprises three replica capacitors 72a, 72b and 72c and three replica resistors 70a, 70b and 70c arranged to introduce phase shifts within a feedback loop of an operational amplifier 102. Each stage in this network is required to insert a phase shift of 60°, and it can be shown, either by analysis or by reference to text books that $$F_r = \frac{1}{2\pi RC\sqrt{2N}} \qquad \text{Equation 3}$$

where
all the resistors 70a to 70c=R
all the capacitors 72a to 72c=C
N=number of stages
$F_r$=resonance frequency Thus the self-sustaining oscillator within the characterization circuit 100 has a frequency which is reliably related to the RC time constant of the capacitors 72 and resistors 70 within the filter 15. An output from the oscillator can be digitized by an analog to digital converter 110 and then processed by the processor 76 to accurately determine the frequency of operation. The values of the capacitors in the characterization circuit 100 do not necessarily need to be the same as the values of the capacitors in the filter circuit 15. Thus smaller capacitors may be used resulting in a higher oscillation frequency which takes less time to accurately characterize. Similarly the resistors can also be smaller. Thus the characterization circuit need not take up such a significant amount of die area as the filter.

Figure 10:
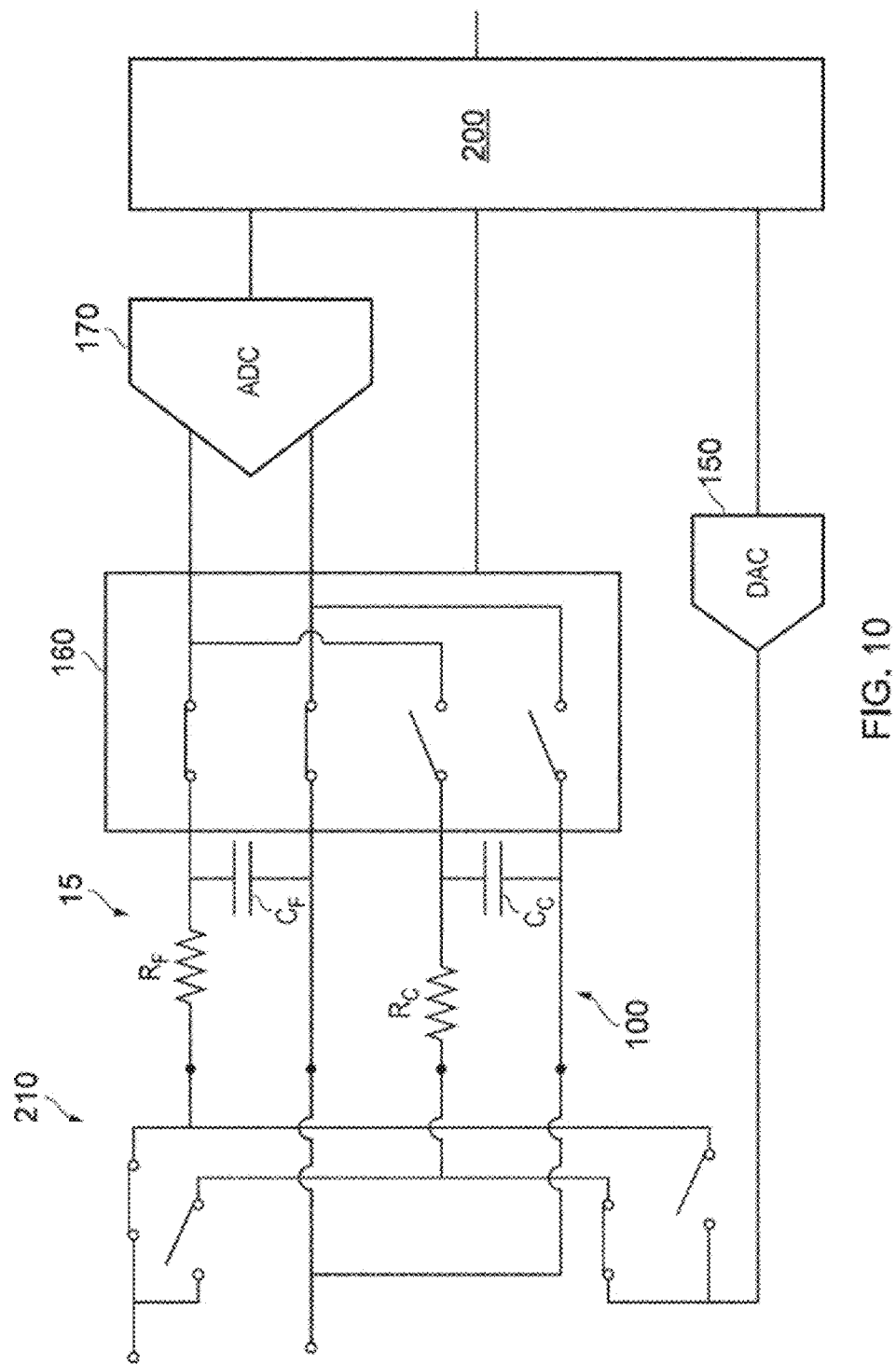
FIG. 10 shows a further embodiment.

As an alternative, both the filter 15 and the characterization circuit 100 may be fabricated to have identical R and C components, as shown in FIG. 10. Here the filter components are designated as $R_f$ and $C_f$ and the corresponding filter in the characterization circuit is designated $R_c$ and $C_c$ with the intention that $R_F = R_c$ and $C_F = C_c$. The filter within the characterization circuit 100 may be driven with an oscillating signal with a digital to analog converter 150 and the output of the filter may be provided by way of a multiplexer 160 to an analog to digital converter 170. The control signals to the digital to analog converter 150 and the results from the analog to digital converter 170 may stem from and be provided to a processor 200. As a consequence the processor 200 can accurately characterize the response of the RC circuit within the characterization circuit 100. Additionally, if required, an array of switches acting to form a swapping circuit 210 may be provided such that the input signal can be swapped to the filter formed by $R_c$ and $C_c$ and that the DAC 150 may be used to drive the filter formed by $R_f$ and $C_f$. Thus, from time to time functionality of the filter 15 and the characterization circuit 100 can be swapped such that each can be accurately characterized and then drift in one of the circuits can be used to compensate for a corresponding drift to the other one of the circuits. By knowing the correct RC time constant then the gain/attenuation and phase shift provided by the filter, irrespective of the filter configuration or number stages can be quickly calculated thereby allowing a circuit, such as a current measuring circuit, to be characterized to a required accuracy even though the absolute values of the resistors and capacitors used within the filter may vary by 20 or more percent from product to product.

Figure 11:
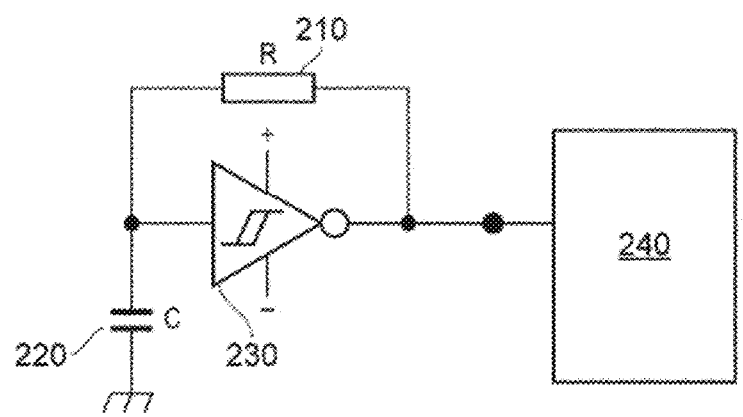
FIG. 11 illustrates a further embodiment of an oscillator.

The characterization need not require multiple copies of the RC filter to form an oscillator. FIG. 11 shows an oscillator circuit where a resistor 210 and a capacitor 220 are provided in a feedback loop around a Schmidt inverter 230 so as to form an oscillator. The output of the inverter 230 is a square wave which as a logic signal can be monitored directly by a processor 240 so as to estimate the frequency of the square wave. Alternatively the output of the inverter may be provided to an ADC to digitize it, or to a logic circuit, such as a divide by two counter, to clean its edges and equalize the mark-space ratio thereof prior to having the frequency of the signal estimated.

Once the data processor can determine the actual response of the low pass filter it can apply a gain correction. Thus supposing that the RC component as measured by the oscillator drifted upwardly by 1% as a result of ambient or other temperature change, and that corresponded to the measured output being X % higher at the measurement frequency (mains frequency) then a corresponding attenuation can be introduced into the signal chain to compensate for the RC drift.

Thus the estimate of current can be corrected.

In the context of Rogowski coil (or air-cored current transformer) based current consumption meters (or watt-hour meters) this approach can be used to improve their performance. Thus approach may be used in conjunction with techniques described in WO2013/038176, "current measurement", where a known additional current can be superimposed on a load current, and then the response of the measurement transducer and associated signal processing chain is examined to deduce the transfer function of the measurement transducer and signal processing chain, or at least to monitor for changes in the transfer function.

The teachings disclosed herein can be used with an dI/dt based transducer and integrator combination to monitor for response changes due to heating or aging, and/or to allow correction factors to be calculated and applied, or component values to be electronically trimmed where, for example, the capacitor is made of a plurality of smaller capacitors and associated switches for selectively removing or adding capacitors into a group of capacitors.

The monitoring of the integrator response by a replica characterization circuit can be applied in many areas of technology, such as motor control, automotive, aerospace and medical systems, metering and protective systems (relays and circuit breakers) and the like.

The filter 15 (see FIG. 9) by its nature introduces a delay in processing the input signal, and this can be disadvantageous if some remedial action needs to be taken on an urgent basis, for example to apply protective measures in the event of an overcurrent or overvoltage event. In such an arrangement the signal from the air core current transformer or Rogowski coil may be provided directly to a protection circuit without passing through the low pass filter such that the protection circuit can make a decision about initiating a protective action as quickly as possible.

Once a filter response is characterized the filter can be used to help estimate other parameters such as a magnitude of a surge current or surge voltage. The RC filter provides a linearization of the frequency response from the Rogowski coil or similar inductor based current transducer. In normal operation the output of the filter will be a sinusoid. However in the event of an electrostatic discharge event, such as a lightning strike on a power distribution system, current surges may be caused to flow. The magnitude of a current surge at any point in the distribution system may vary as a function of distance from the point of the lightning strike, and may also depend on the number of intervening current splitting nodes or devices such as transformers. The surge current will be a largely unidirectional event and hence the voltage on the capacitor may become elevated, and then decay away in an exponential manner as set out by:

$$V(t) = Vs\ \exp(-t/RC) \qquad \text{Equation 4}$$

Where

V(t) is the voltage at time t after the surge event at $T_0$, and

Vs is the surge voltage at time $T_0$

By examining the evolution of V(t) as a function of time, and with some estimate of elapsed time since the surge event occurred, it becomes possible to estimate the magnitude of the surge current. This requires knowledge of the RC time constant of the filter, but this information becomes available as a result of the operation of the present disclosure. The value Vs may also depend on the duration of the surge event. The duration may be measured by a circuit that runs a counter-timer to time the duration for which the signal exceeds a threshold, or the duration of the surge event, such as lightning strike, may be assumed to be constant.

Figure 12:
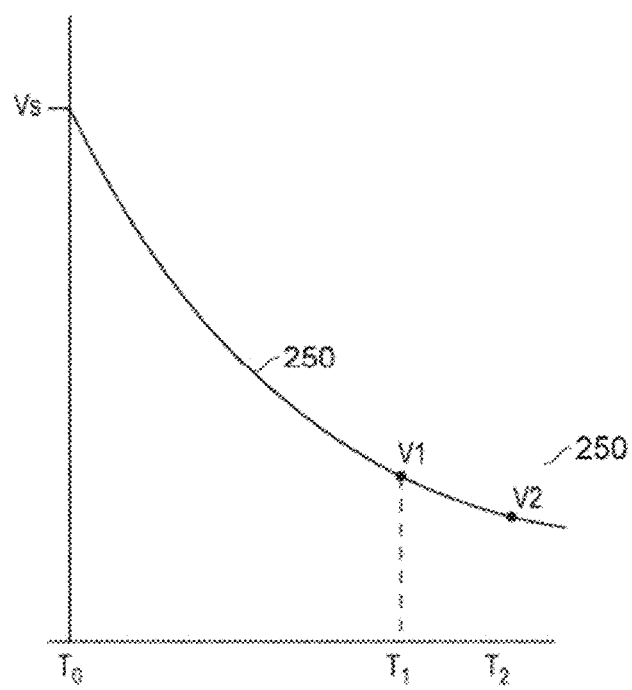
FIG. 12 illustrates the evolution of voltage across the capacitor as a function of time in response to a surge event.

FIG. 12 shows the evolution as a function of time of the voltage stored on the capacitor 26 of FIG. 3 following the occurrence of a surge current and as the voltage decays away. For the purposes of illustration the sinusoidal response from the filter has been omitted but if a mains-borne current is being detected then the sinusoidal response thereof will be superimposed on the exponential decay, represented by line 250 of the voltage across the capacitor.

If the time $T_0$ of the surge event can be captured by a detector, such as by a voltage monitoring circuit that connects directly to the sensor or to some other arrangement that detects the voltage or current spike of the surge (or the occurrence of its peak value within the filter) and the elapsed time to $T_1$, where the voltage is measured is known, then by knowledge of the RC time constant the surge voltage $V_s$ at time $T_0$ can be calculated. The accuracy of timing can be verified or improved by taking further voltage measurements, such as V2 at time $T_2$. The measurements can then be fitted to an appropriate function, such as an exponential delay or to a sync function. Thus an estimate of the energy in the surge event may be made.

If desired, multiple RC filters having different time constants could be used to the evolution of their respective decay voltages as a function of time should intersect at the time of the surge event.

Figure 13:
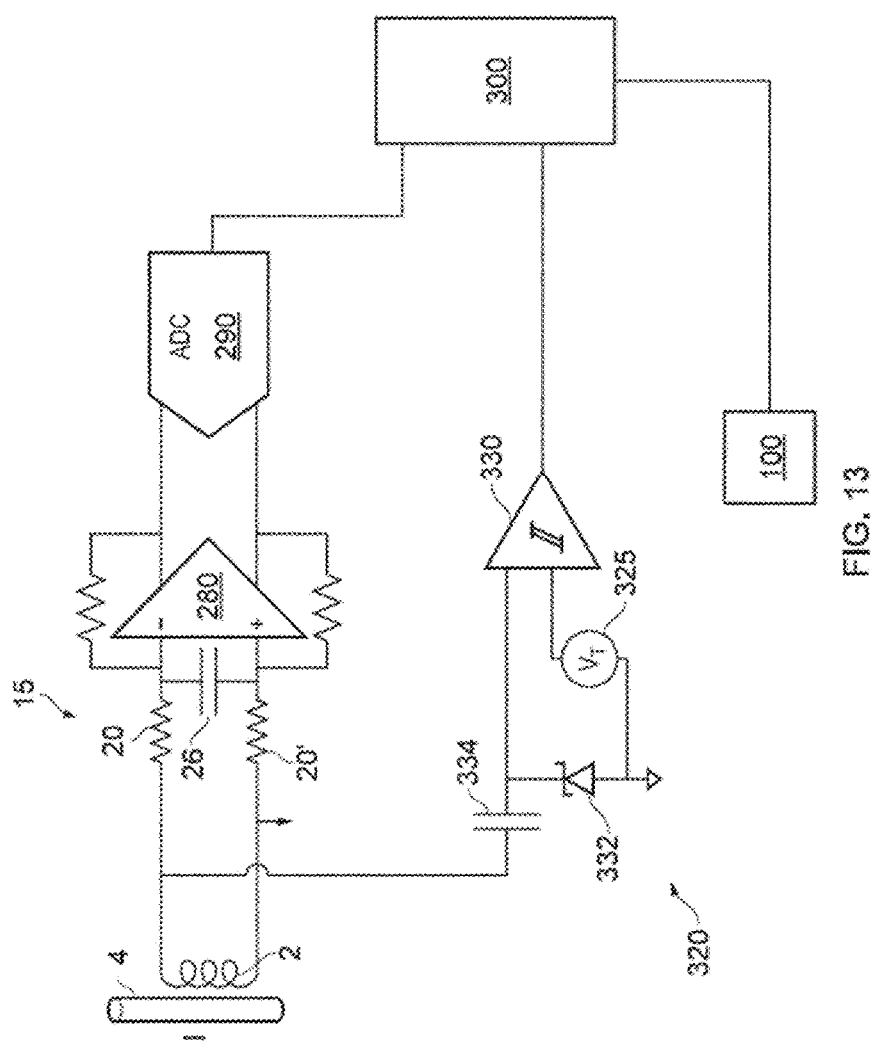
FIG. 13 illustrates a further embodiment of the present disclosure.

FIG. 13 schematically illustrates a further embodiment of the present disclosure. As with the earlier Figures, a current carrying conductor 4 is associated with an inductive sensor 2, such as a Rogowski coil. A voltage developed across the Rogowski coil is filtered by a low pass filter comprising the resistors 20, 20' and the capacitor 26. The low pass filter is, in this embodiment, provided as a differential filter at the input to a difference amplifier 280. An output of the difference amplifier 280 is provided to a differential ADC 290 which converts the differential output of the difference amplifier 280 into a digital code. Thus, the operation of this circuit is analogous to that described with respect to FIG. 9 except that it is fully differential. The time constant of the filter 15 can be estimated by a data processor 300 responsive the output of the characterization circuit 100. The characterization circuit may be formed as described hereinbefore.

In normal use the data processor 300 is responsive to the output of the ADC 290 so as to estimate the alternating current carried by the conductor 4.

The arrangement shown in FIG. 13 is further modified by the inclusion of a transient event detector, generally designated 320 which acts to monitor the output voltage across the Rogowski coil and if it exceeds a target value, as set by voltage source 325 outputting the voltage $V_t$, then a digital signal is output by a comparator 330 indicating that the transient event may be occurring. This gives a timing reference equivalent to time stamping the time $T_0$ of FIG. 12, and may also allow the duration of the surge event to be estimated. The data processor 300 can then monitor the evolution of the voltage across the capacitor 26 as a function of time. Based on the evolution of this voltage, together with an estimate of the RC time constant the data processor 300 can estimate the magnitude of the surge. This is useful as it is indicative of whether components in, for example, an electricity distribution system are likely to have been damaged by the surge event or whether the surge event was within their current handling capability. The comparator 330 may be protected by way of a voltage clamp, schematically illustrated by way of zener diode 332. The transient detector 320 may also include a DC blocking capacitor 334 to provide further protection against transient events.

Although the teachings have been presented with respect to inductive current transducers, the teachings relating to estimating the transfer function of a filter or circuit, and using this to estimate the magnitude of a surge current can be applied to estimating the size of over-voltage events or any other measured exception that is converted into the electrical domain by a suitable transducer.

It is thus possible to provide a method and apparatus for accurately characterizing the filter response where the values of the filter are not well known, but the change in their value can be accurately matched to the change in values in a corresponding interrogation circuit.

Figure 14A:
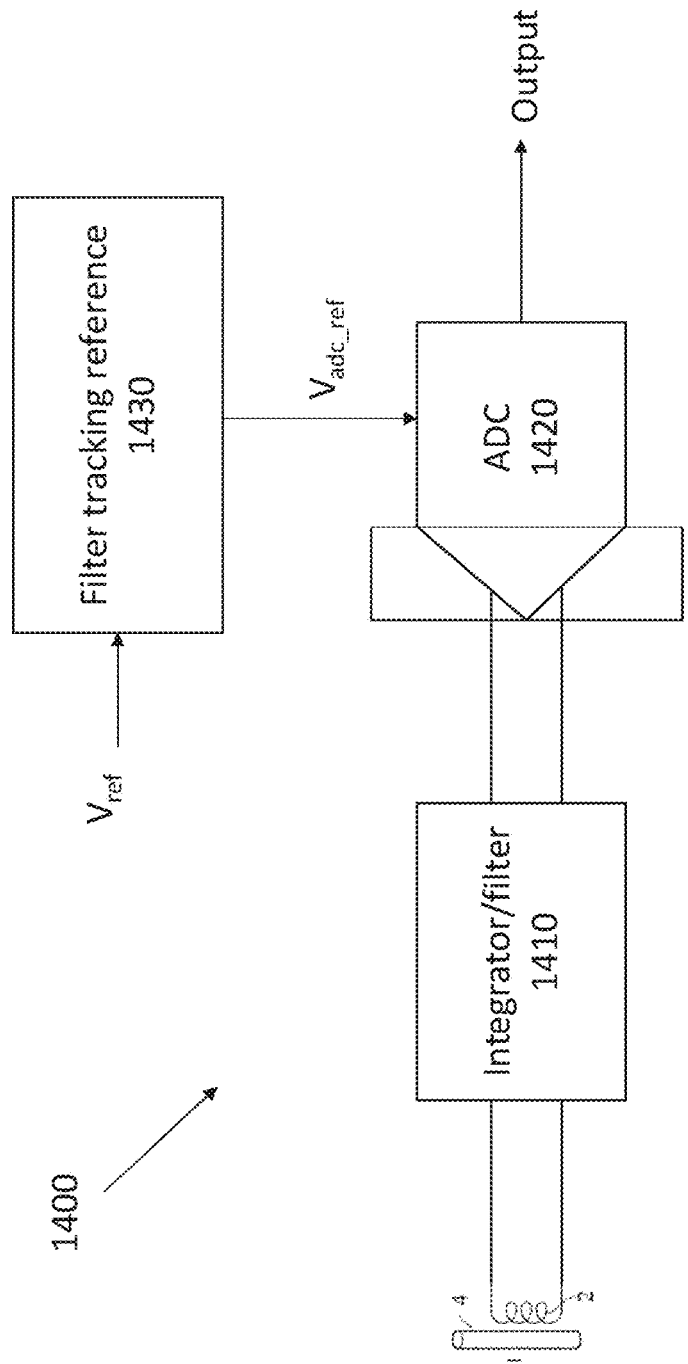
FIG. 14A illustrates a further embodiment of the present disclosure.

FIG. 14A shows a system 1400 in accordance with a further aspect of the disclosure. The system 1400 comprises a coil based current transducer, such as a Rogowski coil/air-cored current transformer 2, coupled to an apparatus that comprises an integrator/filter 1410, an analog to digital converter (ADC) 1420 and a filter tracking reference generator 1430. The integrator/filter 1410 may be a single ended or differential circuit and may, for example, be a low-pass filter such as those represented in any of FIGS. 3, 4, 9, 10 and 13. The ADC 1420 may be implemented as a single-ended or differential ADC and is coupled to the integrator/filter 1410 and configured to digitally convert the filtered signal output by the integrator/filter 1410. As explained with respect of FIG. 5, a change in value of the filter components of the integrator/filter 1410, such as the values of R and/or C, may change the frequency response of the integrator/filter 1410 by changing the break point. This in turn changes the gain of the integrator/filter 1410 for signals that are within the frequency range of range of operation (also referred to has the frequency range or region of interest), for example signals that are greater than the break point frequency, such as the frequency $F_M$ in FIG. 5. Similarly to the arrangements represented in FIGS. 9 and 10 that are described above, the arrangement of FIG. 14A is configured to correct for such changes in the frequency response of the integrator/filter 1410, such that within the operational frequency range (the range/region of interest) the overall gain of the system remains substantially constant/stable, such that it is substantially unaffected by changes in the values of the filter components. However, unlike the arrangements of FIGS. 9 and 10, the system 1400 does not have a characterizing circuit configured to characterize the filter components and a separate mechanism for correcting for any changes in frequency response of the integrator/filter 1410. Instead, it effectively combines correction and filter value tracking into a single unit/circuit, which is the filter tracking reference generator 1430.

The filter tracking reference generator 1430 is configured to generate a reference voltage $V_{adc\_ref}$ for the ADC 1420. The reference voltage $V_{adc\_ref}$ effectively defines the magnitude of the voltage represented by each digital code output by the ADC 1420. When the magnitude of $V_{adc\_ref}$ decreases, the magnitude of the voltage represented by each digital code decreases, meaning that for a given voltage at the input to the ADC, a reduction in $V_{adc\_ref}$ results in more digital codes at the output. As a result, decreasing the size of $V_{adc\_ref}$ effectively increases the gain of the ADC 1420.

The inventors have therefore configured the filter tracking reference generator 1430 to generate $V_{adc\_ref}$ to be dependent on the value of at least one of the filter components in the integrator/filter 1410. The nature of the dependency is such that a change in the value of a tracked filter component that changes the gain of the integrator/filter 1410 also results in a change in the magnitude of $V_{adc\_ref}$, which effectively adjusts the gain of the ADC 1420 in the opposite direction to the change in gain of the integrator/filter 1410, thereby correcting for the change in the integrator/filter 1410. For example, if the gain of the integrator/filter 1410 increases, the magnitude of $V_{adc\_ref}$ increases so that the gain of the ADC 1420 decreases.

Figure 14B:
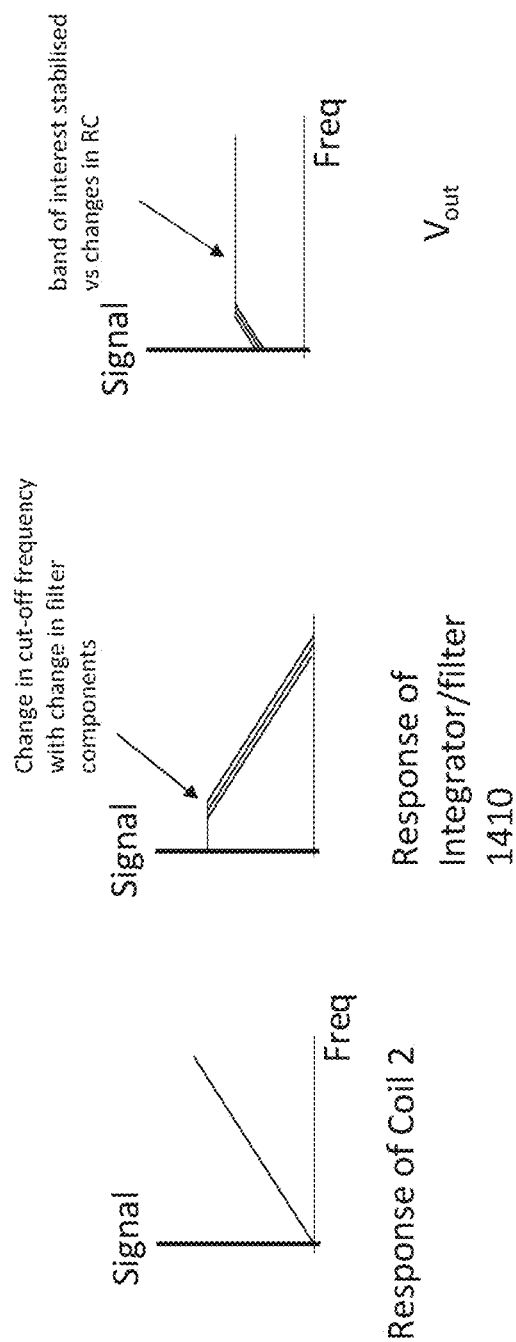
FIG. 14B shows frequency response characteristics of various parts of the embodiment of FIG. 14A.

FIG. 14B shows a representation of the frequency response of the coil 2, the integrator/filter 1410 and the overall system ($V_{out}$). The frequency response of the coil 2 and the integrator/filter 1410 is as described earlier with reference to FIG. 5. FIG. 14B shows three different example cut-off/break point frequencies for the integrator/filter 1410, caused by changes in the value of filter component (eg R and/or C). In this example, an increase in R and/or C results in the break point reducing in frequency, thereby effectively reducing the gain of the filter in the operational frequency range (ie, reducing the gain for signals at frequencies that are greater than the cut-off frequency). However, any change in the value of a filter components, for example caused by temperature and/or component drift over time, causing a change in gain of the integrator/filter 140, are corrected by a corresponding change in the ADC reference voltage $V_{adc\_ref}$ causing a correcting change in gain of the ADC 1420. The result of this can be seen in the frequency response of the overall system $V_{out}$, where in the operational frequency range the gain is substantially constant and unaffected by changes in the values of the filter components.

In order to achieve this effect, the filter tracking reference generator 1430 may comprise one or more tracking components that are matched to the filter components of the integrator/filter 1410. For example, if the integrator/filter 1410 includes a resistor and capacitor, the tracking components may include a matched resistor and/or a matched capacitor. The matched components may be the same size as the filter components, or a scaled version, or a component from a similar family of components using the same materials. Where the filter components are fabricated using integrated circuit technologies, the matched components may be fabricated in the same way and on the same IC. Where filter components are off chip components, the matched components may also be off chip components having the same design/technology. As a result, any changes over time in the value of the filter components should be substantially replicated by the tracking components. The filter tracking reference generator 1430 is configured to generate $V_{adc\_ref}$ to be dependent on the value of the tracking components, and therefore by extension dependent on the value of the filter components.

Figure 14C:
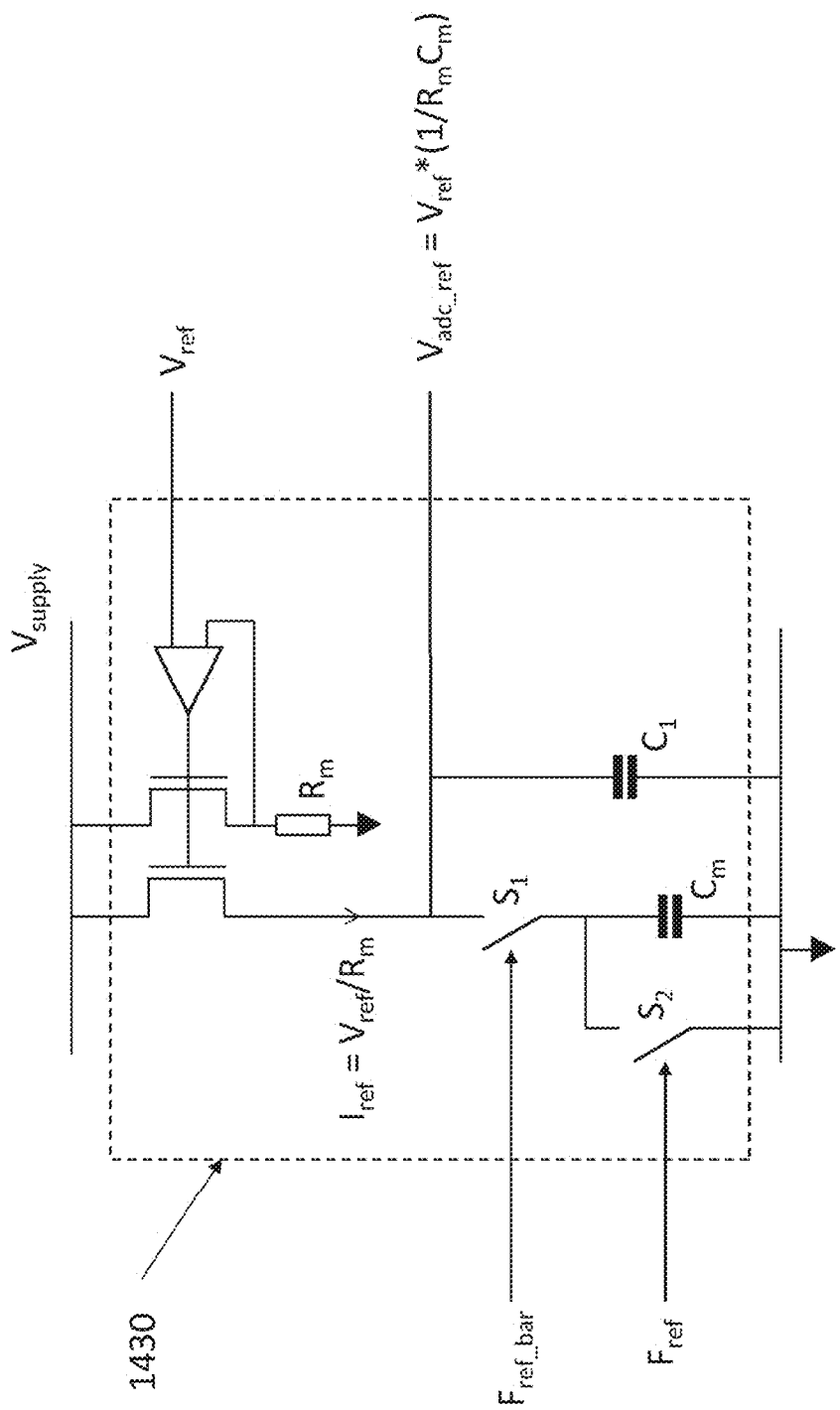
FIG. 14C shows an example implementation of a filter tracking reference circuit.

FIG. 14C shows one non-limiting example design for the filter tracking reference generator 1430. In this example, the filter tracking reference generator 1430 is configured for use in a system where the integrator/filter 1410 is a low-pass filter having a resistor and capacitor. The filter tracking reference generator 1430 receives a fixed voltage reference $V_{ref}$ (such as one generated by a band-gap reference, or any other suitable voltage reference source) and modifies it to be dependent on the value of a tracking resistor $R_m$, which is matched to the resistor in the integrator/filter 1410, and the value of a tracking capacitor $C_m$, which is matched to the capacitor in the integrator/filter 1410. In this particular example, $V_{ref}$ is converted to a current $I_{ref}$ using a V-to-I converter arrangement. The V-to-I converter arrangement is configured such that $I_{ref}$ is dependent on the inverse of $R_m$ (i.e., if $R_m$ increases, $I_{ref}$ decreases). $I_{ref}$ is then converted back to a voltage $V_{adc\_ref}$ using a switched capacitor arrangement that includes the tracking capacitor $C_m$ that when switched at a switching frequency $F_{ref}$ represents an equivalent resistance that is $1/(C_m F_{ref})$. As a result, $V_{adc\_ref} = I_{ref}/C_m = V_{ref} *(1/R_m C_m F_{ref})$. Consequently, $V_{adc\_ref}$ is dependent on the inverse of $R_m$ and $C_m$. It will be appreciated that the switch control signals $F_{ref}$ and $F_{ref\_bar}$ may be set at to any suitable fixed switching frequency $F_{ref}$ in order to achieve a desired effective impedance of the switched capacitor $C_m$. The switch control signals may be generated and controlled by any suitable controller device/circuit, which is not represented in FIG. 14C for the sake of simplicity. The capacitor $C_1$ functions as a smoothing capacitor, for the peaks of current that come from the equivalent circuit of the switch capacitor resistor and may be set to any suitable value. More complicated filters, such as discrete time notch filters may optionally also be used to help remove such ripple. Optionally, the filter tracking reference generator may also be buffered before driving the ADC 1420 to reduce the effect of its impedance on the response of the filter tracking reference generator 1430.

Whilst FIG. 14C shows one particular example circuit that may be used to generate $V_{adc\_ref}$, it will be appreciated that various other circuits could alternatively be used to generate a reference voltage that is dependent on the tracking components. It should be noted that if, for example, one component is particularly stable, the filter tracking reference generator 1430 could be made to predominantly track only the least stable component and still bring substantial benefit to the system stability, as described in more detail later. Furthermore, whilst in this example $V_{adc\_ref}$ is substantially proportional to the inverse of the value of the tracking components (which is suitable for tracking the filter components of an integrator/low pass filter), an alternative characteristic may be desirable. For example, the filter tracking reference generator 1430 may be configured to output a voltage reference $V_{adc\_ref}$ that is substantially proportional to the value of the tracking components, for example if the filter/integrator 1410 were configured as a high pass filter. This example may be particularly useful where the apparatus is configured for connecting not to the coil 2, but to a different type of a device/component that has a frequency response that is opposite to that of the coil 2.

Figure 15A:
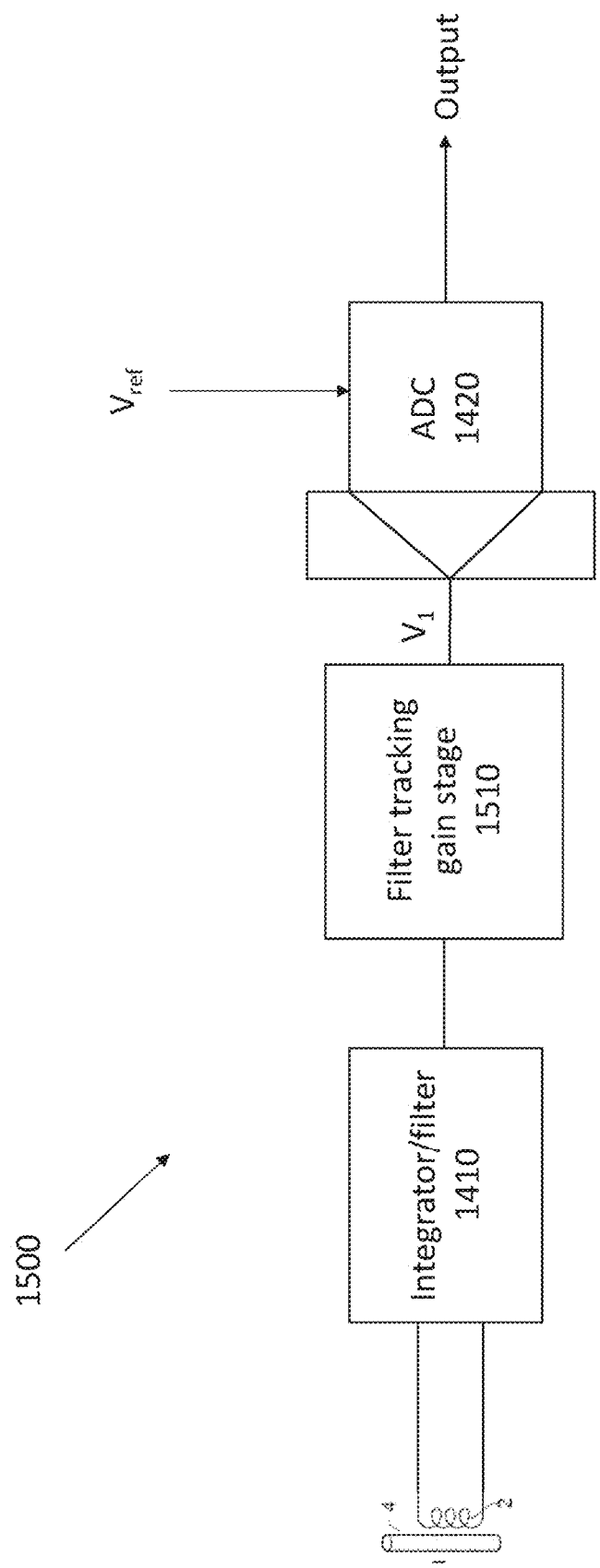
FIG. 15A illustrates a further embodiment of the present disclosure.

FIG. 15A shows a system 1500 in accordance with a further aspect of the disclosure. Its purpose is the same as the system 1400 described above, but rather than using an ADC reference voltage that is dependent on the value of the tracking components, it instead uses a filter tracking gain stage 1510 in the signal path, where the gain of the gain stage 1510 is dependent on the value of the tracking components in the gain stage 1510.

The integrator/filter 1410 and the filter tracking gain stage 1510 may be considered together to form a signal processing circuit/unit/module where a signal received at the input (for example, a signal from the coil 2) passes through a signal path that includes both the integrator/filter 1410 and the filter tracking gain stage 1510 and is output to the ADC 1420. Whilst FIG. 15A shows the integrator/filter 1410 preceding the filter tracking gain stage 1510 in the signal path, they may alternatively appear in the opposite order in the signal path. The filter tracking gain stage 1510 is configured to have one or more tracking components that are matched to the filter components of the integrator/filter 1410, such that any change in the value of the filter components should be mirrored by the same changes in the value of the tracking components. The filter tracking gain stage 1510 is configured to have a gain that has a dependency on the value of the tracking components that is opposite to the dependency that the gain of the integrator/filter 1410 has on the filter components. In more detail, if the integrator/filter 1410 is configured as a low-pass filter with R and C filter components, as the value of R and/or C increases, the gain typically decreases for signals that are within the frequency range of interest. In this case, the filter tracking gain stage 1510 is configured to have a gain that is substantially proportional to the value of the tracking components so that any increase/decrease in gain of the integrator/filter 1410 is corrected by a corresponding decrease/increase in gain of the filter tracking gain stage 1510.

Figure 15B:
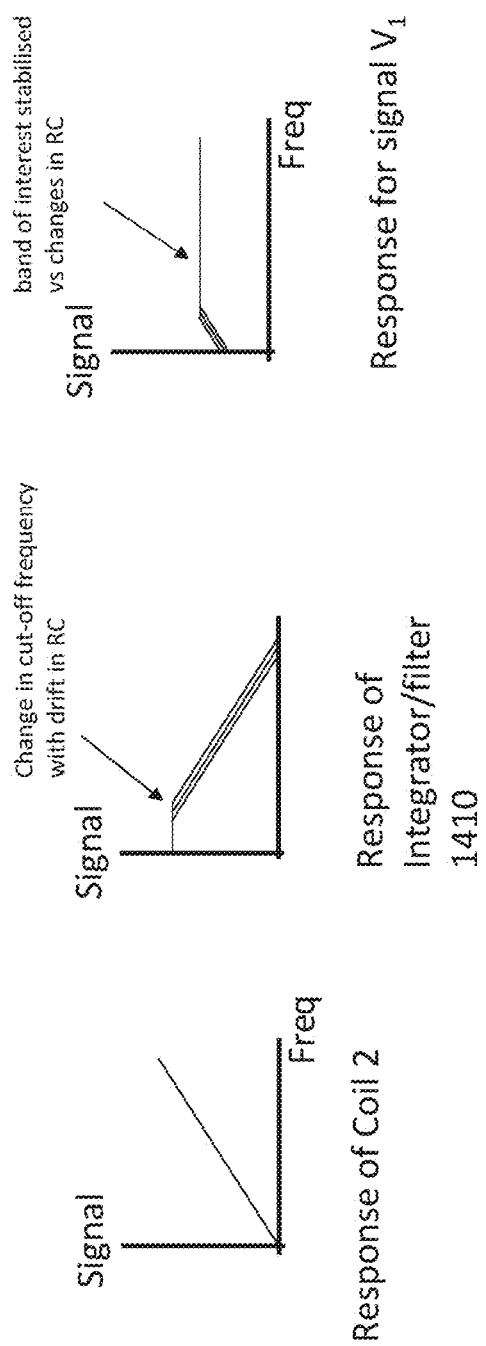
FIG. 15B shows frequency response characteristics of various parts of the embodiment of FIG. 15A.

FIG. 15B shows a representation of the frequency response of the coil 2, the integrator/filter 1410 and the output $V_1$ of the signal processing circuit. The frequency response of the coil 2 and the integrator/filter 1410 is as described earlier. As can be seen, the output $V_1$ has a stabilized gain for signals with frequencies within the operational range, by virtue of the functionality of the filter tracking gain stage 1510. In other words, the filter tracking gain stage 1510 effectively tracks any change in value of the filter components and substantially corrects any change in the frequency response of the integrator/filter 1410 that is caused by a change in the value of the filter components. As a result, the overall gain of the system 1500 should be substantially constant for signals in the operational frequency range and independent of changes in the value of the filter components.

Figure 15C:
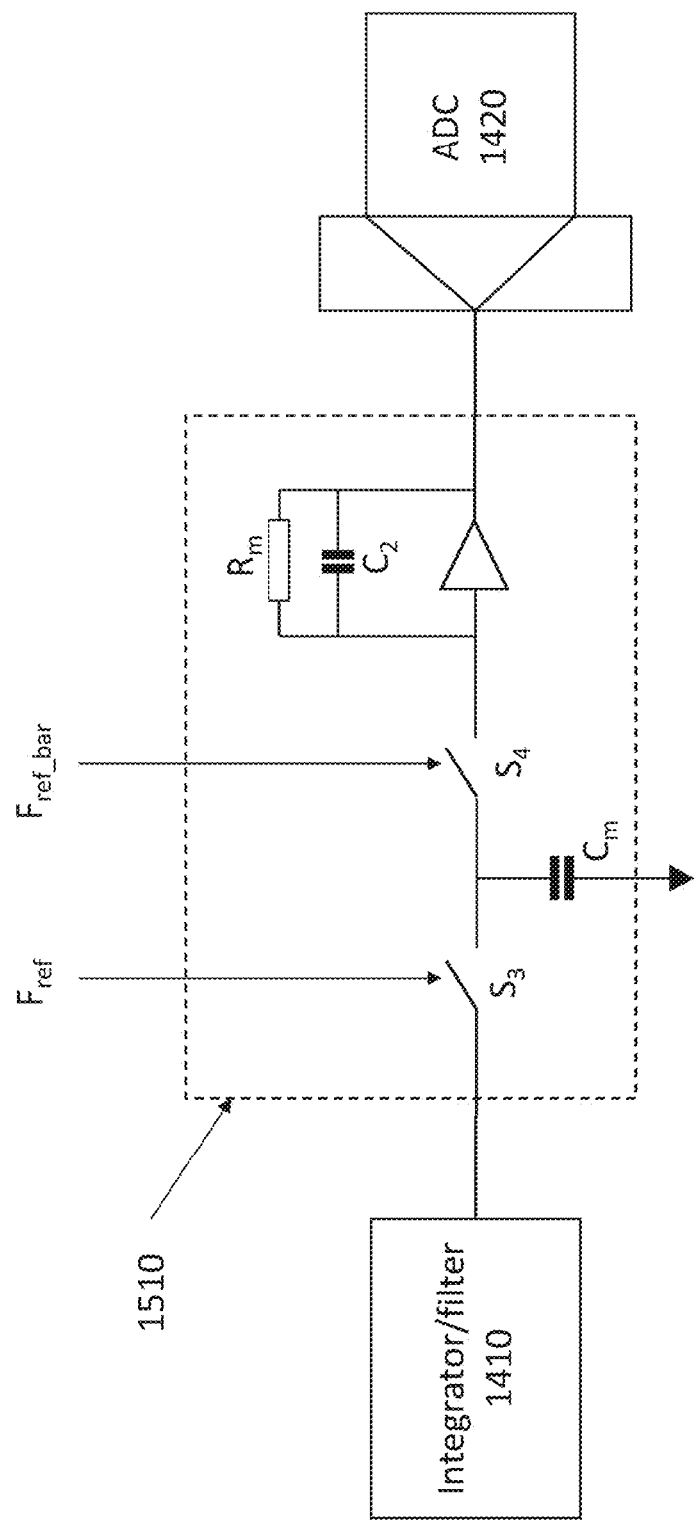
FIG. 15C shows an example implementation of a filter tracking gain stage.

FIG. 15C shows one non-limiting example design for the filter tracking gain stage 1510. In this example, the filter tracking gain stage 1510 is based on an inverting gain configured amplifier with tracking components $C_m$ and $R_m$. The component $C_m$ is a capacitor that is matched to the capacitor in the filter/integrator 1410 and is arranged as a switched capacitor. The component $R_m$ is a resistor that is matched to the resistor in the filter/integrator 1410 and is arranged as a feedback component. In this example, the gain is substantially proportional to the value of both $C_m$ and $R_m$, so as to correct for any changes in the components of the integrator/filter 1410, which in this example is a low-pass filter. However, the filter tracking gain stage 1510 may alternatively be configured to have the opposite gain dependency on $C_m$ and $R_m$, for example if the integrator/filter 1410 were configured to be a high-pass filter.

The gain of this stage is determined by the ratio of the feedback impedance around the amplifier and the input impedance from the switched capacitor equivalent resistor, to the drive impedance, meaning the gain is proportional to $R_m/(1/(C_m F_{ref}))$. It will be appreciated that the switch control signals $F_{ref}$ and $F_{ref\_bar}$ may be set at design time to any suitable fixed switching frequency in order to achieve a desired effective impedance of switched $C_m$. The switch control signals may be generated and controlled by any suitable controller device/circuit, which is not represented in FIG. 15C for the sake of simplicity. The capacitor $C_2$ may be set to any suitable value needed to smooth out the ripple from the switched capacitor input. Other smoothing filter approaches may additionally or alternatively be used.

In the arrangements of FIGS. 14A and 15A, a filter tracking circuit (eg, the filter tracking reference generator 1430 in FIG. 14A and the gain stage 1510 in FIG. 15A) having tracking components matched to the filter components of the integrator/filter 1410, enabling the circuit to track any changes in value of the filter components. The filter tracking circuit is configured to modify an input to the ADC 1420 in a way that is dependent on the value of the tracking components and which results in a change to the digital conversion performed (either by changing the size of the ADC reference voltage or the size of the analog input) that corrects any change in gain of the integrator/filter 1410 caused by a change in value of the filter components. Consequently, it can be seen that a single circuit/unit can both track the value of the filter components and exercise a correction to the gain of the system, thereby eliminating the need for a separate characterization circuit.

In both the examples of FIGS. 14 and 15, the filter tracking circuit includes two tracking components—$R_m$ and $C_m$. In an alternative, only one of these components may be matched to their corresponding filter component, with the other arbitrarily chosen. For example, if the integrator/filter 1410 uses a very stable resistor that should not vary significantly over time, there may be a need only to track the value of the capacitor in the integrator/filter 1410. In this case, $R_m$ may be chosen to be a very stable resistor, but of any size, construction and technology. In this case, the "tracking components" in the filter tracking circuit would include only $C_m$, which is matched to the capacitor in the filter and would track any changes in the filter capacitor over time. In an alternative, $R_m$ may be the only "tracking component" and $C_m$ be of arbitrary size, construction and technology if the capacitor used in the filter is very stable (for example, is a capacitor external to the IC in which the filter is located).

As mentioned earlier, the filter tracking circuit, the integrator/filter 1410 and the ADC 1420 may together form an apparatus for coupling to a device such as a Rogowski coil or air-cored current transformer. The circuits/units of the apparatus may all be formed on the same IC, or different ICs and coupled together, or formed using discrete components on a PCB, etc. The apparatus and the Rogowski coil or air-cored current transformer may together form a system for measuring current.

All of the filter components described in the present disclosure are resistors and capacitors (i.e., RC filters). However, the filter components may alternatively be resistors and inductors (i.e., RL filters) or inductors and capacitors (i.e., LC filters). Likewise, the corresponding tracking components may include any one or more of: a matched resistor, a matched capacitor, a matched inductor.

As shown with respect to FIG. 2, the voltage V developed across a Rogowski coil 2 (or a rate of change of current sensor) increases linearly with frequency. Ideally, the magnitude of the output representation in terms of voltage or codes of the current measurement system using the Rogowski coil 2 would be flat, or substantially flat, across the frequency range of interest (i.e., for all currents 4 having a frequency within the frequency range of interest, the magnitude of the representation of the current 4 would be largely frequency invariant). Ideally it would also have near linear phase delay across the frequency range of interest so that content at different frequencies would have largely the same group delay and maintain their relative relationships. In applications such as AC power metering, there is a requirement to keep the fundamental and the first 10's or 100 harmonics to within a certain error band of a fraction of a dB and marginal phase error, not just in terms of with respect to the current measurement itself but also with respect to other measured channels of current and voltage.

As shown in FIG. 8, a low-pass filter or integrator may therefore be coupled to the output of the Rogowski coil to compensate for the gain vs frequency response of the Rogowski coil, providing a flat or relatively constant frequency response 60. The low-pass filter also acts to prevent output saturation, limiting the gain of the system at high frequencies. The position of the corner frequency of the low-pass filter relative to the frequency range of interest determines the balance between SNR vs. the magnitude response flatness and phase response linearity of the overall response in the region of interest. The corner frequency may be located at least an order of magnitude below the frequency range of interest (i.e., the range of current frequencies that the current sensor system is configured to measure) to manage this requirement. However, this may require large resistor and capacitor values in the low-pass filter, and can result in problems of thermal noise, and drift.

FIG. 16 shows a current measurement apparatus 1600 including a current carrying conductor 4, a Rogowski coil 2 and a number of system blocks 1602, 1604, 1606 and 1608. The output of the Rogowski coil 2 is provided to the input of an analog integrator or low pass filter 1602, which integrates the output of the Rogowski coil 2. The output of the analog integrator 1602 is provided to the input of an anti-alias filter 1604, which provides an anti-aliasing function (although it should be appreciated that the analog integrator 1602 and the anti-alias filter 1604 may be positioned the other way around). The output of the anti-alias filter 1604 is provided to an analog-to-digital converter, ADC, 1606, which operates at an ADC sample clock rate and converts the analog output of the anti-alias filter 1604 to a digital signal. The anti-alias filter 1604 may effectively ensure that the system gain at signal frequencies before the sampling frequency is decreasing and therefore avoids noise and signal folding from the sampling process. The digital output of the ADC 1606 is provided to a digital filter/energy computation circuit 1608. There may be a gain stage at or before the ADC 1606 (for example, as part of the ADC 1606, or before the anti-alias filter 1604, or as part of the analog integrator 1602) as the analog integrator 1602 attenuates the signal in the band of interest, and the signal may need to be increased to manage the noise and other error sources of the signal processing chain to keep the precision requirements reasonable. The most normal place to include a gain stage is within the analog integrator 1602 although other places are possible, as explained above.

Each section of the current measurement apparatus 1600 provides a different frequency response or transfer function, affecting the gain and/or phase of the signal which passes through it. Below each of the system blocks 1610-1640 is a magnitude/gain plot of the effect that the respective system block has on the magnitude of the signal. The solid line in each magnitude plot is the magnitude response or transfer function of the respective system block above that plot. The dashed line in each magnitude plot is the cumulative or combined magnitude response or transfer function of the system blocks up until and including the respective system block above the plot.

The Rogowski coil 2 provides a signal whose magnitude increases with frequency 1610, representing the integral of the measured current. It is desirable for the final measurement output signal of the system 1600 not to increase with frequency, as described above, and an analog integrator 1602 is therefore provided in the signal path. The analog integrator 1602 has a transfer function which provides a magnitude response 1612 which decreases with frequency above the corner frequency 1614 of the integrator 1602. The combined response of the Rogowski coil 2 and the analog integrator 1602 is therefore flat 1616, or substantially flat, above the corner frequency 1614 of the integrator 1602. The integrator 1602 may be configured such that it has a corner frequency 1614 which is below the frequency range of interest 1618 of the system (i.e., the frequency range of the input signal over which the system is configured to measure the input signal). By positioning the corner frequency 1614 below the frequency range of interest 1618, the combined response 1616 of the Rogowski coil 2 and the analog integrator 1602 is substantially flat within the frequency range of interest 1618.

The output of the analog integrator 1602 is provided to the input of the anti-alias filter 1604. The anti-alias filter 1604 is an optional component, providing improved performance by restricting the signal bandwidth before the ADC 1606. As such, the response or transfer function 1620 of the anti-alias filter 1604 may be considered a filter with a corner frequency set below the ADC sample clock frequency or ADC sample rate, and often significantly above the frequency range of interest 1618 so as not to impact it. The combined magnitude response of the Rogowski coil, the analog integrator 1602 and the anti-alias filter 1604 therefore rolls-off at higher frequencies before the ADC sample rate.

The output of the anti-alias filter 1604 is provided to the ADC 1606 to provide an analog to digital conversion. Ideally, the ADC 1806 does not provide any change in the magnitude response of the signal, therefore no magnitude plot is shown. Optionally, the position of the anti-alias filter 1604 and the analog integrator 1602 could be swapped, but in the position shown in FIG. 16, any higher frequency noise introduced from an active implementation of the analog integrator 1602 is attenuated by the anti-aliasing filter 1604 before it folds back from the ADC 1606.

The output of the ADC 1606 is often then provided to a band-limiting digital filter and/or energy computation system 1608. The band-limiting digital filter(s) 1608 provides a magnitude response 1624 which sharply band-limits the output of the ADC 1606, such that the overall output signal 1626 is sharply band-limited outside the frequency region of interest 1618. For example the digital filter(s) could include a high order high pass filter(s) (HPF) to remove noise below the fundamental of the energy system being measured, for example at 20 Hz for a 50 Hz fundamental. The HPF function may also be useful because active circuitry in the signal paths in the creation of the earlier filters (eg, the analog integrator 1602 and/or the anti-alias filter 1604), in the ADC 1604 and/or in any gain stage needed to improve the SNR, may introduce offset at DC, which would be false signal as the sensor 2 itself measures only AC signals. The digital filter(s) 1608 could also include a low pass filter(s) (LPF) to reduce the noise at high frequencies and only allow the area of flat (or substantially flat) response to pass. For example, the LPF could be configured to allow signals to pass up to 3.2 kHz, to allow all the first 50 Harmonics of a 60 Hz fundamental through and clearly cut-off beyond the $53^{rd}$ harmonic.

The current measurement is often use for an energy or power calculation, which involves multiplying the measured current with a measurement of voltage (not represented in FIG. 16 for the sake of simplicity). This in itself, because of the strong fundamental and harmonic content of the voltage channel, may be like performing a series of narrow band filters, but it could still be enhanced to avoid accumulation of excess out of band noise with sharp band defined filtering that could be done after the combination on the power calculation and still be effective.

It will be appreciated that the digital filter and/or energy computation unit 1608 may be omitted entirely, or may be configured to perform only digital filtering to band-limit the output of the ADC 1606, or only perform power/energy computation.

Figure 17:
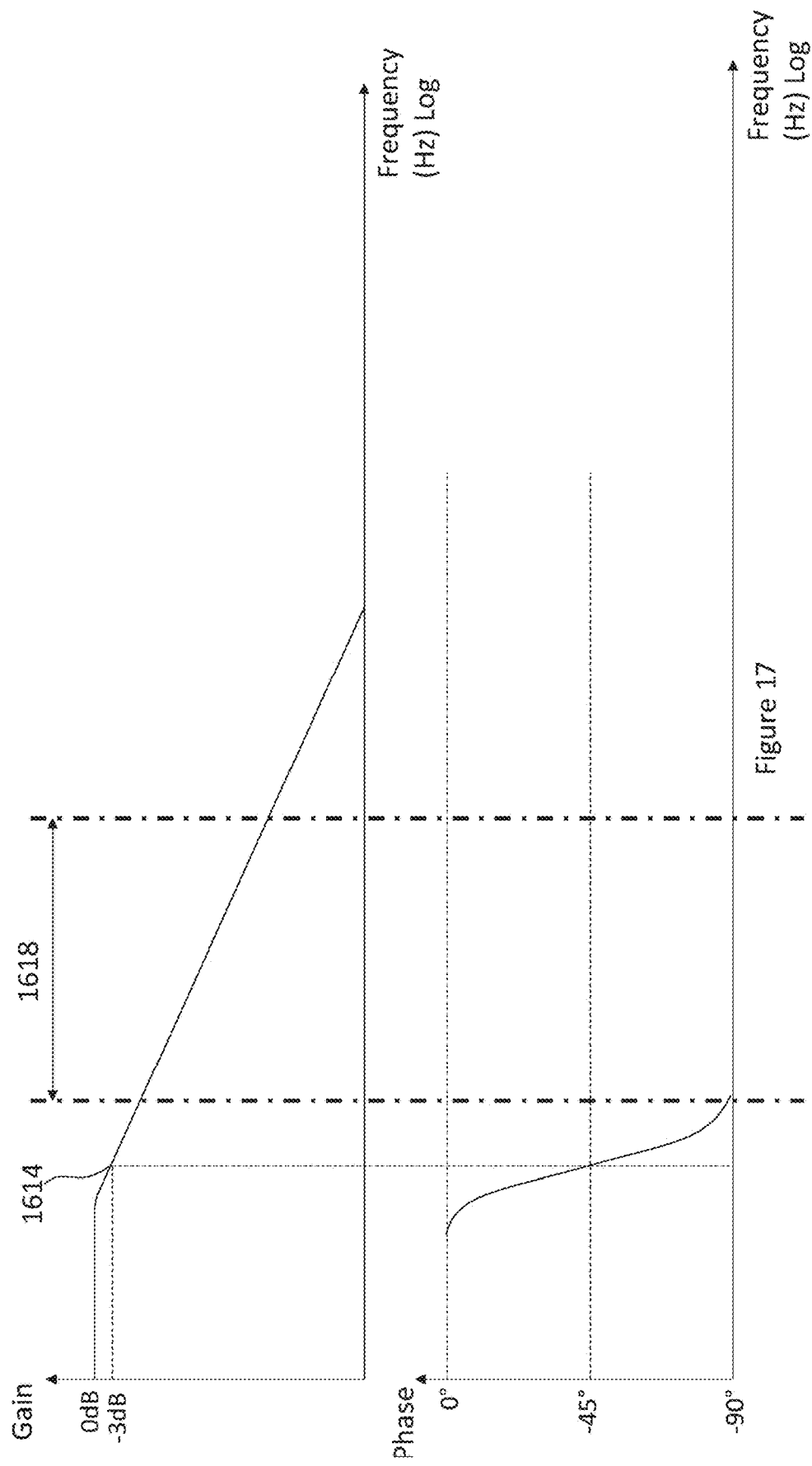
FIG. 17 shows a bode plot of the frequency response of the analog integrator or filter of the current measurement system of FIG. 16.

FIG. 17 shows a bode plot of the analog integrator 1602 of FIG. 16, where the corner frequency is below the frequency range of operation (also referred to as the frequency range of interest) of the current measurement apparatus 1600. The bode plot may be considered to represent the frequency response of the integrator 1602, showing the frequency-magnitude response, or frequency-gain response, of the filter (i.e., how the gain of the filter changes with signal frequency) and the frequency-phase response (i.e., how the filter changes the phase of the signal, in dependence on the frequency of the signal). From hereon, 'frequency response' is a term used to encompass both frequency-magnitude response and frequency-phase response. The bode plot of FIG. 17 is presented on a simplified logarithmic scale, for example the roll-off of the gain plot below the 3 dB point is shown as a straight line. Above the 3 dB point, the gain of a low-pass filter is-20 dB/decade. Notably, by providing a low 3 dB point, the system is more immune to output saturation, but provides a lower gain within the frequency region of interest.

The analog integrator 1602 causes up to a −90° change in the output signal compared to the phase of the input signal, depending on the frequency of the signal. By providing a 3 dB point which is outside of the frequency range of interest, for example below the frequency range of interest by an order of magnitude as in FIG. 17, the majority if not all of the change in phase occurs at signal frequencies which are outside the region of interest. Because of this, there may be only a small phase change within the frequency range of interest, which in some cases can largely be approximated to a linear phase change across the frequency range of interest. In some circumstances this difference in phase change across the region of interest may be ignored if it is very small. In some other cases its approximation to being linear allows for simple correction through delay. The integrator or low-pass filter 1602 also acts to prevent output saturation, at least partially compensate for the gain vs frequency response of the Rogowski coil 2 and to set the maximum gain of the signal output from the integrator or low pass filter 1602.

Figure 18:
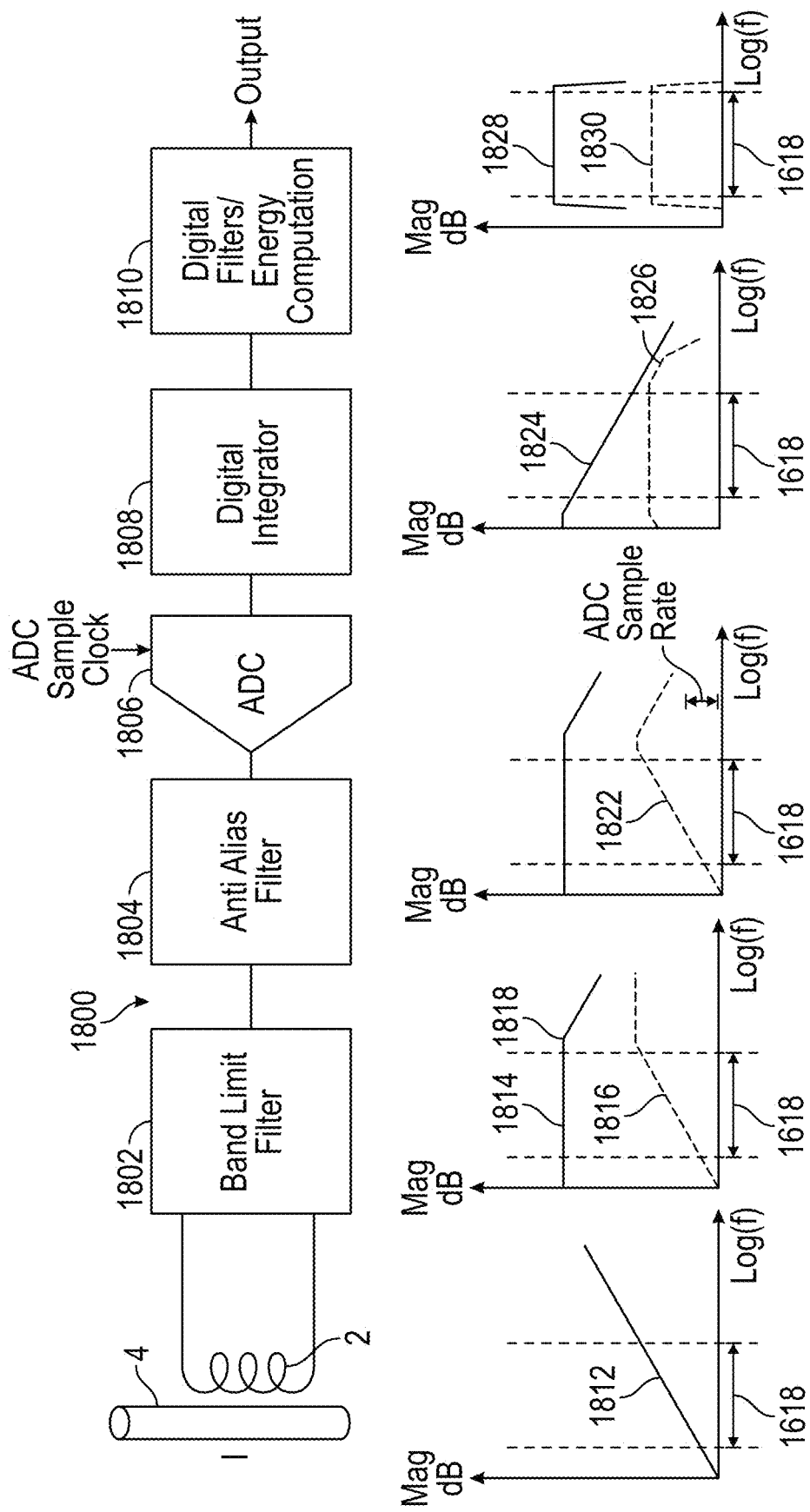
FIG. 18 shows an example current measurement system comprising a digital integrator and a number of magnitude responses of the current measurement system.

FIG. 18 shows a current measurement apparatus 1800 that reconstructs an approximately flat response for the system 1800 as a whole over the frequency of interest through a digital integrator approach. It includes a current carrying conductor 4, a Rogowski coil 2 and a number of other system blocks 1802, 1804, 1806, 1808 and 1810. The output of the Rogowski coil 2 is provided to the input of a band limiting filter 1802. The output of the band limiting filter 1802 is provided to the input of an optional anti-alias filter 1804, which provides an anti-aliasing function. The output of the anti-alias filter 1804 is provided to an analog-to-digital converter, ADC, 1806, which operates at an ADC sample clock rate and converts the analog output of the anti-alias filter 1804 to a digital signal. The digital output of the ADC 1806 is provided to a digital integrator 1808, which integrates the output of the ADC 1806. The output of the digital integrator 1808 is provided to a digital filter and/or energy computation circuit 1810, which provides band limiting filtering and/or energy/power computation.

It may therefore be desirable to reduce or remove the increasing gain with frequency provided by a Rogowski coil 2. Further, the output of the Rogowski coil 2 at high frequencies can saturate downstream circuits or systems, for example amplifiers or ADCs, which are connected to the coil 2. A high v=di/dt pulse detected by the Rogowski coil, for example a large current pulse of a short duration, may cause saturation of a downstream circuit, such as the ADC 1806 and/or an amplifier, because the frequency response of the coil 2 is such that the output voltage would be very large.

There may be current signals of up to 10's A/uS passing through the conductor 4, which could cause instantaneous voltages of 100's mV or volts at the coil 2, in contrast to the mVs range of normal signal. This may cause a loss of information at high frequencies, but more importantly a corruption of the response after the digital integrator 1808 through rectification of the clipped signal that can lead to errors in the 100's % in power if at the right phase relative to the measured voltage. Also, in an extreme case it may also cause potential damage to at least some of the circuitry in the system 1600.

The Rogowski coil 2 provides a signal whose magnitude increases with frequency 1610, representing the integral of the current measured. The band limiting filter 1802 has a transfer function which provides a magnitude 1812 which decreases with frequency above the corner frequency 1818 of the band-limiting filter 1802. The combined response of the Rogowski coil 2 and the band limiting filter 1802 is therefore flat 1816 above the corner frequency 1818 of the band-limiting filter 1802. The band limiting filter 1802 may be configured such that it has a corner frequency 1818 which is above the frequency range of interest 1618 of the system (i.e., the frequency range of the input signal over which the system is configured to measure the input signal). By providing the corner frequency 1818 above the frequency range of interest 1618, the combined response 1816 of the Rogowski coil 2 and the band limiting filter 1802 is substantially flat above the frequency range of interest 1618. Notably, by providing a high corner frequency point, the system is less immune to output saturation with fast di/dt signals, and still provides a high gain beyond the frequency region of interest by virtue of the frequency-magnitude response of the Rogowski coil 2. The rejection to fast di/dt whose is determined by how long they last and their magnitude, the pole of this band limiting filter 1802 and the dynamic range of the signal processing chain (either the ADC range or the signal swing allowable by the band pass filter if implemented with active circuitry). An input current signal which is ramping at twice the rate of another signal, but whose ramp duration lasts half as long will have largely the same peak output voltage from sensor and band limiting filter combination, providing the band limiting filter is sufficiently low in frequency to mean that the edges represented are both being filtered (ie above the 3 dB point).

Optionally, there may be a gain stage as part of the band limiting filter 1802, or before the anti-aliasing filter 1804, or as part of the ADC 1806, to manage the noise and other error sources of the signalling chain to keep the precision requirements reasonable.

The output of the band limiting filter 1802 is provided to the input of the anti-aliasing filter 1804. As noted with respect to the current measurement apparatus of FIG. 16, the anti-aliasing filter 1804 is an optional component providing improved performance by restricting the signal bandwidth before it is provided to the ADC 1806. As such, the response or transfer function 1820 of the anti-alias filter 1804 may be considered a filter with a corner frequency set below the ADC sample clock frequency or ADC sample rate, and often significantly above the band of interest so as not to impact it. The combined magnitude response of the coil 2, the band limiting filter 1802 and the anti-alias filter 1804 therefore rolls-off at higher frequencies before the ADC sample rate. Optionally, the position of the anti-alias filter 1804 and the band limiting filter 1802 could be swapped, but in the position shown in FIG. 16, any higher frequency noise introduced from an active implementation of the band limiting filter 1802 is attenuated by the anti-aliasing filter 1804 before it folds back from the ADC 1806. In some cases, the band limiting filter and the anti-aliasing filter can be combined into a second order or higher filter.

The output of the anti-alias filter 1804 is provided to the ADC 1806 to provide an analog to digital conversion. Ideally, the ADC 1806 does not provide any change in the magnitude response of the signal, therefore no magnitude plot is shown.

The output of the ADC 1806 is provided to the digital integrator 1808. The digital integrator integrates the output of the ADC 1806, such that the combined magnitude response 1826 at the output of the digital integrator 1808 is flat within the frequency range of interest. The digital integrator is often implemented in a non-ideal form so as to avoid any DC content accumulating and saturating the digital integrator 1808. This may be supplemented or replaced by having a digital HPF before the digital integrator 1808 to have the same effect at preventing DC content from saturating the digital integrator 1808

Finally, the output of the digital integrator 1808 is provided to a digital filter and/or energy computation system 1810, which may have the same design and functionality as the digital filter and/or energy computation unit 1608 described above with reference to FIG. 18.

Figure 20:
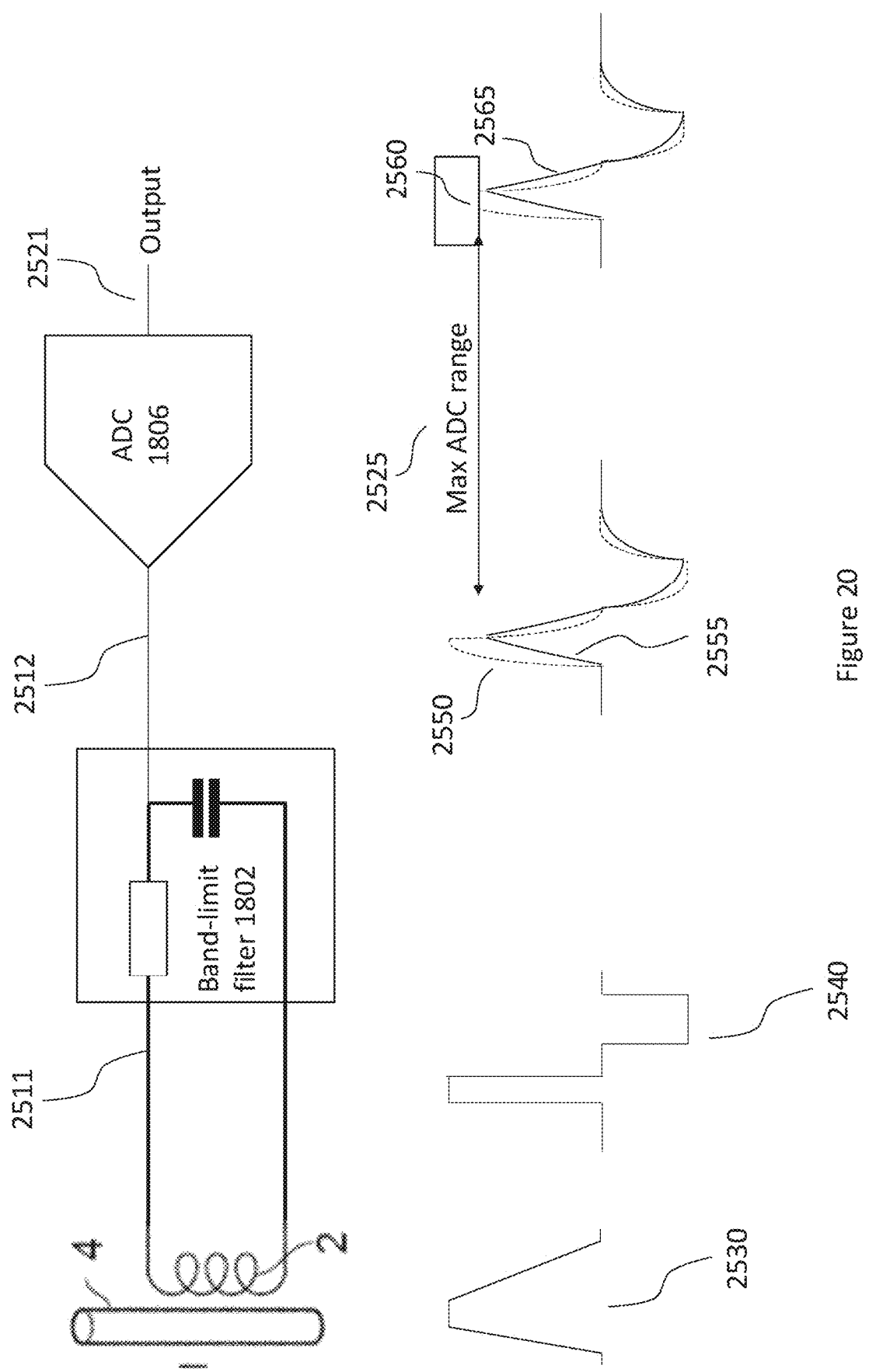
FIG. 20 shows a representation of the signal processing performed by a band limiting filter

FIG. 20 shows a bode plot of the response band limiting filter of FIG. 18, where the corner frequency of the band limiting filter 1802 is above the frequency range of operation (also referred to as the frequency range of interest) of the current measurement apparatus 1800. The bode plot may be considered to represent the frequency response of the band-limiting filter 1802, showing the frequency-magnitude response, or frequency-gain response, of the filter (i.e., how the gain of the filter changes with signal frequency) and the frequency-phase response (i.e., how the filter changes the phase of the signal, in dependence on the frequency of the signal).

The band limiting filter 1802 causes up to a −90° phase change in the output signal compared to the input signal, depending on the frequency of the signal. By setting a corner frequency 1818 which is outside of the frequency range of interest, for example above the frequency range of interest by an order of magnitude as in FIG. 19, the majority of the change in phase occurs at frequencies which are above the region of interest. Because of this, there may be only a small phase change within the frequency range of interest, which can be largely approximated to a linear phase change across the frequency range of interest. In some circumstances this difference in phase change across the region of interest may be ignored as it is very small. In other cases it can be approximated to being linear, which allows for simple correction through delay.

When considering both the systems 1600 and 1800, an analog filter with a relatively low corner frequency, 3 dB point, or break-point, (i.e., a 3 dB point well below the frequency range of interest, such as analog integrator 1602) may provide relatively good prevention of output saturation by reducing the gain of the system at high frequencies. However, information contained in harmonics at high frequencies may be lost. A low-pass filter with a relatively high corner frequency, 3 dB point, or break-point, (i.e., a 3 dB point well above the frequency range of interest, such as the band limit filter) may provide less good prevention of output saturation, as the high gain at higher frequencies is not limited to the same extent.

The digital integrator 1808 may provide an improved response stability compared with the analog integrator 1602 as it is does not depend on the stability of large analog components and this can improve on the signal-to-noise (SNR) ratio. However, there is a trade-off related to the position of the band-limiting filter 1802: increase its corner frequency and it becomes harder to prevent saturation with fast di/dt signals with reasonable dynamic range electronics eg ADC range and noise floor; lower its corner frequency and the band limiting filter 1802 may have a detrimental effect on the response of the frequency band of interest in terms of amplitude and phase. This is made more difficult if the system needs to cover a wider multi decade ratio between lowest frequency and highest frequency as is increasingly the case in energy measurement systems.

Amplitude/magnitude change and non-linear phase shift within the region of interest is undesirable as it means that some measured frequency content (for example, some harmonics) will be attenuated or phase shifted relative to other measured frequency content (for example, the fundamental component), which reduces the accuracy of measurement. Both the low corner frequency analog filter example of FIGS. 16 and 17 and the high corner frequency analog filter example of FIGS. 18 and 19 have the majority of the change occurring at signal frequencies that are outside of the frequency region of interest 1618, such that the frequency-phase response of the analog filters within the region of interest may be considered to be small, such that its impact is small. For example, it may be considered to be flat across the range of interest, or change in a substantially linear way across the region of interest (which can be easily compensated for using delay) a. This is achieved by setting the corner frequency of the filter 1602/1802 such that is well outside, for example an order of magnitude or a decade outside, the region of interest, preventing the phase-shift from having a major influence on the signals within the region of interest.

Figure 19:
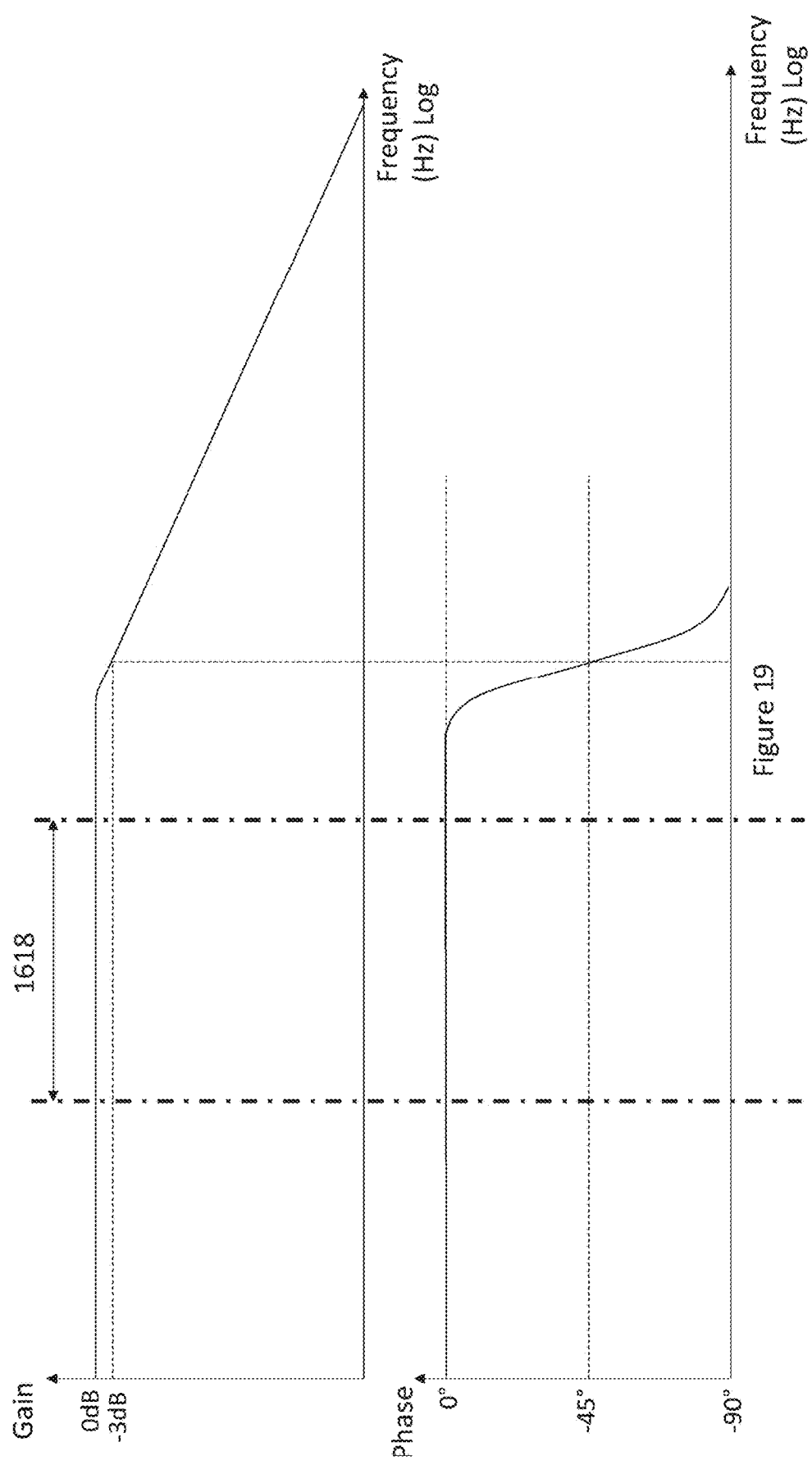
FIG. 19 shows a bode plot of the frequency response of the filter of the current measurement system of FIG. 18.

Whilst FIGS. 17 and 19 show the phase change as flat within the frequency range of interest, this is an idealised representation. In reality, a small phase shift is likely is present within the frequency range of interest 1618. However, as the majority of the phase shift occurs outside of the frequency range of interest 1618, the small phase shift which occurs within the frequency range of interest is substantially linear.

FIG. 20 helps to explain in more detail the function of the band-limit filter 1802 and shows the response of a di/dt sensor, such as Rogowski coil 2, to a spike of current in conductor 1. The spike in current is indicated by reference numeral 2530, which has a fast-rising edge di/dt and a slower falling edge response. This turns into a largely step voltage response 2540 at the output 2511 of the di/dt sensor due to the equivalent model of the coil response which can be modelled as being Ldi/dt, where L is the equivalent inductance of the response of the coil to the current I in the conductor 4. There is a positive step response of higher magnitude and shorter duration from the faster positive edge than the response to the negative edge which is a smaller negative going step. The band limiting filter 1802 outputs a signal 2512 in response to the input signal 2511. The nature of the signal 2512 depends on the RC value in the band-limiting filter 1802 and the time of the signals 2511. FIG. 20 shows two examples of signal 2512. The first is represented by the doted lines indicated by reference numeral 2550, and the second is represented by the solid lines indicated by reference numeral 2555. The example 2550 corresponds to the band-limiting filter 1802 having a relatively high frequency pole and example 2555 corresponds to the band-limiting filter 1802 having a relatively low frequency pole. The higher frequency pole filter output 2550 respond more closely to the input signal 2511 and gets to a higher voltage, but this can be a problem if this exceeds the maximum acceptable voltage of the next stage, in this case the maximum voltage range 2525 of the ADC 1806, as clipping will occur (represented by the dotted lines indicated by reference numeral 2560, showing a representation of the digital signal 2521 output by the ADC 1806). This will lead to errors in the reconstruction of the signal if there is a digital integrator 1808 at the output of the ADC 1806. The lower frequency pole filter output 2555 does not respond as quickly to the input signal 2511, meaning that its amplitude should not exceed the maximum acceptable voltage of the next stage. This can be seen by the sold lines indicated by 2565, which show that when the band-limiting filter 1802 has a relatively low frequency pole, the output of the ADC 1806 is not clipped. While this signal may look worse in some respects, the inventors have recognised that it is better after being digitally integrated, as it is a linear operation and the response of the band-limiting filter 1802 and the integrator 1808 are equally transposed to the combined response without the rectification effects of the clipping. To get equivalent resilience to di/dt signals from the higher frequency pole example of band-limiting filter 1802, an ADC 1806 with larger dynamic range would be required, which comes at a cost. The example shown in FIG. 19 is just representative to help explain the effects of high di/dt signals and signal saturation/clipping—there could optionally be amplification stages and/or anti-alias filters as well, and signal saturation problems may not be only associated with the maximum ADC 1806 input range, but could additionally or alternatively be related to other factors such as allowable voltage ranges to prevent circuit damage. Studies have shown that signal saturation problems caused by di/dt signals can be very significant, with some recent studies showing that smart electricity meters can be susceptible to misrepresentative power measurement in the 100's % when di/dt signals from switched power sources are in the 1 A/uS range.

Figure 21:
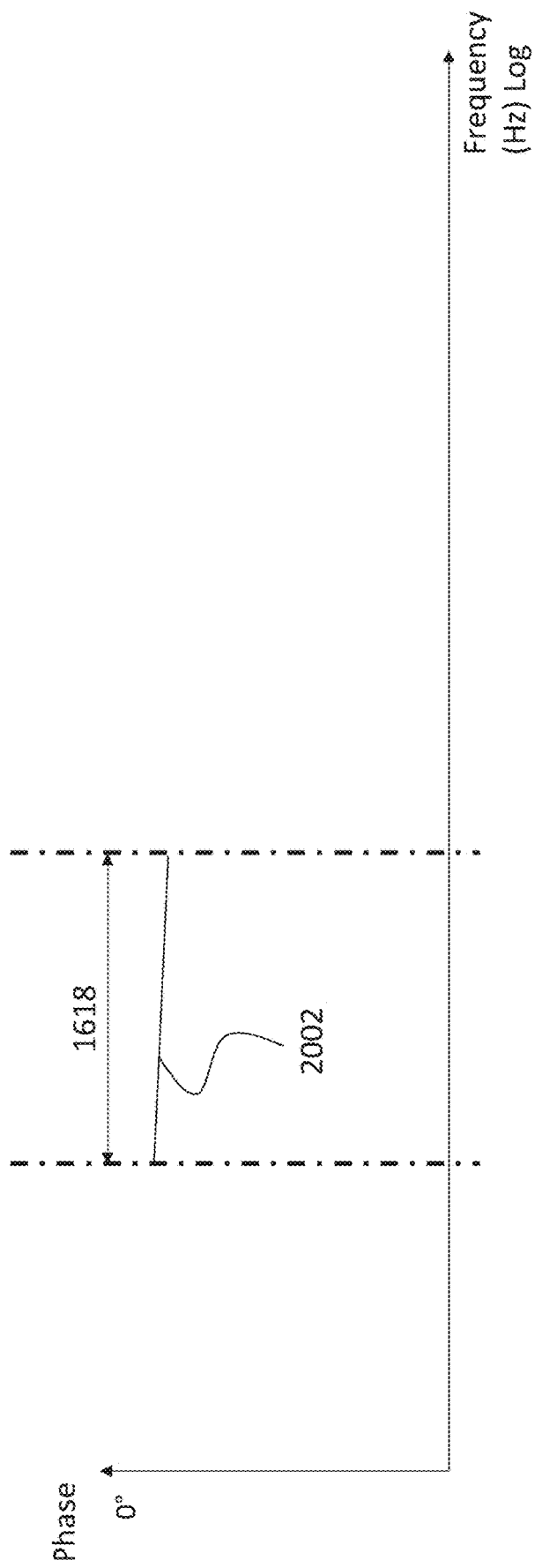
FIG. 21 shows a frequency response of the integrator or filter within a frequency range of interest.

FIG. 21 shows the phase shift 2002 which is introduced by either the analog integrator 1602 or the band limiting filter 1802 (both of which act as filters) within the frequency range of interest 1618. This phase shift is approximately linear within the frequency range of interest because the frequency range of interest is well away from the corner frequency of the analog integrator 1602 or the analog band limiting filter 1802. A substantially linear change in phase response across the frequency range of interest equates to a constant group delay for the filter, which can be corrected easily with a delay or interpolation later in the system.

In an electricity-measurement system, for example a domestic or industrial utility meter, both the voltage and current are measured to calculate total energy/power consumption. It may therefore be important that the phase-relationship between the voltage and current is known. By measuring the current using, for example, a Rogowski coil 2, and setting the corner frequency of the integrator 1602 or band limiting filter 1802 coupled to the coil such that it is well outside the frequency range of interest, any relative phase shift between the measured voltage and current signals that is introduced by the current and voltage measurement circuits may be compensated for in a simple manner if the overall group delay of each of the current and voltage measurement circuits is substantially constant. In the examples of FIGS. 16 and 18, the analog integrator 1602 or analog band limiting filter 1802 both have a substantially constant group delay by virtue of their corner frequencies being well outside of the frequency range of interest, which helps in achieving a substantially constant group delay of the system 1600 and 1800 as a whole.

Figure 22:
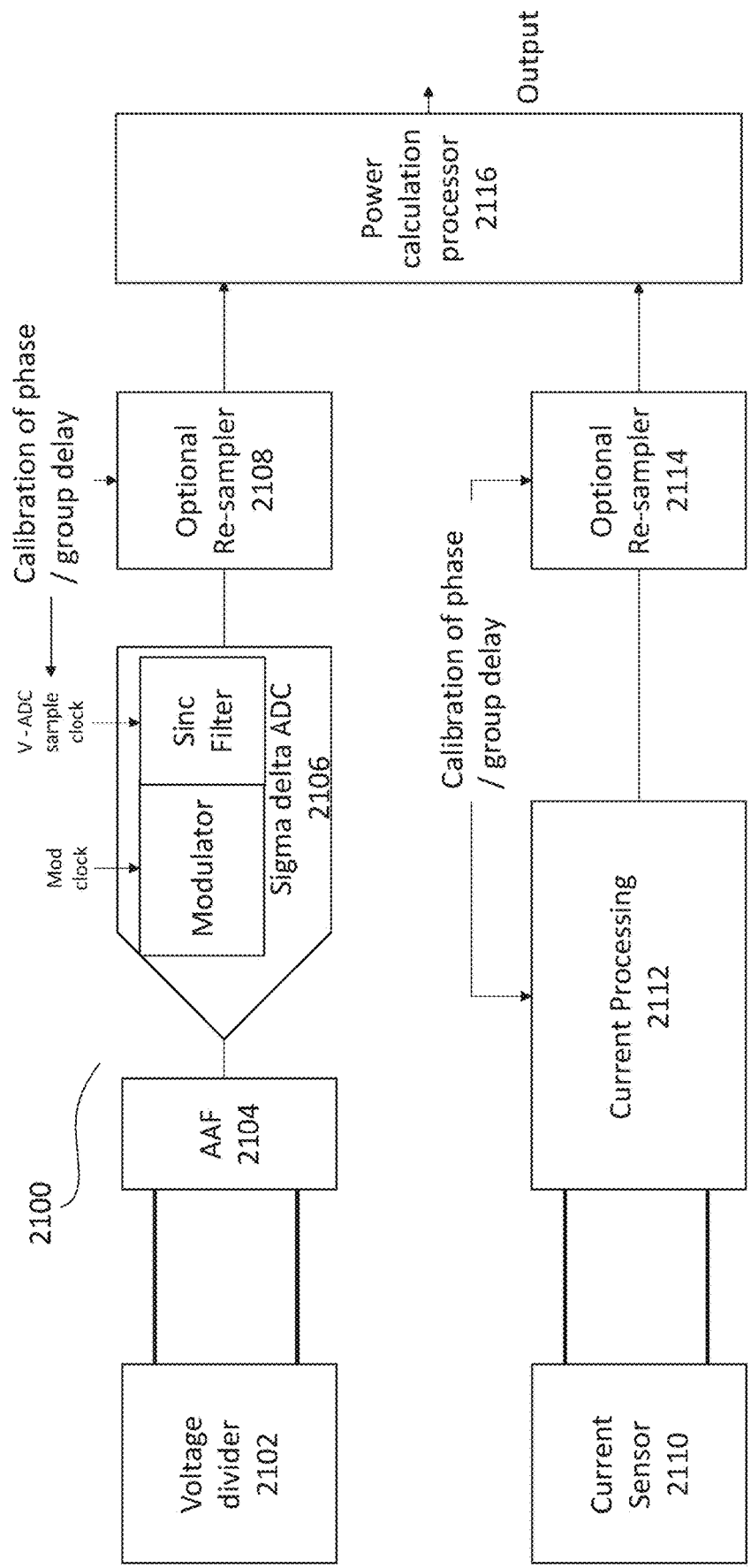
FIG. 22 shows a power calculation system.

FIG. 22 shows a system 2100 which allows power calculations to performed. The system 2100 includes both a voltage path and a current path, where the voltage path is configured to determine the voltage under test and the current path determines the current under test.

The voltage path includes a voltage divider 2102, or any means suitable for measuring a voltage. The output of the voltage divider 2102 is provided to an anti-aliasing filter 2104, which limits the bandwidth of the signal. The output of the anti-aliasing filter is provided to a sigma delta ADC 2106, or any other suitable ADC, and then to an optional re-sampler 2108. The output of the optional re-sampler is provided to a power calculation system or processor 2116.

The current path includes a current sensor 2110, for example a Rogowski coil as shown in FIG. 16 or 18. The output of the current sensor 2110 is provided to a current processing apparatus 2112. The current processing apparatus 2112 may include the system of FIG. 16, including analog integrator 1602, anti-aliasing filter 1604, ADC 1606 and digital filter 1608. Alternatively, the current processing apparatus 2112 may include the system of FIG. 18, including the band limiting filter 1802, anti-alias filter 1804, ADC 1806, digital integrator 1808 and digital filter 1810. The output of the current processing path is provided to an optional re-sampler 2114 and then to the power calculation system 2116.

Where the current processing system 2112 is the system shown in FIG. 16 or FIG. 18, the phase shift introduced by the system 2112 is substantially linear across the frequency region of interest, as shown in FIG. 20, meaning that the system 2112 has a substantially constant group delay across the range of interest. Assuming that the voltage path also has a substantially constant group delay across the range of interest, this allows calibration of the measured voltage and current signals to be simply performed, for example by effectively delaying one of the voltage or current signals by an amount that results in both signals experiencing the same group delay. Group delay may be calibrated either using the optional re-sampler 2108/2114 or through retiming the sampling of the ADC 2106. In cases of oversampling sigma delta converters this may be achieved with the granularity of the much higher frequency modulation clock by resetting the sinc filter (or other filter) to start at a different point in time.

When the corner frequency of the analog integrator/band-limiting filter is within the frequency range of interest, a non-constant group delay is introduced within the frequency range of interest (as the phase-shift across the frequency range is non-linear). However, the inventors have recognised that by configuring a system where the corner frequency of the analog filter (for example, the integrator or band-limiting filter) is within the frequency range of interest, the balance between preventing signal saturation and providing good SNR with finite dynamic range can be more finely controlled. Previously, systems which have an analog filter with a corner frequency below or above the frequency range of interest often have to set the corner frequency an order or magnitude outside of the frequency range of interest, which skews the system either towards very good saturation prevention but poor SNR (when the corner frequency is lower) or very poor saturation prevention but good SNR (when the corner frequency is higher).

Figure 23:
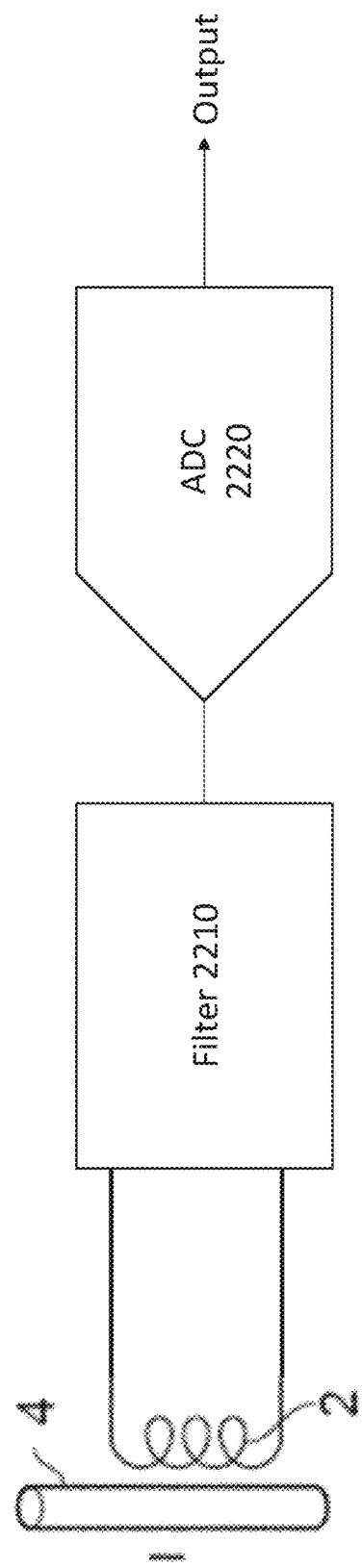
FIG. 23 shows an example current measurement system.
Figure 24:
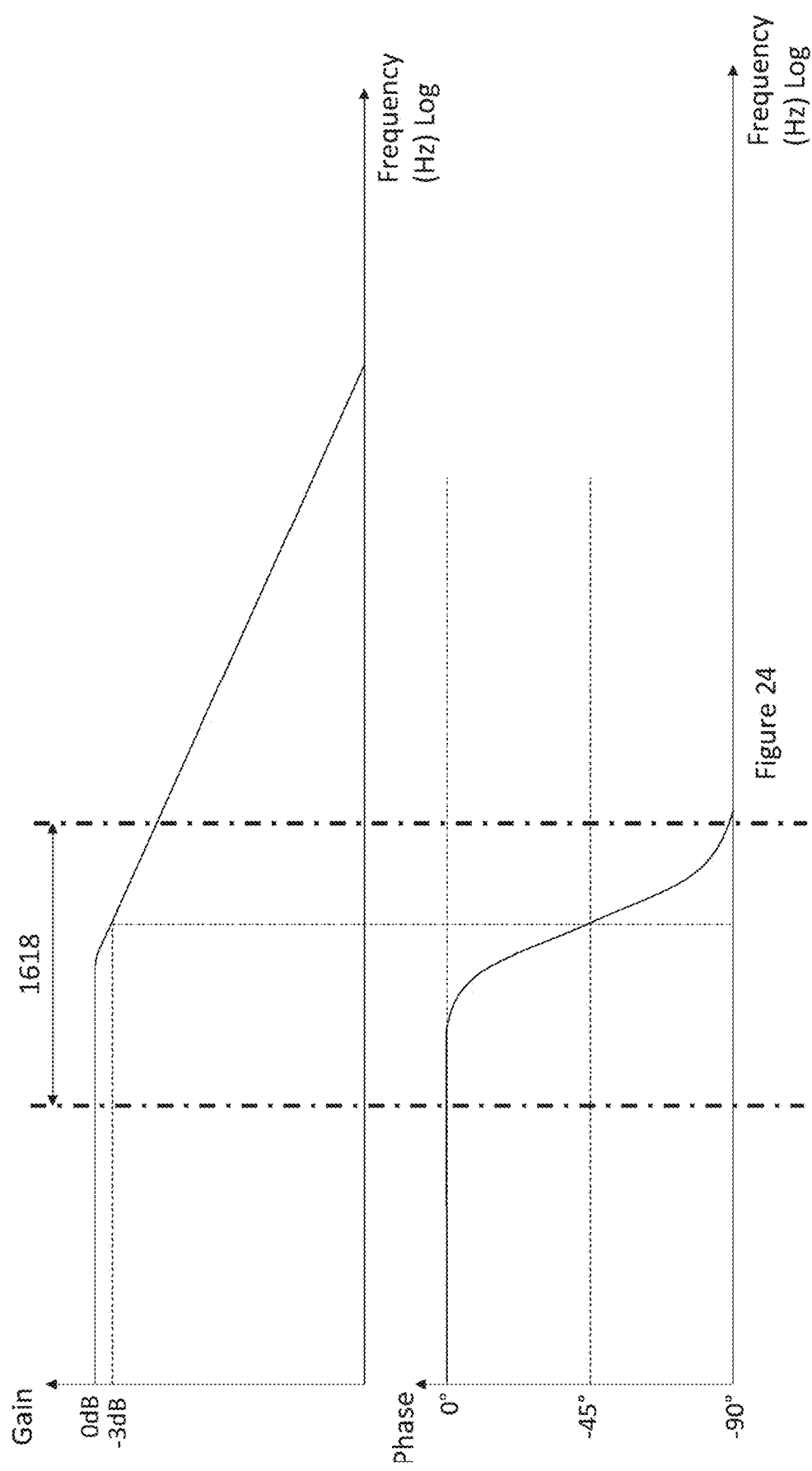
FIG. 24 shows a bode plot of the frequency response of the filter of the current measurement system of FIG. 23.

FIG. 23 shows a current measurement system including a current carrying conductor 4 and a Rogowski coil 2. Whilst the description from hereinafter refers to a Rogowski coil, a different type of current sensor/current transducer may be used in place of the Rogowski coil 2, for example, a current shunt. The output of the Rogowski coil 2 is provided to the input of a filter 2210 and then to an ADC 2220. The filter 2210 in this example is a low-pass filter, such as an integrator or band-limiting filter, but depending on the application it could alternatively be any other type of filter, such as a high-pass filterer. The filter 2010 in this example acts to prevent output saturation, and at least partially compensate for the frequency-magnitude response of the Rogowski coil 2 and to set the maximum output gain of the system. The apparatus of FIG. 23 may be configured such that the corner frequency of the filter 2210 is within the frequency range of interest of the system, as shown in FIG. 24. The filter 2210 may therefore be seen as a hybrid between a band-limiting filter and an analog integrator, having a corner frequency between the corner frequencies that are used for band-limiting filter and analog integrators.

FIG. 24 shows a frequency-gain and a frequency-phase plot of the response of the filter 2210. The frequency range of interest may be the predetermined frequency range within which the current measurement system is configured to measure the current I. For example, the corner frequency may be somewhere between the frequency of the fundamental signal being measured and the frequency of the maximum harmonic of interest. For AC mains systems, the fundamental may be 50 Hz or 60 Hz or 400 Hz for some applications, and there may be interest in information up to 100 harmonics (for power quality assessment) or up to, for example, 10 KHz, 20 KHz, 50 kHz for load disaggregation calculations, or even higher for circuit breaking applications. Therefore, the frequency ranges of interest may, for example, be 50 Hz to 5000 Hz, or 60 Hz to 60000 Hz, or 400 Hz, to 40 kHz, or 50 Hz to 10 kHz, or 50 Hz to 20 kHz, or 50 Hz to 50 kHz, or 50 Hz to 100 kHz, etc. Positioning the corner frequency within the frequency range of interest allows the balance between preventing output saturation and providing good SNR to be more finely controlled. However, as can be seen in FIG. 24, the phase shift introduced by the filter 2210 changes significantly across the frequency range of interest, such that it cannot be ignored when using the digital output measurement of current for calculating power measurements. Further, the phase shift introduced across the frequency range of interest 1618 is non-linear, resulting in a non-constant group delay across the frequency range of interest, which means that it cannot be corrected for using the techniques described with reference to FIG. 21. As well as the non-linear frequency-phase response, the frequency-magnitude response of the filter 2210 is non-linear within the frequency range of interest, such that the overall frequency-magnitude response of the Rogowski coil 2 combined with the filter 2210 is not constant or flat across the frequency range of interest.

Figure 25:
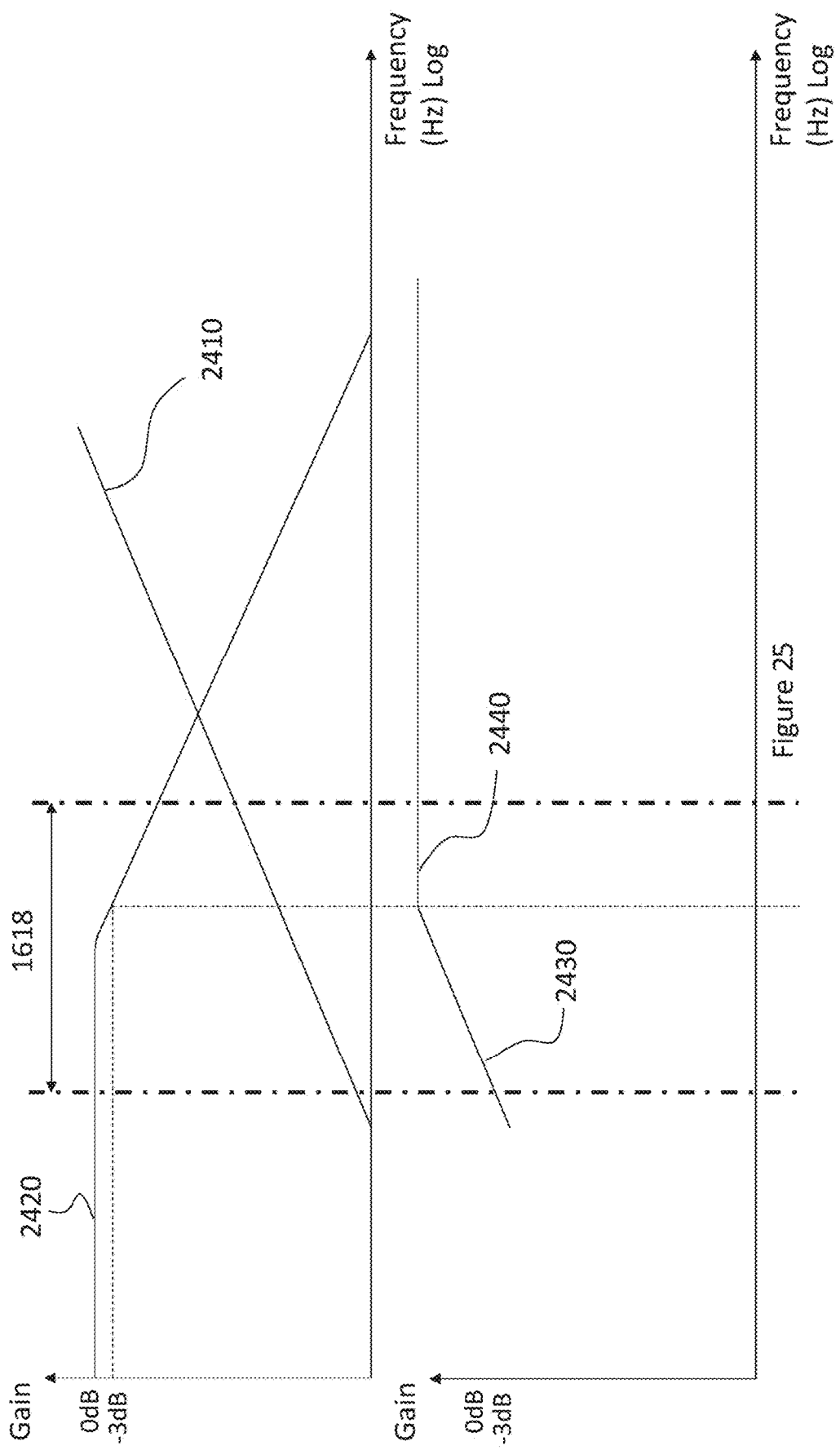
FIG. 25 shows a bode plot of the frequency response of the current transducer and the filter of the current measurement system of FIG. 23.

FIG. 25 shows the frequency-magnitude response 2410 of the Rogowski coil 2. As noted previously, the Rogowski coil 2 provides an increasing gain with frequency. The frequency-magnitude response 2420 of the filter 2210 includes a corner frequency within the frequency range of interest. The combined magnitude response of the Rogowski coil 2 and the integrator 2210 is shown on the lower plot of FIG. 25. For ease, the combined magnitude response may be considered in two parts, a first part 2430 below the corner frequency of the filter 2210 and a second part 2440 above the corner frequency of the filter 2210. Below the corner frequency, in the pass-band of the filter 2210, the combined magnitude response 2430 remains virtually the same as that of the Rogowski coil 2. Above the corner frequency, in the stop-band of the filter 2210, the filter 2210 acts to compensate for the increasing gain of the Rogowski coil 2 at high frequencies, providing a relatively constant or flat frequency-magnitude response 2440, helping in the challenges of fast di/dt handling.

It is therefore clear that providing filter 2210 including a corner frequency within the frequency range of interest 1618 leads to issues with both the phase response/group-delay of the system and with the magnitude response of the system. However, the inventors have recognised that there is a benefit of having a corner frequency for the filter within the frequency range of interest, compared with more traditional band limiting filters (such as that of FIG. 18). That benefit is that the system achieves a better balance between preventing signal saturation caused by fast di/dt signal and improving the SNR of the system.

Figure 26:
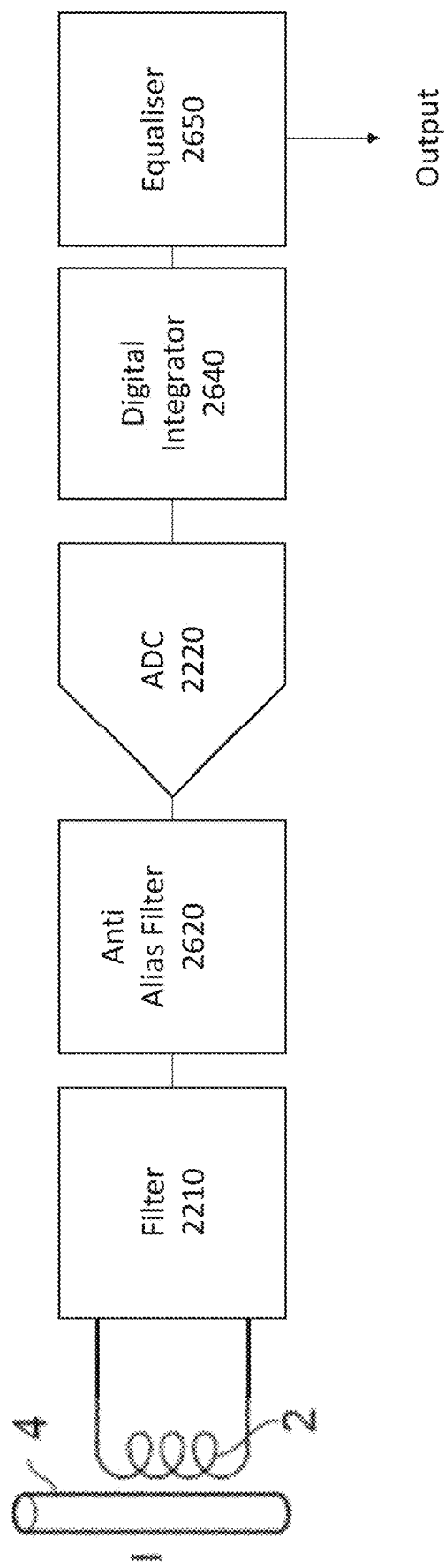
FIG. 26 shows an example current measurement system including a digital equaliser, in accordance with an aspect of this disclosure.

FIG. 26 shows a system in accordance with an aspect of the present disclosure which includes a digital equaliser 2650 along with the filter 2210 whose corner frequency may be in the band of interest as in FIG. 23. The equaliser 2650 may be configured to compensate fully or partially for at least one of: the phase response of the filter 2210 within the frequency range of interest; and/or the magnitude response of the filter 2210 within the frequency range of interest. The compensation of the equaliser 2650 can be to linearise the total phase response of the signal path such that in the frequency region of interest, the total group delay can be approximated with as been constant, or substantially constant, group delay. The equaliser 2650 may receive the filtered current measurement signal from the ADC 2220 via the digital integrator 2640 (although alternatively the order of the digital integrator 2640 and equaliser 2650 in the signal path may be swapped) and compensate for the phase response of filter 2210 through knowledge of the frequency response of the filter 2210. For example, where the filter 2210 is an RC filter (made up of a series resistor and a parallel capacitor), the equaliser 2650 may have knowledge of the component values of the RC filter and be configured to provide a partially inverted phase response within the frequency range of interest. For example, the equaliser 2650 may include a digital filter that effectively invokes different time delays to different frequency components within the measured signal (by way of non-limiting example, a first frequency component within the measured signal that experiences no phase shift from the filter 2210 may be delayed by the equaliser 2650 by an amount that causes a −180° phase shift. A second frequency component within the measured signal that experiences a −45° phase shift from the filter 2210 may be delayed by the equaliser 2650 by an amount that causes a 170° phase shift, such that the first and second frequency components are now aligned to have linear phase difference with frequency. This results in the combination of the filter 2210 and equaliser 2650 having constant, or substantially constant, group delay). Put another way, the equaliser 2650 may compensate for changes in the phase-response of the filter 2210 within the frequency range of interest by delaying each frequency component within the current measurement signal by an amount that is dependent on the frequency of the frequency component, such that all frequency components experience an approximately net linear phase shift and a near constant group delay across the frequency range of interest. Alternatively, the equaliser 2650 may receive a characterisation of the filter 2210, which may include either information as to the structure of the filter 2210 (for example, RC values if the filter is an RC low-pass filter) or information indicative of at least part the frequency response itself of the filter 2210 (for example, the frequency-phase response and/or the frequency-magnitude response of the filter 2210 over the frequency range of interest, and/or information as to the corner frequency of the filter 2210, since this defines the point in which equalisation is required).

FIG. 26 also shows an optional anti-alias filter 2620, which operates as described earlier with respect to FIG. 18. The ADC 2220 converts the analog output signal of the filter 2210 to a digital signal, providing the digital signal to a digital integrator 2640. The digital integrator may be non-ideal and include a corner frequency below the frequency range of interest 1618. The equaliser 2650 may be configured to compensate for at least one of: the phase response of the low-pass filter within the frequency range of interest; and/or the combined magnitude response of the Rogowski coil 2 and the integrator 2610 below the corner frequency point of digital integrator 2630. It may also compensate partially the response of the ADC including the SINC filter as may be the case in an oversampling converter.

The equaliser 2650 may be configured such that it provides a phase response which, when combined with the phase response of the filter 2210, is linear within the frequency region of interest 1618. The combined response may include a substantially linear phase shift over the frequency range of interest 1618, resulting in a substantially fixed or constant group delay (which is simple to compensate for). The term 'substantially' linear phase response and 'substantially' flat or constant group delay is intended to mean that the phase response and group delay, across the frequency range of interest, are respectively sufficiently linear and constant to meet measurement accuracy requirements for the measurement system when a compensating for group delay with respect to other measurement channels (for example, the voltage measurement channel) is accounted for. Put another away, it means that any non-linearities in the phase response across the frequency range of interest (and correspondingly any changes in the group delay across the frequency range of interest), caused by the analog filter 2210, are reduced to a degree that means minimum measurement accuracy requirements can be met (for example, current measurement accuracy requirements, or power/energy measurement accuracy requirements when the current measurement system is part of a power/energy measurement device).

The equaliser 2650 compensates (or reduces/removes/corrects) the effects of the phase response of the filter 2210. The equaliser 2650 may delay the received signal by a differing amount for each different frequency component within the signal, such that the phase shift is substantially linear across the frequency range of interest 1618. The equaliser 2650 may additionally or alternatively be configured to provide a magnitude response that compensates (or reduces/removes/corrects) for changes in the combined magnitude/gain response of the other blocks in the signal chain (i.e., the current sensor 2, the filter 2210 and any other signal processing blocks that may be present).

The response provided by the equaliser 2650 to compensate for changes in the magnitude and/or phase response across the frequency range of interest may depend on a characterisation of the filter 2210. An example of a characterisation of the filter 2210 is a determination of the breakpoint or corner frequency of the filter 2210. From this, it may be possible to configure the equaliser 2650 to apply magnitude and/or phase compensation that is appropriate dependent on the frequency of the signal passing through the measurement system. The filter 2210 may be characterised at the time of manufacturing, and the equaliser 2650 configured during manufacturing based on this characterisation.

Figure 27:
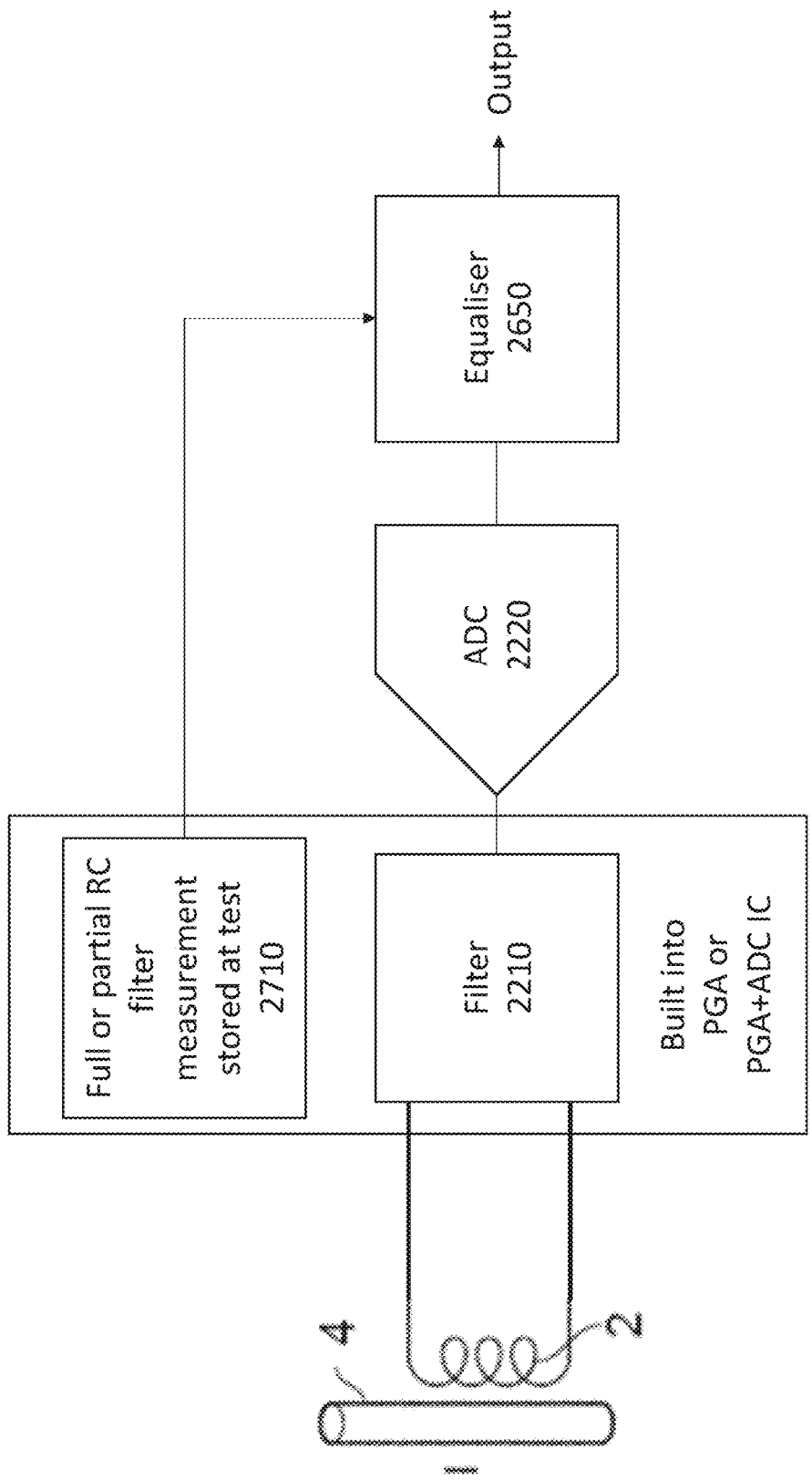
FIG. 27 shows a current measurement system including a measurement of characteristics of the analog filter of FIG. 26.

FIG. 27 shows a further current measurement system in accordance with an aspect of the present disclosure. It is similar to that of FIG. 26, but a full or partial measurement of the characteristics of the RC filter which makes up the filter 2210 is supplied to the equaliser 2650. This measurement value may be stored on the same integrated circuit as the filter 2210, for example it may be built into the same programmable gain amplifier IC, or into a programmable gain amplifier and ADC integrated circuit. Alternatively, it may be stored in any other suitable way, for example within a memory unit. The measurement value may be obtained by providing a test signal to the filter 2210 and observing the output of the filter 2210 during the initial configuration/calibration of the system. FIG. 27 does not include a representation of a digital integrator for the sake of simplicity, but one may be included as represented in FIG. 26.

Whilst it may be beneficial to provide a system with a stored characterisation of the filter 2210, it may also be beneficial to provide a system which allows the characterisation to be updated over time, so that the equalisation can be adjusted as the values of the components which make up the filter 2210 drift.

As shown in FIG. 5, drift in the component values over time, or variance between the components which make up different low-pass filters, can cause the corner frequency of the filter to change or differ. Where the system is configured such that the corner frequency is an order of magnitude below the frequency region of interest, this can add a fixed offset to the combined signal of the Rogowski coil 2 and the low-pass filter. However, changes in the phase response, which is centred on the corner frequency, have little effect as they are outside the frequency range of interest. Where the corner frequency is within the region of interest, the effect of a moving corner frequency caused by component drift is accentuated, as it changes the phase response of the system within the frequency range of interest, it changes the point at which the filter 2210 starts to compensate for the magnitude response of the coil 2 and it changes the magnitude of the gain offset for signal frequencies that are close to or exceed the breakpoint of the filter 2210.

Figure 28:
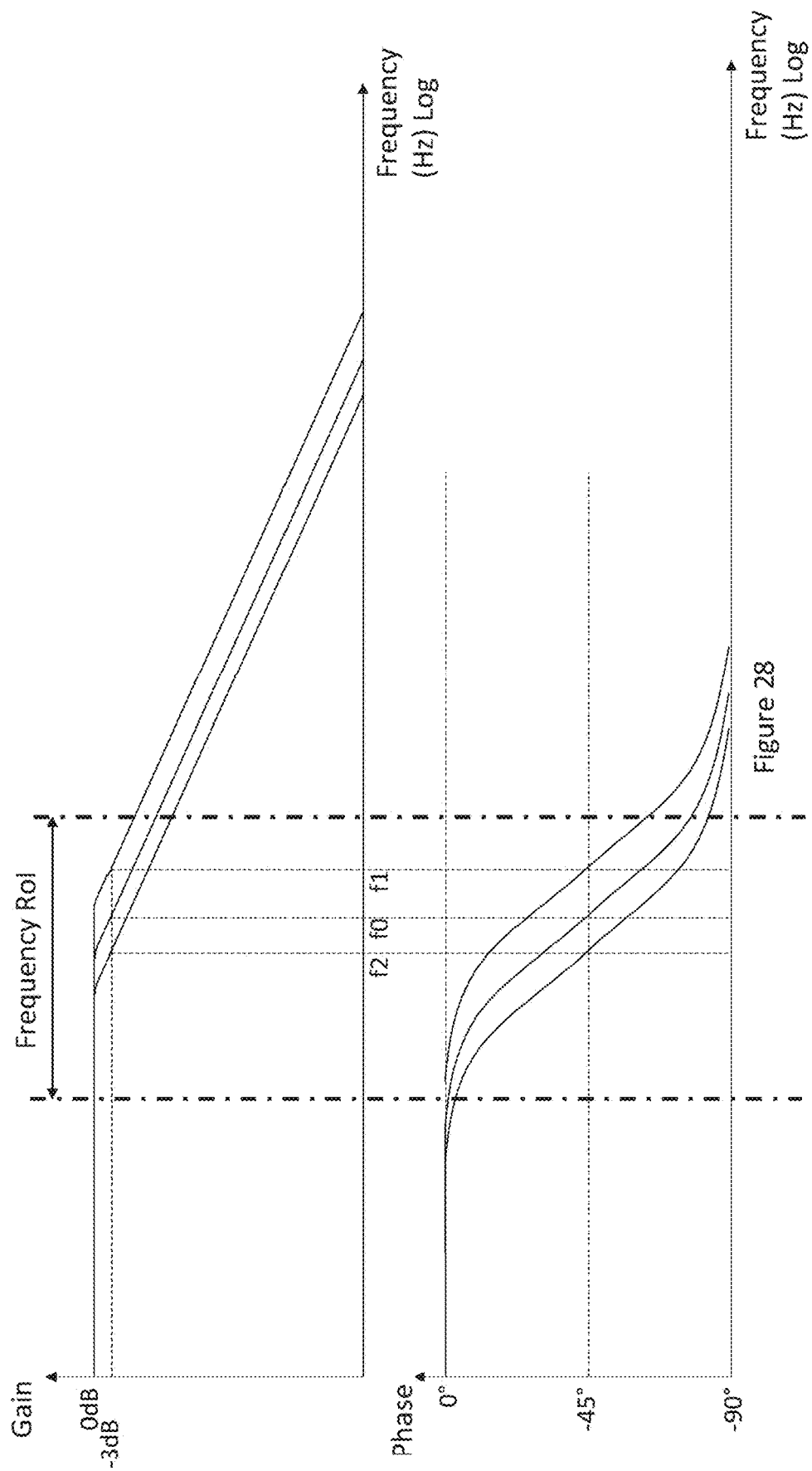
FIG. 28 shows a bode plot of a possible change in frequency response of the analog filter of FIG. 26.

FIG. 28 shows examples of the corner frequency of the filter 2210 at three different frequencies. Component drift over time may cause the corner frequency to drift from one of these frequencies to another. This results in three different phase responses which occur within the frequency region of interest, as well as the gain response issues described earlier in this disclosure.

The different corner frequency/filter characteristics shown in FIG. 28 are also present in the characteristics of different filters at the time of manufacture. For example, a first filter may have a corner frequency of f0, whilst a second filter may have a corner frequency of f1 due to manufacturing variations. If all current measurement systems received the same equalisation, they would not correctly equalise the different responses.

Figure 29:
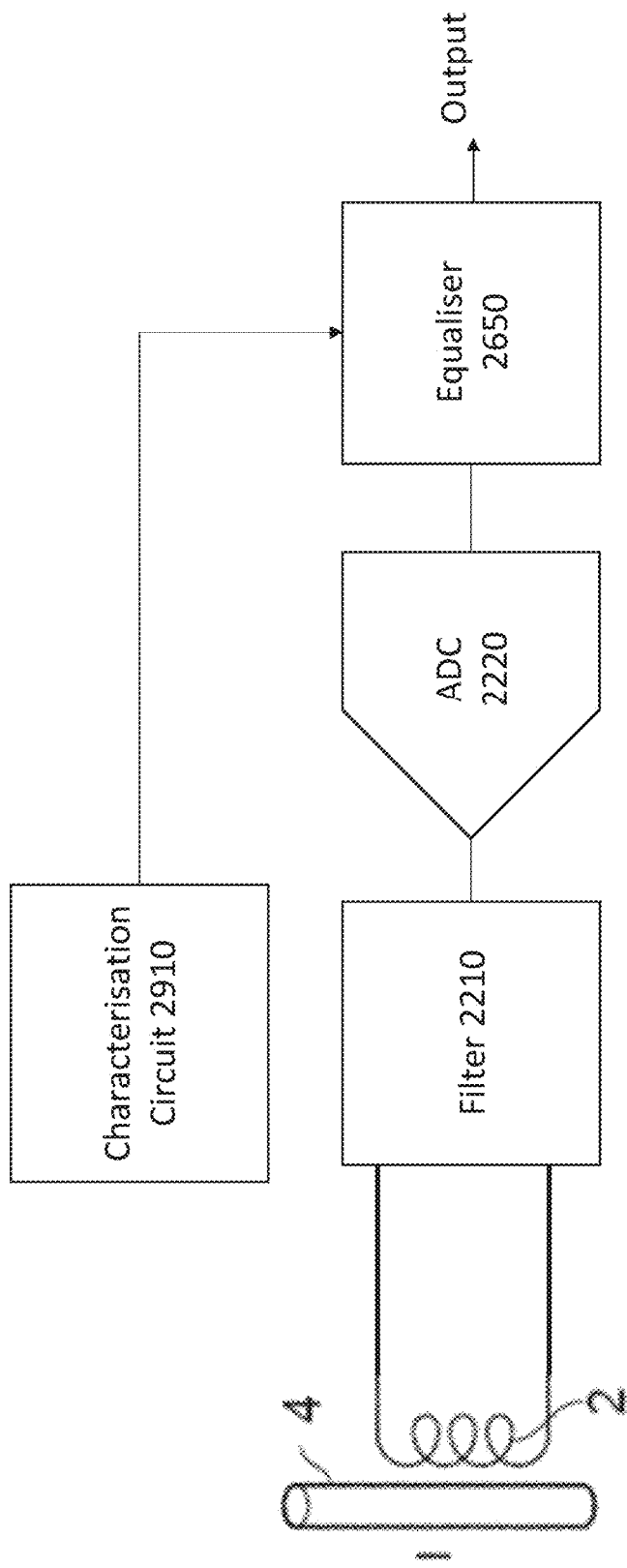
FIG. 29 shows an example current measurement system including filter characterisation, in accordance with a further aspect of this disclosure.

To overcome this problem, the equaliser 2650 may be configured to periodically or intermittently update the equalisation that it provides, through characterisation of the filter 2210 using a characterisation circuit 2910 as shown in FIG. 29. FIG. 29 does not include a representation of a digital integrator for the sake of simplicity, but one may be included as represented in FIG. 26. The characterisation circuit 2910 may be configured to characterise the frequency response of the filter 2210 and output this characterisation to the equaliser 2650. This characterisation of the filter 2210 may be performed using the method and/or circuits described in the above description. For example, characterisation may be performed using the method and/or circuits with respect to FIG. 9, where if the filter 2210 comprises an RC circuit, a characterisation circuit 100 comprises copies of the capacitor 72 and the resistor 70, for example three replica capacitors 72a, 72b and 72c and three replica resistors 70a, 70b and 70c arranged to introduce phase shifts within a feedback loop of an operational amplifier 102. This forms a self-sustaining oscillator within the characterisation circuit, which has a frequency which is reliably related to the RC time constant of the capacitors 72 and resistors 70 within the filter. From the RC time constant, the frequency response (i.e., the frequency-magnitude response and the frequency-phase response of the filter 2210) may be determined, and the equaliser 2650 configured to reduce the undesirable effects of the filter 2210 within the frequency region of interest. This technique is effectively targeting a matched replica of the components used to make the filter 2210. If one component type is particularly stable, it may also be possible to only track and change the other component to deliver acceptable compensation.

Alternatively, the characterisation may take the form of the system of FIG. 11, which shows an oscillator circuit where a resistor 210 and a capacitor 220 are provided in a feedback loop around a Schmidt inverter 230 so as to form an oscillator. It should be appreciated that FIGS. 9 and 11 represent two non-limiting examples of how the characterisation circuit 2910 may be implemented, and that it may be implemented in any other way that enables the characterization of filter 2210 (for example, the identification of the corner frequency of the filter 2210, using which the frequency response of the filter 2210 can be determined).

Once the system has determined the frequency response characterisation of the filter 2210, a gain and/or phase correction may be applied using the equalisation circuit 2650. Thus, supposing that the RC component as measured by the characterisation circuit 2910 drifted upwardly by 1% as a result of ambient or other temperature change, and that corresponded to the measured output being X % higher for at least some frequencies of the current signal being measured, then a corresponding attenuation at those frequencies can be introduced into the signal chain by the equaliser 2650 to compensate for the RC drift. Similarly, the phase equalisation can be adjusted. Whilst the filter 2210 is described here as being comprised of resistors and capacitors (i.e., RC filters), the filter components may alternatively be inductors and capacitors (i.e., LC filters). Likewise, the corresponding tracking components within the characterisation circuit 2910 may include any one or more of: a matched resistor, a matched capacitor, a matched inductor.

The characterisation of the filter 2210 may take place during a start-up phase of the system, rather than continuously whilst the system is operating, with the frequency response of the equaliser 2650 being updated at that time. Alternatively, the characterisation of the filter 2210 may take place periodically or intermittently during system operation, with the frequency response of the equaliser 2650 being updated with each new characterisation. Alternatively, the characterisation may take place during manufacturing or before the system begins operation and the frequency response of the equaliser 2650 be fixed from that point onwards. Providing a system which considers the filter characterisation at start-up may reduce power consumption compared to a system where the filter 2210 is continuously characterised throughout operation of the system. Where the characterisation is updated by a characterisation circuit 2910, the equaliser 2650 may be configured to modify the compensation of the phase response and/or the magnitude response based on the characterisation.

Optionally, where characterisation takes place periodically or intermittently, the characterisation may be compared against a previously stored characterisation (for example, stored as part of the LUT 3010 or elsewhere). The previously stored characterisation could at the be the characterisation time of device manufacture/calibration, or the most recent previous characterisation, or a running or windowed average of previous characterisations. If the difference is greater than a predetermined threshold amount, an error flag may be set, indicating that there may be an error in the system, for example as a result of current sensor tampering. That error flag may be output from the measurement system to any other suitable entity for further investigation.

Figure 30:
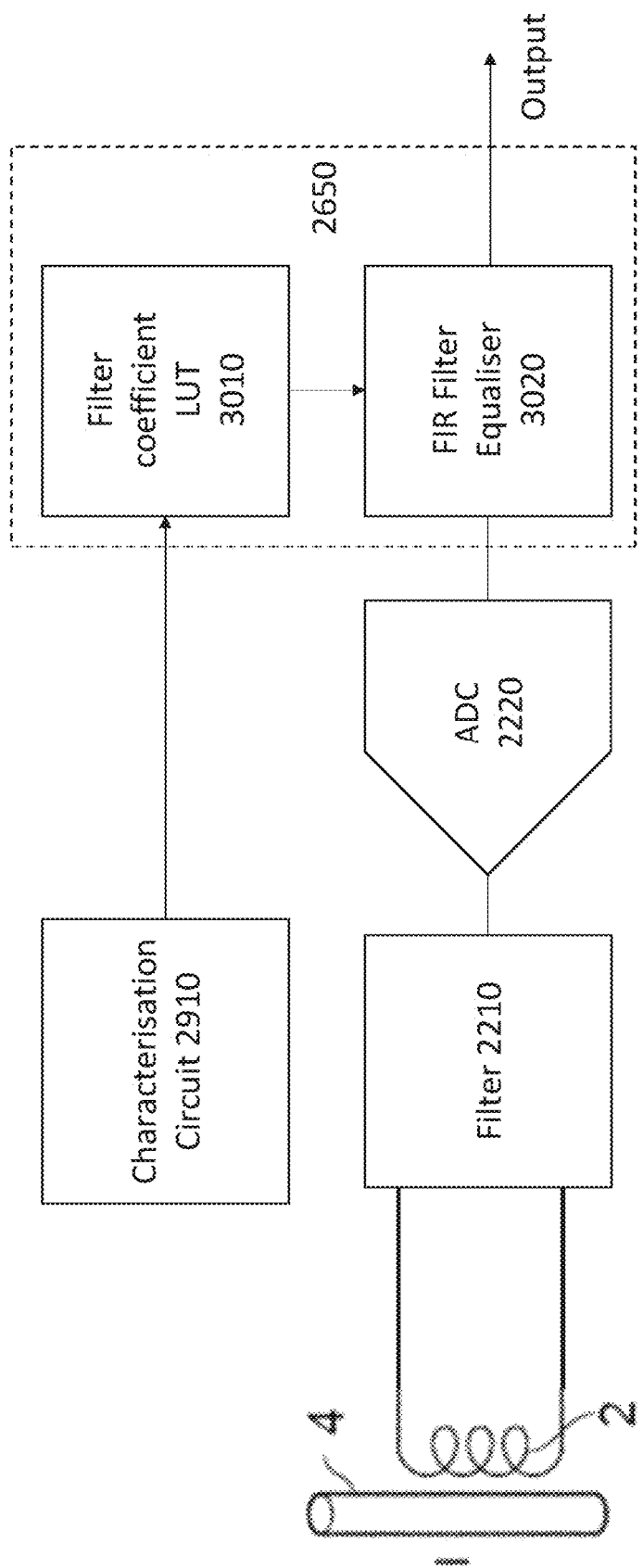
FIG. 30 shows an example current measurement system including a filter characterisation look-up table, in accordance with a further aspect of this disclosure.

FIG. 30 shows an example of how the digital equaliser 2520 may be implemented. The equaliser 2650 may be a digital component comprising a filter coefficient look-up table (LUT) 3010, where knowledge of the RC values or characterisation of the filter 2210 may be used to find within the LUT 3010 to settings for the FIR filter equaliser 3020 that should compensate for the combined phase and/or magnitude response of the other components in the signal path. The filter coefficient LUT 3010 may provide coefficients to the FIR filter equaliser 3020 to set the characteristics of the FIR filter 3020 to provide an appropriate equalisation of the signal passing through the FIR filter 3020. The FIR filter 3020 may have 2, 3, 4, 5 or more taps and the FIR filter 3020 may be made as an asymmetric FIR filter, allowing it to compensate for non-linear phase-delay distortion introduced by the filter 2210. Whilst FIG. 30 shows a FIR filter 3020, the digital filter 2650 may alternatively be an IIR filter. However, FIR filters advantageously have no stability issues and fixed-point requirements are simpler to design and implement. The use of a LUT 3010 may allow minimal taps to be used for the FIR filter 3020, and the contents of the LUT 3010 may be generated by optimisers that search for the best solution for a given quantised measure of filter breakpoint, without needing to calculate the coefficients for each point through a coherent equation. This, although only have a finite number of perfect solutions, may lead to an acceptable trade-off between the degree of phase linearity and amplitude flatness performance achievable and cost of implementation. FIG. 30 does not include a representation of a digital integrator for the sake of simplicity, but one may be included as represented in FIG. 26.

Figure 31:
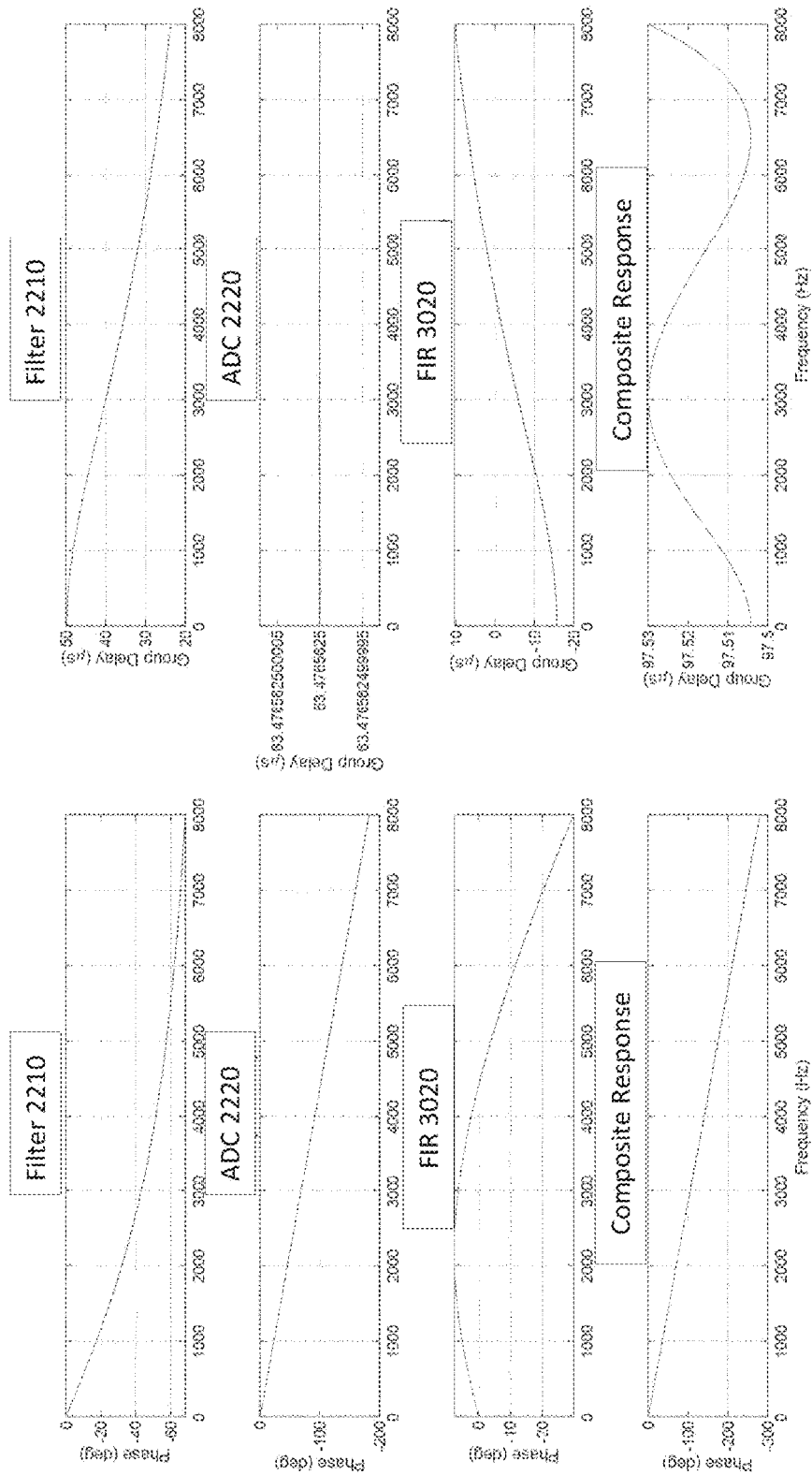
FIG. 31 shows the phase and group delay compensation provided by an equaliser.

FIG. 31 shows an example of the phase and group delay of the system of FIG. 30, including the filter 2210, the ADC 2220 and the FIR filter 3020 acting as an equaliser. The system is arranged to compensate for the phase and group delay across a frequency range of interest of 0 and 8000 Hz. However, this range should be considered as merely one non-limiting example, and the frequency range of interest may instead be any other range, for example 10-1000 Hz, 10-2000 Hz, 20-3000 Hz, 20-4000 Hz, 250-6000 Hz, 10-8000 Hz, 20-10000, 20-16000 Hz, etc. The band of interest for AC systems may go from below the fundamental frequency (for example, 50 or 60 Hz) to close to the bandwidth of the digitiser used, for example the 3 dB point of the sigma delta converter SINC filter that might digitise the signal. For applications like motor control or circuit breaking, the frequency band of interest, for example, could be much higher between, say, 10-1000 KHz.

The graphs in the first three rows of FIG. 31 show the effect of the filter 2210, ADC 2220 and FIR filter 3020 respectively. The final row shows the composite, or combined, response of the filter 2510, ADC 2530 and FIR filter 3020, which together make up the signal path/chain. As can be seen, the filter 2210 introduces a large amount of phase shift (60° over the frequency range of interest) and group delay (25 us over the frequency range of interest). Further, both the phase shift and group delay of the filter 2210 are non-linear within the frequency range of interest 1618. The ADC 2220 introduces no significant change in group delay within the frequency range of interest, but does introduce a linear phase shift over the frequency range of interest.

The FIR filter 3020 is configured to have a phase response over the frequency range of interest that results in the combined have response of the whole signal chain having a substantially linear phase response over the frequency range of interest. This results in the combined group delay of the analog filter 2210 and the FIR filter 3020 (and any other circuits/units within the signal chain, such as the ADC and/or anti-alias filter and/or digital integrator and/or any amplification stages) being substantially fixed or constant over the frequency range of interest. This is represented in FIG. 31 by the final row, 'composite response', which shows the phase response and group delay of all circuits/units within the signal path. Whilst the composite response for group delay shows an oscillating or varying signal, this is within a significantly smaller range (approximately 0.03 us over the frequency range of interest, which may be considered to be substantially constant) compared to the group delay introduced by the analog filter 2210 (approximately 35 us over the frequency range of interest). The FIR filter 3020 acts to significantly reduce the change in group delay over the frequency range of interest, and the group delay in the composite response (the output of the current measurement apparatus) may therefore be considered substantially constant. By substantially constant, we mean that the remaining change in group delay within the frequency range of interest is within reasonable operational parameters for the apparatus, for example, it enables current and/or energy measurements to be calculated within defined accuracy limits. For example, substantially constant may be constant to within 10%, 5%, 1%, 0.1%, 0.01%, or 0.001% of the total group delay at the output of the apparatus. The resulting average compensated group delay can be further corrected relative to other channels within a full energy measurement system or a multi-phase measurement system by applying a delay to one or more measurement channels relative to each other and/or interpolating between sample points.

The FIR filter 3020 may include a number of taps, for example 3, 4, 5 or more filter taps. The LUT 3010 may store coefficients/settings for these taps.

Implementing an equaliser 2650 using a LUT 3010 may limit the equalisation that may be provided to quantised best fit points. In particular, the LUT 3010 may store a finite number of filter coefficients for the FIR 3020, corresponding to a finite number of characterisations of the analog filter 2210. Those settings may be determined, for example, through an optimisation process for each target filter corner frequency with desired min/max group delay and acceptable amplitude degradation. Those FIR filter coefficients may then be stored in the LUT 3010 against the particular analog filter 2210 characterisation and the process repeated for another analog filter 2210 characterisation. Alternatively, the FIR filter settings stored in the LUT 3010 may be determined using any other suitable technique, for example empirical measurements and iteration on example RC filters, etc.

Figure 32:
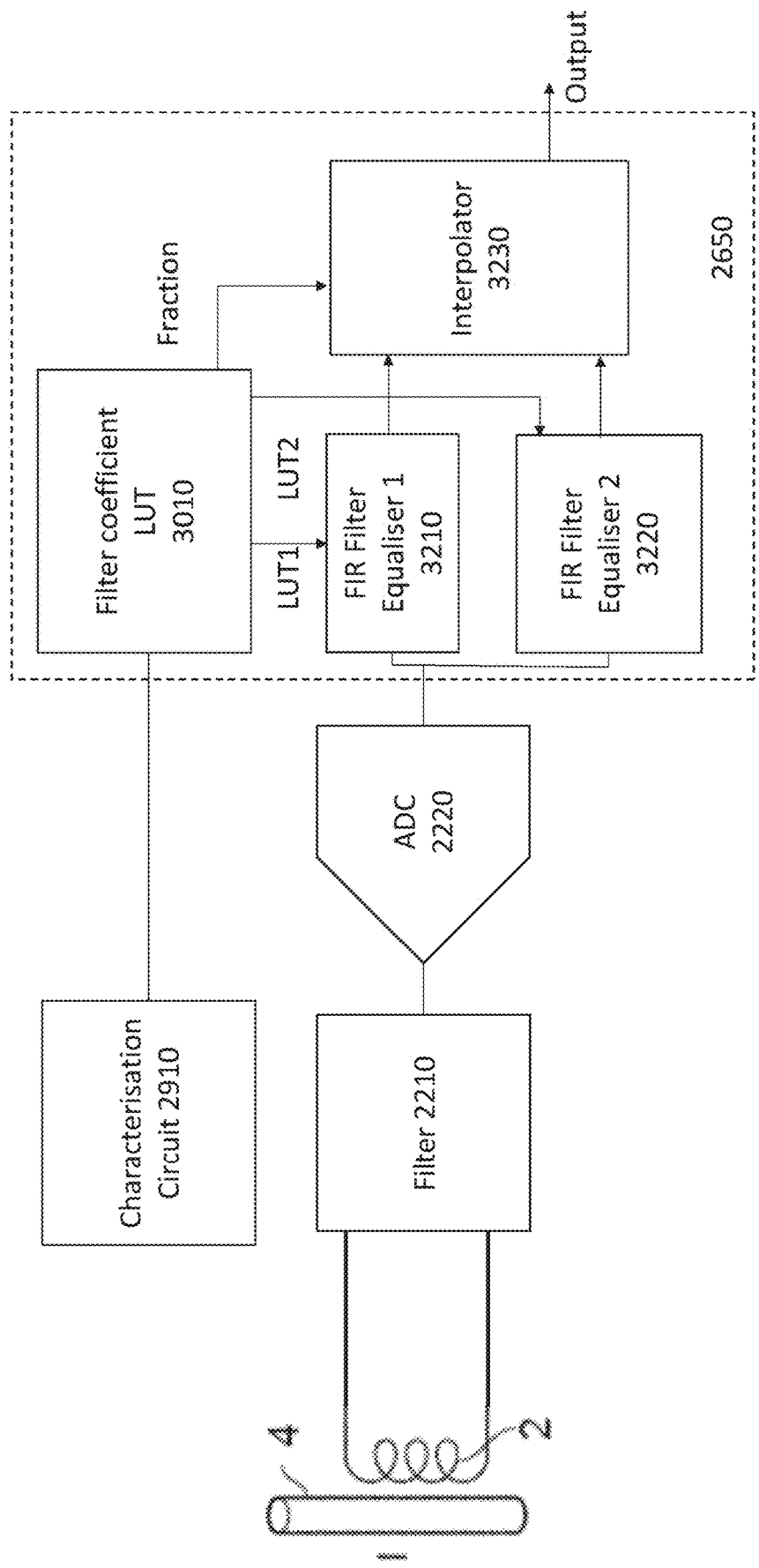
FIG. 32 shows a current measurement system including multiple FIR filters, in accordance with a further aspect of this disclosure.

FIG. 32 shows a representation of a further aspect of this disclosure. In this system, the equaliser 2650 includes two FIR equalisers, 3210 and 3220. LUT 3010 provides coefficients to the first FIR equaliser 3210 and the second FIR equaliser 3220. An interpolator 3230 interpolates the outputs of the first and second FIR equalisers 3210, 3220 based on an instruction from the filter coefficient LUT 3010. The LUT 3010 may provide the interpolator 3230 with coefficients relating to the how the interpolator 3230 should operate, for example what fraction the output of each of the equaliser 3210, 3220 makes up of the overall output of the equaliser 2650. This allows for partial equalisation, which is between the two best fits and may improve the number of solutions that need to be found and used. For example, the characterisation received by the equaliser 2650 from the characterisation circuit 2710 may be between two filter characterisations stored in the LUT 3010. The equaliser 2650 may select the FIR filter coefficients corresponding to the two nearest filter characterisations stored in the LUT 3010. One of those sets of filter coefficients may be used to set FIR equaliser 1 3210 and the other of those sets of filter coefficients may be used to set the FIR equaliser 2 3220. The relative fractions applied by the interpolator 3230 may correspond to the relative proximity of the two filter characterisation received from the characterisation circuit 2710 to the two nearest filter characterisations stored in the LUT 3010. Extrapolation could also be used to estimate a response outside the two filters.

Figure 33:
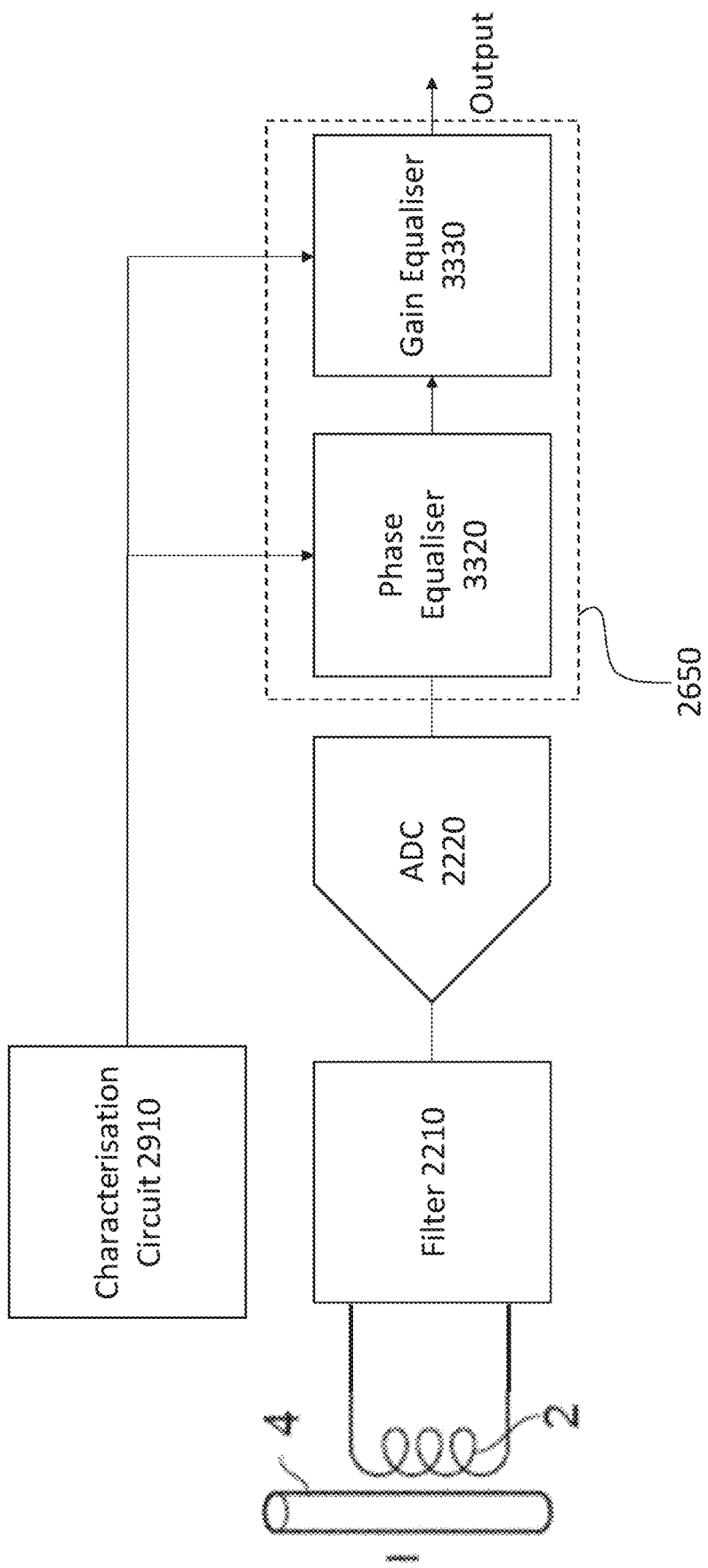
FIG. 33 shows an example current measurement system including separate phase and gain equalisation, in accordance with a further aspect of this disclosure.

To simplify the equalisation required, phase and magnitude compensation may be provided by two distinct digital equalisers. For example, FIG. 33 shows a system in which equaliser 26500 comprises a phase equaliser 3320 and a gain equaliser 3330. The phase equaliser 3320 may be configured to compensate for the phase shift in the frequency region of interest 1618, providing a variable delay dependent on the signal frequency. To simplify operations, the phase equaliser 3320 may be configured such that it provides a known phase response, but may also introduce a new/different magnitude response. The gain equaliser 3330 may be configured to equalise the combined magnitude response of the Rogowski coil 2, the filter 2210 and the phase equaliser 3320. The phase equaliser 3320 is represented as preceding the gain equaliser 3330 in the signal chain, however they may alternatively be positioned the other way around. It may be that each equaliser alters a partial amount phase and magnitude.

Furthermore, the phase equaliser 3320 and/or gain equaliser 3330 may each be formed from one or more different filters that together have the desired phase and/or gain compensation characteristics. In this way, it might be possible to correct more accurately for non-linearities or non-idealities in the frequency response of the system, for example for non-linearities or non-idealities in the frequency-magnitude response of the filter 2210 around the corner frequency. Furthermore, some filters may contribute to at least some phase and gain compensation, while others may contribute only to phase or gain compensation.

The filter characterisation circuit 2910, the filter 2210, the ADC 2220 and the equaliser 20 may together form an apparatus/system for coupling to a current sensor/transducer, such as a Rogowski coil or air-cored current transformer. The circuits/units of the apparatus/system may all be formed on the same IC, formed on different ICs and coupled together, or formed using discrete components mounted on a PCB, etc. The apparatus and a Rogowski coil or air-cored current transformer may be coupled together to form a system for measuring current.

Figure 34:
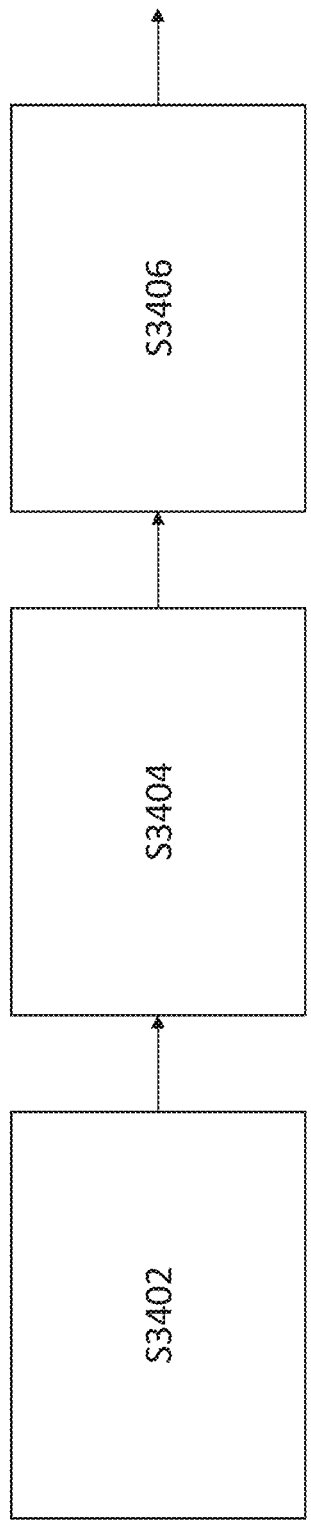
FIG. 34 shows an example set of process steps in accordance with a further aspect of this disclosure.

A method for providing measurement of currents within a predetermined frequency range is shown in FIG. 34. Step S3402 includes filtering, using an analog filter with at least part of its transition band within the predetermined frequency range, a current measurement signal output by a current sensor to generate a filtered current measurement signal. The filtered current measurement signal is received by an analog to digital converter, and at step S3404 the filtered current measurement signal is converted, using the analog to digital converter, to a digital measurement signal. The digital measurement signal is received by an equaliser, and at step S306 the digital equaliser equalises the digital measurement signal using a characterisation of the analog filter. Equalising the digital measurement signal comprises compensating for changes in a group delay of the analog filter across the pre-determined frequency range and/or compensating for changes in a combined magnitude response of the current sensor and the analog filter across the predetermined frequency range. A compensated current measurement signal is output by the equaliser at the end of step S406.

Figure 35:
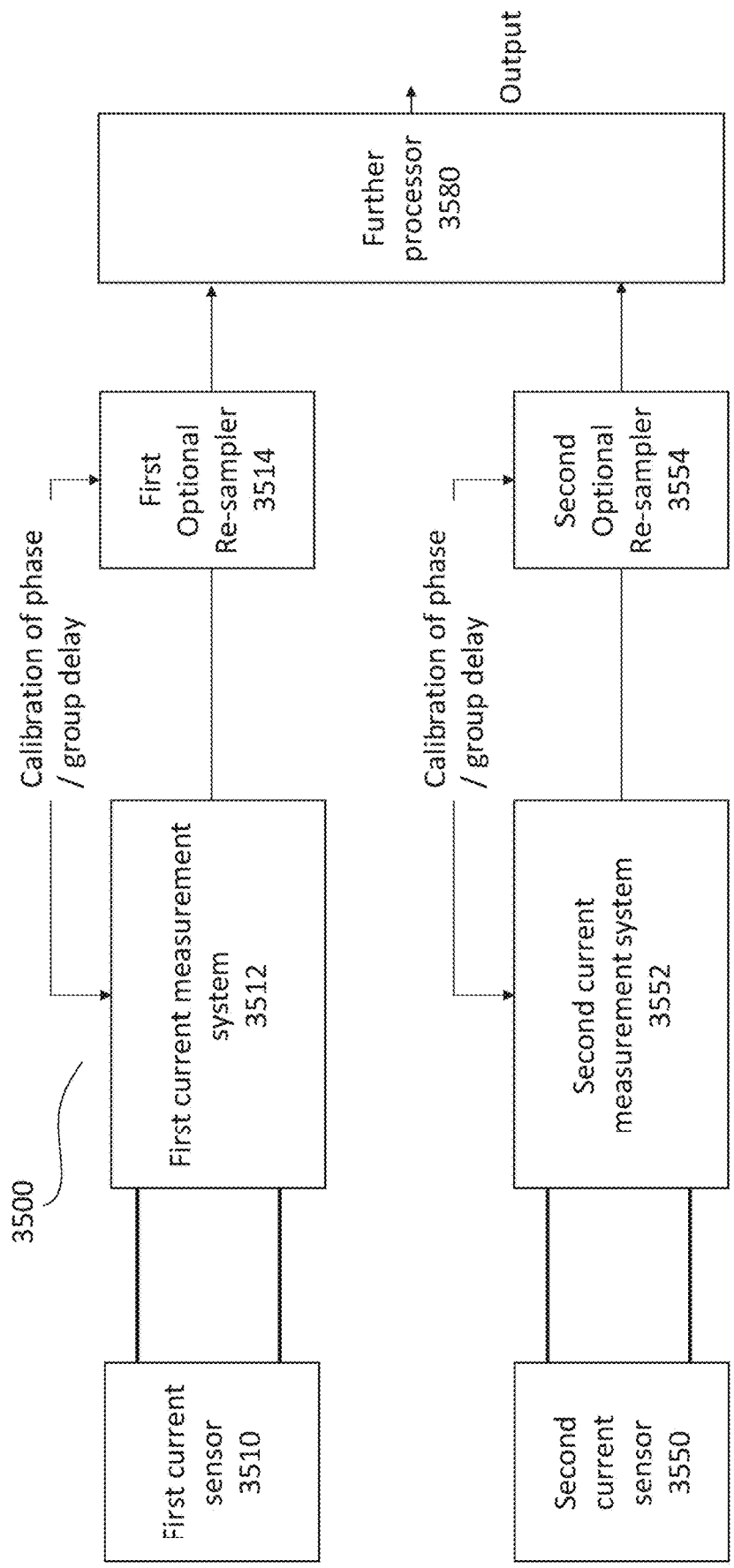
FIG. 35 shows an example multi-phase current measurement system in accordance with a further aspect of this disclosure.

FIG. 35 shows an example implementation of a multi-phase current measurement system. In this example, two phases of current measurement are shown in the figure-a first phase and a second phase. However, there may be any number of different phases measured—for example the measurement may be in relation to a three phase power supply. In this example, the first current sensor 3510 and the first current measurement system 3512 are each implemented in any of the ways described with reference to FIGS. 26 to 34 in order to measure the first phase current. The second current sensor 3550 and the second current measurement system 3552 are each implemented in any of the ways described with reference to FIGS. 26 to 34 in order to measure the second phase current. Relative group delay calibration is then performed in the same way as described with reference to FIG. 22. In particular, since the group delay of each of the first current measurement signal path and the second current measurement signal path are substantially constant in the frequency range of interest, the two group delays may be made substantially equal by applying a further delay to one or more of the measured signals, thereby aligning the measured signals. The further processor 3580 may then perform any desired further processing on the aligned measured signals, for example energy/power calculations if voltage is also being measured (not shown in FIG. 35 for simplicity).

Further, the system according to any one of FIGS. 26 to 33 may be implemented in the current processing path 2112 of the power calculation system according to FIG. 21. Beneficially, as the digital equaliser results in the signal path having a substantially constant group delay, the voltage and current paths may be aligned in the same way as in FIG. 21, by introducing an additional delay into the voltage and/or current measurement paths, such that that the output of the voltage and the current path have substantially the same group delay, meaning that the signals are substantially aligned.

The techniques discussed herein are applicable to components formed in integrated circuits where components can be matched with great accuracy. The techniques can also be applied to discrete components, but some form of preselection to find appropriately matched components may be required.

The skilled person will readily appreciate that various alterations or modifications may be made to the above described aspects of the disclosure without departing from the scope of the disclosure.

For example, whilst in the above disclosure the analog filter 2210 is typically described as a low-pass filter, it may alternatively be any type of analog filter 2210 depending on the type of upstream component(s) to which it is coupled, the nature of the analog signals it receives and the requirements for the analog signals it is to output.

The analog filter 2210 may be a passive filter (for example, a simple RC filter) or an active filter. Furthermore, the analog filter 2210 may be a first order filter, or may be higher than first order.

In the above explanations with reference to FIGS. 26 to 35, the corner frequency (also referred to at times as the break point) of the analog filter 2210 is typically described as being within the frequency range of interest. In this disclosure, the 'corner frequency' is the frequency at which the magnitude and/or phase response of the analog filter ceases to be linear within an acceptable degree (for example, the frequency at which the filter's response can no longer be assumed to be/approximated as linear). Typically, the filter may be considered to have three regions: a pass band, a transition band and a stop band. For a low-pass filter, the pass band may be assumed to have a linear magnitude and phase response. The pass band may end at the corner frequency, above which the transition band starts. In this region, the magnitude and/or phase response is treated as non-linear. At the upper frequency limit of the transition band, the stop band begins, within which the phase response of the filter may again be assumed to be, or treated as, linear. In the above aspects of the disclosure described with reference to FIGS. 26 to 35, the corner frequency is said to be within the frequency range of interest. However, in an alternative, the corner frequency may be just outside the frequency range of interest, but at least part of the transition band may be within the frequency range of interest. Consequently, the frequency response (i.e., the magnitude response and/or the phase response) of the filter is non-linear within at least part of the frequency range of interest. As a result, the digital equaliser 2650 will still be required in order to compensate for those non-linear changes in gain and/or phase within the frequency range of interest, such that the overall gain response and/or group detail of the system as a whole is substantially constant across the frequency range of interest.

In some examples of analog filters, the corner frequency may be the 3 dB frequency for the filter. However, in other examples, particularly for more complex filters that are not simply first order filters, the corner frequency is not necessarily the 3 dB frequency of the filter. The content described above with reference to FIGS. 26 to 35 is applicable to all types of analog filters, not necessarily just first order filters. Consequently, whilst in some implements the 3 dB point of the filter may be within the frequency range of interest, in other implementations it may be outside of the frequency range of interest, with the corner frequency (or in some implementations at least part of the transition band) still being within the frequency range of interest.

The aspects described with reference to FIGS. 26 to 35 are disclosed particularly in the context of the current sensor being a Rogowski coil 2. However, rather than the current sensor being a Rogowski coil 2, it may alternatively be any type of di/dt current sensor (i.e., a current sensor whose output is indicative of a rate of change of the measured current), for example any other type of coil based current sensor, such as air-core current sensors.

The terminology "coupled" used above encompasses both a direct electrical connection between two circuits/units, and an indirect electrical connection where the two circuits/units are electrically connected to each other via one or more intermediate circuits/units. For example, in FIGS. 26, 27, 29, 30, 32 and 33, the filter 2210 is coupled to the current sensor 2. In the figures, that coupling is shown as being a direct coupling. However, it may alternatively be an indirect coupling with one or more additional circuits/units between the filter 2210 and the current sensor 2 (for example, an anti-alias filter and/or an amplifier circuit). Likewise, the output of the filter 2210 may be directly or indirectly coupled to the ADC 2200. Furthermore, in FIGS. 26, 27, 29, 30, 32 and 33, the output of the ADC 2220 is coupled to the input of the equaliser 2650. That coupling may be a direct coupling, for example as shown in FIG. 27, or an indirect coupling with one or more additional circuits/units between the ADC 2220 and the digital equaliser 2650 (for example, a digital integrator, as shown in FIG. 26).

The analog filter 2210 may be a dedicated filter circuit, or it may be part of a multi-function circuit/unit. For example, it may be part of an active amplifier circuit, wherein the amplifier circuit is configured to provide both gain and filtering functionality.

The invention claimed is:
1. A current measurement system for coupling to a di/dt current sensor, the current measurement system being configured to measure currents having a frequency within a predetermined frequency range, the current measurement system comprising:
 a signal processing path comprising:
  an analog filter for coupling to the di/dt current sensor to filter a current measurement signal output from the di/dt current sensor, wherein a corner frequency of the analog filter is within the predetermined frequency range;
  an analog to digital converter, ADC, to receive a filtered current measurement signal and output a digital measurement signal; and a digital equaliser coupled to the ADC and configured to output a compensated current measurement signal, wherein the equaliser is configured to use a characterisation of the analog filter to:
compensate for changes in a group delay of the analog filter across the predetermined frequency range; and
compensate for changes in a combined magnitude response of the di/dt current sensor and the analog filter across the predetermined frequency range.

2. The current measurement system according to claim 1, wherein the digital equaliser is configured to compensate for changes in the group delay of the analog filter such that a combined phase-response of the signal processing path is substantially linear.

3. The current measurement system according to claim 1, wherein the digital equaliser is configured to compensate for changes in the group delay of the analog filter such that a combined group delay of signal processing path is substantially constant.

4. The current measurement system according to claim 1, wherein the current measurement system further comprises a characterisation circuit configured to characterise a frequency response of the analog filter and output the characterisation of the analog filter to the digital equaliser.

5. The current measurement system according to claim 4, wherein the characterisation circuit is configured to periodically or intermittently update the characterisation of the frequency response of the analog filter.

6. The current measurement system according to claim 1, wherein the characterisation of an analog filter frequency response is a fixed characterisation that is determined during manufacture of at least part of the current measurement system.

7. The current measurement system according to claim 4, wherein the digital equaliser comprises a digital filter, and the current measurement system further comprises:
a filter coefficient look-up table for use in setting coefficients of the digital filter based on the characterisation of the frequency response of the analog filter, such that the analog filter compensates for changes in the group delay of the analog filter.

8. The current measurement system according to claim 1, wherein the equaliser comprises an FIR filter.

9. The current measurement system according to claim 1, wherein the equaliser comprises:
a first filter configured to receive the digital measurement signal and output a first filter output;
a second filter, configured to receive the digital measurement signal and output a second filter output; and
an interpolator, wherein the interpolator is configured to receive the first filter output and the second filter output and interpolate the first and second filter outputs.

10. The current measurement system according to claim 9, wherein the interpolator outputs a combined signal including a fraction of the first filter output and the second filter output.

11. The current measurement system according to claim 1, wherein the predetermined frequency range encompasses a range between a fundamental frequency of the measured current signal and a maximum harmonic of interest of the measured current signal.

12. The current measurement system according to claim 1, wherein the predetermined frequency range is a frequency range between 10 Hz to 20 KHz.

13. The current measurement system according to claim 1, wherein the equaliser comprises a phase equaliser and a magnitude equaliser, and wherein:
the phase equaliser is configured to compensate for changes in the group delay of the analog filter across the predetermined frequency range; and
the magnitude equaliser is configured to compensate for changes in the combined magnitude response of the di/dt current sensor and analog filter.

14. The current measurement system according to claim 1, wherein the di/dt current sensor comprises a Rogowski coil.

15. The current measurement system according to claim 1, wherein the current measurement system further comprises a di/dt current sensor having an output coupled to an input of the analog filter.

16. A method for providing measurement of currents within a predetermined frequency range, the method comprising:
filtering, using an analog filter with a corner frequency within the predetermined frequency range, a current measurement signal output by a di/dt current sensor to generate a filtered current measurement signal;
converting, using an analog to digital converter, the filtered current measurement signal to a digital measurement signal; and
equalising, using a digital equaliser, the digital measurement signal using a characterisation of the analog filter, wherein equalising the digital measurement signal comprises:
compensating for changes in a group delay of the analog filter across the pre-determined frequency range; and
compensating for changes in a combined magnitude response of the di/dt current sensor and the analog filter across the predetermined frequency range.

17. The method according to claim 16, wherein compensating for changes in a group delay of the analog filter comprises the digital equaliser having a phase response that results in a combined phase response of the signal processing path being substantially linear.

18. The method according to claim 16, the method further comprising:
characterising the frequency response of the analog filter; and
outputting the characterisation of the analog filter to the equaliser.

19. A system for coupling to a current sensor, the system configured to measure a current within a frequency range of interest, the system comprising:
an analog filter for coupling to the current sensor, the analog filter having at least part of its transition band of frequencies within the frequency range of interest, and being configured to receive an output of the current sensor and generate a filtered analog signal; and
a digital phase equaliser configured to receive a digitised version of the filtered analog signal and output a compensated digital signal, the digital phase equaliser being configured to:
compensate for a non-linear phase response of the analog filter within the frequency range of interest such that a combined group delay of the analog filter and the digital phase equaliser includes less change within the predetermined frequency range compared with a group delay of the analog filter.

20. The system according to claim 19, wherein the digital phase equaliser is configured to receive a characterisation of the analog filter, and wherein the phase equaliser is configured to compensate for the non-linear phase response of the analog filter based on the characterisation.

* * * * *